(12) United States Patent
Goldstein et al.

(10) Patent No.: US 9,704,653 B2
(45) Date of Patent: Jul. 11, 2017

(54) PHOTOVOLTAIC CELL

(71) Applicant: 3GSOLAR PHOTOVOLTAICS LTD., Jerusalem, IL (US)

(72) Inventors: Jonathan R. Goldstein, Jerusalem (IL); Barry Breen, Jerusalem (IL); Ilya Yakupov, Rehovot (IL); Eli Rosh Hodesh, Rishon Lezion (IL); Ron Paz, Rehovot (IL)

(73) Assignee: 3GSOLAR PHOTOVOLTAICS LTD., Jerusalem (IL)

( * ) Notice: Subject to any disclaimer, the term of this patent is extended or adjusted under 35 U.S.C. 154(b) by 0 days.

(21) Appl. No.: 14/562,728

(22) Filed: Dec. 7, 2014

(65) Prior Publication Data

US 2015/0243446 A1 Aug. 27, 2015

Related U.S. Application Data

(63) Continuation of application No. 12/618,741, filed on Nov. 15, 2009, now abandoned, which is a (Continued)

(51) Int. Cl.
*H01G 9/20* (2006.01)
*H01L 51/44* (2006.01)

(52) U.S. Cl.
CPC ......... *H01G 9/2068* (2013.01); *H01G 9/2022* (2013.01); *H01G 9/2077* (2013.01); (Continued)

(58) Field of Classification Search
CPC .. H01G 9/2013; H01G 9/2018; H01G 9/2022; H01G 9/2027; H01G 9/2031; H01G 9/2059; H01G 9/2068; H01G 9/2077
See application file for complete search history.

(56) References Cited

U.S. PATENT DOCUMENTS

2003/0230337 A1* 12/2003 Gaudiana ............. H01G 9/2031
136/256
2004/0163700 A1* 8/2004 Mizuta ................. H01G 9/2013
136/263
(Continued)

FOREIGN PATENT DOCUMENTS

JP 2006107892 A * 4/2006

*Primary Examiner* — Bethany L Martin
(74) *Attorney, Agent, or Firm* — Marc Van Dyke; Fourth Dimension IP

(57) ABSTRACT

A photovoltaic cell including: (a) a housing adapted to enclose the photovoltaic cell, and including an at least partially transparent cell wall; (b) an electrolyte, disposed within the cell wall, and containing a corrosive redox species; (c) an at least partially transparent conductive coating disposed on an interior surface of the cell wall, within the photovoltaic cell; (d) an anode disposed on the conductive coating, the anode including a porous film adapted to make intimate contact with the redox species, and a dye, absorbed on a surface of the porous film, the dye and the film adapted to convert photons to electrons; (e) a cathode, disposed within an interior surface of the housing and disposed substantially opposite the anode, including a conductive carbon layer, and a catalytic component, associated with the carbon layer and adapted to catalyze a redox reaction, the carbon layer adapted to transfer electrons from the catalytic component to a current collection component of the cathode, and (f) at least one metal strip or wire, electrically associated with the anode and with the conductive coating, the strip or wire having sufficient thickness to form a protrusion protruding above a plane of the porous film by at least 50 micrometers, wherein a distance between a surface of the catalytic component and a surface of the porous film is less than 20 micrometers.

20 Claims, 20 Drawing Sheets

Related U.S. Application Data continuation-in-part of application No. PCT/IL2008/000671, filed on May 15, 2008.

(60) Provisional application No. 60/917,941, filed on May 15, 2007.

(52) U.S. Cl.
CPC ......... *H01G 9/2031* (2013.01); *H01G 9/2059* (2013.01); *H01L 51/445* (2013.01); *Y02E 10/542* (2013.01)

(56) References Cited

U.S. PATENT DOCUMENTS

| | | | |
|---|---|---|---|
| 2006/0107994 A1* | 5/2006 | Morooka | H01G 9/2031 136/250 |
| 2006/0118165 A1* | 6/2006 | Van Roosmalen | H01G 9/2031 136/263 |
| 2007/0284761 A1* | 12/2007 | Morooka | H01G 9/2077 257/792 |
| 2009/0000661 A1* | 1/2009 | Yoshimoto | H01G 9/2031 136/256 |

* cited by examiner

PHOTOVOLTAIC CELL

The present application is a Continuation of U.S. patent application Ser. No. 12/618,741 filed on Nov. 15, 2009, which is a Continuation-In-part (CIP) application of PCT Application No. IL2008/000671, filed May 15, 2008, which draws priority from U.S. Provisional Patent Application Ser. No. 60/917,941, filed May 15, 2007. The present application incorporates U.S. patent application Ser. No. 12/618,741 filed on Nov. 15, 2009 by reference in its entirety.

FIELD AND BACKGROUND OF THE INVENTION

The present invention relates to photovoltaic cells, also known as solar cells, for producing electricity from sunlight, and more particularly, to broad footprint photovoltaic cells utilizing electrolytes containing iodine-based redox species or other corrosive species.

The invention has particular relevance for solar cells of the dye-sensitized type, and is applicable to other types of solar cells in which a high current density of operation at minimal ohmic loss is advantageous.

Dye-sensitized photovoltaic cells for producing electricity from sunlight have been disclosed by U.S. Pat. No. 5,350,644 to Graetzel, et al., which is hereby incorporated by reference for all purposes as if fully set forth herein. U.S. Pat. No. 5,350,644 teaches a photovoltaic cell having a light-transmitting, electrically-conductive layer deposited on a glass plate or a transparent polymer sheet to which a series of titanium dioxide layers have been applied, in which at least the last titanium dioxide layer is doped with a metal ion that is selected from a divalent or trivalent metal.

Following U.S. Pat. No. 5,350,644 is U.S. Pat. No. 6,069,313 to Kay, which is hereby incorporated by reference for all purposes as if fully set forth herein. U.S. Pat. No. 6,069,313 teaches a plurality of series-connected cell elements arranged as separate, parallel, narrow elongated strips on a common transparent substrate. Each element includes a light facing anode including nanocrystalline titania, a carbon-based counterelectrode (cathode), and an intermediate electrically insulating porous layer separating the anode from the cathode. The pores of the intermediate layer are at least partially filled with a liquid phase, ion-transferring electrolyte, following coating of the nanocrystalline titania with a light sensitive dye.

A current collecting layer of a tin oxide based transparent, electrically-conducting material is situated between the transparent substrate and the anode. The anode and cathode of a given cell provide a direct-current voltage when the anode is exposed to light, such that series assemblies of cells may readily be built up. The cathode of each succeeding element is connected with the intermediate conducting layer of the preceding anode element, over a gap separating the respective intermediate layers of these two elements. The series of cells is then sealed using an organic polymer, ensuring in particular that each individual strip cell is sealed from its neighbor cell. In the art of dye cells, such an arrangement of anode and cathode materials or cells on a common substrate is termed "monolithic".

Generally, dye cells of the above-cited prior art disclosures are much closer conceptually to battery cells than to conventional photovoltaic cells, since the charge generators are separated by an electrolyte and are not in direct contact. These cells have two electrodes separated by an electrolyte, with one electrode (the photo-electrode or photo-anode) facing the sun or light source. Each electrode is supported on its own current collector, usually a sheet of conducting glass, which is glass coated on one side with a thin (~0.5 micron) transparent layer, usually based on electrically-conductive tin oxide. The conducting glass sheets act as transparent walls of the dye cell.

A transparent polymer may be used in place of glass to support the tin oxide. The photo-electrode or photoanode includes a transparent porous layer about 10 microns thick (in contact with the tin oxide layer) based on titania, having a nanocrystalline characteristic particle size of 10-50 nm, applied by baking onto the conductive glass or transparent polymer, and impregnated with a special dye. The baked-on titania layer is applied in dispersion form by any of various methods: doctor-blading, rolling, spraying, painting, electrophoresis, gravure printing, slit coating, screen printing or printing. The baking step giving highest cell performance is usually in excess of 450° C., requiring the use of conducting glass rather than plastic for supporting the titania layer. Other processing procedures for the titania layer are feasible, such as reduced temperature baking, or pressing, usually with some sacrifice in efficiency. It is important to note that the titania is principally in contact with the tin oxide. Presence of other conductors (such as many metals, carbon and the like, even if chemically inert to the electrolyte) on the photoanode can greatly increase recombination of charge carriers and provide a serious efficiency loss in the cell. Very few materials (amongst them tin oxide and titanium metal) combine chemical inertness to the electrolyte with freedom from recombination effects so as to be potentially suitable as construction materials for, or for electrically associating with, the photoanode.

For cells that are partially transparent, the other electrode (the counter electrode) includes a thin layer of catalyst (usually containing a few micrograms of platinum per sq. cm) on its respective sheet of tin oxide coated conductive glass or transparent plastic. If cell transparency is not required, the counter electrode can be opaque, for example, based on carbon or graphite advantageously catalyzed with trace platinum or another catalyst. The electrolyte in the cell is usually an organic solvent with a dissolved redox species. The electrolyte is typically acetonitrile or a higher molecular weight reduced volatility nitrile, with the redox species being dissolved iodine and potassium iodide—essentially potassium tri-iodide. Other solvents and phases, for example ionic liquids with no vapor pressure, and even different redox species, may be used, however.

U.S. Pat. No. 5,350,644 to Graetzel, et al., discloses various dye cell chemistries, especially different dyes based on ruthenium complexes. Photons falling on the photoelectrode excite the dye (creating activated oxidized dye molecules), causing electrons to enter the conduction band of the titania and to flow (via an outer circuit having a load) to the counter-electrode. There, the electrons reduce tri-iodide to iodide in the electrolyte, and the iodide is oxidized by the activated dye at the photoanode back to tri-iodide, leaving behind a deactivated dye molecule ready for the next photon. U.S. Pat. No. 5,350,644 discloses that such dye cells can attain a solar-to-electric conversion efficiency of 10%.

The cells taught by U.S. Pat. No. 5,350,644 to Graetzel, et al., are based on two generally parallel, closely placed sheets of conductive glass, a first sheet coated with titania and dye, and a second sheet coated with catalyst. Electrolyte is provided between the two sheets. The cells are sealed by means of organic adhesive at the edges. Current takeoff is achieved via the conductive glass sheets, which project beyond the adhesive on either side of the cell. These cells operate at a voltage of about 700 mV and at a current density of 15 mA/sq. cm under peak solar illumination, with the counterelectrode being the positive pole. It is asserted therein that since the materials and preparation methods are low cost and the titania layer can be prepared in large areas, such cells could potentially provide a good route to low-cost photovoltaic cells. It is further argued that there might be significant cost savings over classical single crystal or polycrystalline silicon cells and even more recent thin-film photovoltaic cells, since these are all high cost and rely on expensive and often environmentally problematic raw materials, together with complex, costly, semiconductor industry processing equipment and production techniques. These drawbacks include the use of vacuum deposition and semiconductor doping methods, clean-room protocols, use of toxic hydrides such as silane, phosphine, etc., as raw materials, and the use of toxic active-layer materials containing cadmium, selenium or tellurium.

The ohmic loss via the conductive glass coated with tin oxide is a major problem of dye cells. The tin oxide coating is extremely thin, being limited in thickness usually to below one micron due to the need to maintain a high light transmittance through to the dye/titania layer of the photoanode. Moreover, tin oxide is only semiconductive and is bonded to with difficulty. Consequently, the current takeoff is significantly limited by such a cell design to very small sized cells having a maximum footprint of a few square millimeters or strip cells having long narrow strips of active titania. It should be noted that active strip cells have certain technical disadvantages. For example, in the cells of Kay described above, the strips of titania are disadvantageously narrow (typically 0.6-0.8 cm wide), due to the ohmic loss restriction. This results in an excessive loss of active area between cells, due to the practical width of inert materials needed for inter-cell sealing. Moreover, adequate sealing between adjacent cells so as to effectively prevent any inter-cell electrolyte migration remains a serious challenge.

Efforts have been made to increase the active area and breadth of cells by laying down parallel conducting strips on a conducting glass surface, thereby enabling a large-area, broad-cell construction. A photovoltaic cell having electrically conducting coatings on spaced, glass support panes is disclosed by U.S. Pat. No. 6,462,266 to Kurth, which is hereby incorporated by reference for all purposes as if fully set forth herein. In FIG. 1 is provided a partial, cross-sectional view of a photovoltaic cell 1 having two generally parallel support panes 2 and 3, set apart at a distance. The edges of photovoltaic cell 1 are held and sealed by a sealing system 4 extending along the whole circumference. The inner surfaces of support panes 2 and 3 are each coated with a conductive layer 5, and 6, respectively. Layers 5 and 6 are made of a suitable metal or metal oxide such as tin oxide. On layers 5 and 6, an arrangement of parallel conductor leads 7 and 8 are provided, preferentially made from silver or a silver alloy, or from copper or a copper alloy. These conductor leads are coated each with an insulating coating 10, which insulates conductor leads 7 and 8 electrically towards the interior of the cell. Coating 10 consists of a glass free of heavy metals, which was applied as a glass flow on conductor leads 7 and 8. Onto conductor leads 7 and 8 insulated by the glass coating 10, a further electrically conductive layer 11, and 12 respectively, made from tin oxide or a similar material, can be applied in order to obtain a still-higher yield of photovoltaic cell 1. In the border zones of seals 13 and 14, no electrically conductive layers 5 and 6 are provided, these layers having been eliminated from the border zones by means of sand blasting. In this manner, possible short circuits via the seals 13 and/or 14 are avoided. Onto these two seals, a thin layer 15 of a low melt soldering tin is applied in such a manner that exterior weather influences also can not act onto photovoltaic cell 1.

The photovoltaic cell taught by U.S. Pat. No. 6,462,266 has reduced ohmic loss with respect to the cell disclosed by U.S. Pat. No. 5,350,644 to Graetzel, et al., because conductor leads 7 and 8 are good conductors (e.g., silver paste screen-printed on and fired at 600° C.), and because the overall effective thickness of conducting materials has been increased. Unfortunately, the high process temperatures required for the silver and glaze compositions adversely affect the conductivity and strength properties of the glass. Glaze materials that can be processed at lower temperatures are available, but contain toxic heavy metals such as lead, and may also be attacked or contaminated by the electrolyte. Furthermore, protection of silver conductors by a glass layer is inadequate over time, since pinholes cannot be entirely eliminated in the glaze, especially in mass production processes. In fact, silver is corroded by the iodine in cell electrolytes, adversely reducing the iodine inventory in the cell and irreversibly attacking the dye, and a similar deterioration occurs with silver lines protected by polymer.

U.S. Patent Application Publication No. 20050072458 to Goldstein describes a large-area, broad conductive glass or conductive plastic for a dye cell. The conductive glass or conductive plastic carries a set of conductors selected from materials intrinsically resistant to corrosion and to carrier recombination in the presence of the cell electrolyte, and onto this superior glass or plastic (having enhanced current collecting properties over plain conductive glass or plastic) the titania is deposited. By way of example, a conductive glass face is first grooved, giving a set of parallel spaced shallow grooves. Into each groove is placed a wire of a metal such as titanium, molybdenum, tungsten, chromium or their alloys (inert to corrosion and to carrier recombination under the operating conditions of the cell) and electrical conductivity between the wire and the tin oxide layer on each side of the groove is achieved using a heat curable binder paste based on an inert ceramic adhesive (such as alumina) mixed with an inert, electrically conducting filler (such as titanium nitride). The paste fills the groove and overlaps on each side of the groove to make good electrical contact with the tin oxide layer there following curing. The wires exit from the cell from the groove extremities at the glass edges and may be welded to a current-collecting strip. In a separate embodiment of U.S. Patent Application Publication No. 20050072458 to Goldstein there is described a set of parallel strips of a metal or metal alloy having stability under cell operating conditions that is plated onto the conductive glass or conducting plastic surface. One example given of a plated metal is chromium. Current take-off from the anode plate is again made from the side of the cell.

In another embodiment, the parallel conductors are inert strips or wires of titanium, molybdenum, tungsten, chromium or their alloys bonded directly to the conducting surface of the glass by means of an inert, electrically conducting ceramic adhesive.

U.S. Patent Application Publication No. 20050072458 extends the use of wires in a grooved conductive glass or of strips plated on conductive glass also for use in the counterelectrode (cathode) of the cell. The glass plate, provided with wires bonded in grooves or on top of the glass, or with strips electroplated on the conductive surface, is used as a base for a broad cathode in the dye cell, and the conductivity-augmented plate is covered with a catalytic layer electroactive to iodine. Such a cathode, unfortunately, although fitted with adequate conducting means for current takeoff from a large area broad cell, necessarily includes a second layer of conducting glass in the cell, with associated cost, weight and thickness penalties. Broad dye cells of at least 10-15 cm per side are made possible, however.

To date, there has been no real commercialization of photovoltaic dye cells, despite the great techno-economic potential thereof. The principal problems remaining include scale-up of cells to widths much above one centimeter—and areas much above 50 sq. cm—due to excessive ohmic losses from the poorly conducting tin oxide layers on the glass or plastic, long term stability of silver based conductors in the cell, and difficulties of sealing the cells against long term dryout and performance degradation. Many approaches rely on costly in-house coating of the transparent substrate with conductive tin oxide rather than using commercially-available conductive glass in bulk such as fluorine doped tin oxide (FTO) glass.

A further problem in prior art dye cells and modules has been excessive surface area wasted in seals, protective layers and conducting paths on the sun-facing side of the cell or module. The active current-producing area in such cases is often less than 70% of the geometric area (footprint) of the cell or module, providing a poor effective efficiency from the available area. A yet further problem in prior art cells, especially if the counterelectrode is a separate element from the anode, is the relatively large spacing between anode and cathode—approaching or exceeding 100 microns—which can result in excessive ohmic loss from the electrolyte. This problem is particularly acute in the dye cells disclosed by U.S. Patent Application Publication No. 20050072458 to Goldstein, and is even more particularly acute in the disclosed dye cells having a large footprint or cell width.

Moreover, it should be evident from the above that when the counterelectrode is a separate element from the anode in the cell, the counterelectrode usually requires the use of a second glass support in the cell, or even worse, a second conductive glass in the cell. These greatly add to the cost, weight and thickness of the cell.

There is therefore a recognized need for, and it would be highly advantageous to have, an electrochemical cell, powered by sunlight, that is simple, large-area, broad, efficient, low-cost, lightweight and robust, and successfully addresses the shortcomings of the prior art.

SUMMARY OF THE INVENTION

According to the teachings of the present invention there is provided a photovoltaic cell including: (a) a housing adapted to enclose the photovoltaic cell, and including an at least partially transparent cell wall; (b) an electrolyte, disposed within the cell wall, and containing a corrosive redox species; (c) an at least partially transparent conductive coating disposed on an interior surface of the cell wall, within the photovoltaic cell; (d) an anode disposed on the conductive coating, the anode including a porous film adapted to make intimate contact with the redox species, and a dye, absorbed on a surface of the porous film, the dye and the film adapted to convert photons to electrons; (e) a cathode, disposed within an interior surface of the housing and disposed substantially opposite the anode, including a conductive carbon layer, and a catalytic component, associated with the carbon layer and adapted to catalyze a redox reaction, the carbon layer adapted to transfer electrons from the catalytic component to a current collection component of the cathode, and (f) at least one metal strip or wire, electrically associated with the anode and with the conductive coating, the strip or wire having sufficient thickness to form a protrusion protruding above a plane of the porous film by at least 50 micrometers, wherein a distance between a surface of the catalytic component and a surface of the porous film is less than 20 micrometers.

According to further features in the described preferred embodiments, the cathode is mechanically supported by the cell wall in a monolithic configuration.

According to still further features in the described preferred embodiments, the distance is an average distance between the surface of the catalytic component and the surface of the porous film.

According to still further features in the described preferred embodiments, the distance is achieved over at least 80% of the cell surface area.

According to still further features in the described preferred embodiments, the distance is achieved over at least 85% of the cell surface area.

According to still further features in the described preferred embodiments, the distance is achieved over at least 90% of the cell surface area.

According to still further features in the described preferred embodiments, the distance is achieved over at least 95% of the cell surface area.

According to still further features in the described preferred embodiments, the distance is less than 15 micrometers.

According to still further features in the described preferred embodiments, the distance is less than 10 micrometers.

According to still further features in the described preferred embodiments, the distance is less than 7 micrometers.

According to still further features in the described preferred embodiments, the strip or wire has sufficient thickness to protrude above a plane of the porous film by at least 80 micrometers, by at least 100 micrometers, or by at least 120 micrometers.

According to still further features in the described preferred embodiments, the photovoltaic cell further includes: (g) a porous separator layer interdisposed between the porous film of the anode and the catalytic component of the cathode, the porous separator layer adapted to physically separate and electrically insulate between the porous film and the cathode.

According to still further features in the described preferred embodiments, the porous separator layer includes a spacing element that is physically distinct with respect to the porous film of the anode.

According to still further features in the described preferred embodiments, the porous separator layer includes a spacing element that is bonded or attached to the porous film of the anode.

According to still further features in the described preferred embodiments, the porous separator layer includes a spacing element that is sintered to the porous film of the anode.

According to still further features in the described preferred embodiments, the porous separator layer is discontinuous, whereby, between adjacent protrusions, the catalytic component is juxtaposed against the porous film of the anode. The porous separator layer may typically be bonded, sintered, or otherwise attached to the porous film of the anode.

According to still further features in the described preferred embodiments, the spacing element, in an uncompressed state, has a height of less than 50 micrometers.

According to still further features in the described preferred embodiments, the spacing element is selected from the group of structural elements consisting of glass fiber and microporous polymer.

According to still further features in the described preferred embodiments, the at least one metal strip or wire is bonded to the transparent conductive coating by a conductive binding material.

According to still further features in the described preferred embodiments, the conductive binding material includes a ceramic adhesive.

According to still further features in the described preferred embodiments, the conductive binding material includes titanium nitride.

According to still further features in the described preferred embodiments, the conductive carbon layer is sintered on to the current collection component of the cathode.

According to still further features in the described preferred embodiments, the conductive carbon layer and the catalytic component form self-supporting strips.

According to still further features in the described preferred embodiments, the self-supporting strips are solely physically (i.e., not chemically) associated with a porous separator layer interdisposed between the porous film of the anode and the catalytic component of the cathode.

According to still further features in the described preferred embodiments, the at least one metal strip or wire is a plurality of wires, and the protrusion is a plurality of protrusions.

According to still further features in the described preferred embodiments, the conductive carbon layer and the catalytic component form self-supporting strips, the strips disposed between the protrusions.

According to still further features in the described preferred embodiments, the strips are disposed between the protrusions to make a surface of the catalytic component substantially flush with an opposing surface.

According to still further features in the described preferred embodiments, the opposing surface is a porous separator layer interdisposed between the porous film of the anode and the catalytic component of the cathode.

According to still further features in the described preferred embodiments, the self-supporting strips are physically associated with, and juxtaposed against, a porous separator layer interdisposed between the porous film of the anode and the catalytic component of the cathode.

According to yet another aspect of the present invention there is provided a photovoltaic cell for converting a light source into electricity at a reduced ohmic loss, the cell including: (a) a housing adapted to enclose the photovoltaic cell, the housing including an at least partially transparent cell wall, the cell wall having an interior surface and an exterior surface; (b) an electrolyte, disposed within the cell wall, the electrolyte containing an iodine based redox species; (c) an at least partially transparent conductive coating disposed on the interior surface of the cell wall, within the photovoltaic cell; (d) an anode disposed on the conductive coating, the anode including: (i) a porous film adapted to make intimate contact with the redox species, and (ii) a dye, absorbed on a surface of the porous film, the dye and the film adapted to convert photons to electrons; (e) a cathode disposed within an interior surface of the housing, the cathode disposed substantially opposite the anode, the cathode including: (i) a conductive carbon layer, and (ii) a catalytic component, associated with the carbon layer and adapted to catalyze a redox reaction of the redox species, the conductive carbon layer adapted to transfer electrons from the catalytic component to a current collection component of the cathode, the conductive carbon layer and the catalytic component disposed in electrolytic communication, via the electrolyte, with the porous film, and (f) at least one electrically-conductive structural component, disposed within the conductive carbon layer, the structural component having a specific resistivity below 1200 microohm·cm, the component adapted and disposed to collect current from the cathode, and wherein a footprint of a single cell of the photovoltaic cell is defined by a length and a width of the single cell, and wherein both the length and the width exceed 5 centimeters.

According to further features in the described preferred embodiments, the structural component is selected to have a specific resistivity below 500 microohm·cm or below 200 microohm·cm.

According to still further features in the described preferred embodiments, the distance between a surface of the catalytic component and a surface of the porous film is less than 50 micrometers, less than 30 micrometers, less than 20 micrometers, less than 15 micrometers, or less than 10 micrometers.

According to still further features in the described preferred embodiments, the metal strip or wire is disposed in grooves situated in the interior surface of the cell wall.

According to further features in the described preferred embodiments, the conductive carbon layer has a thickness of at least 50 micrometers or at least 100 micrometers.

According to further features in the described preferred embodiments, the conductive carbon layer and said catalytic component form self-supporting strips.

According to further features in the described preferred embodiments, a distance between a surface of said catalytic component and a surface of said porous film is less than 50 micrometers or less than 20 micrometers.

According to further features in the described preferred embodiments, the structural component is at least one continuous component at least partially buried in said conductive carbon layer.

According to further features in the described preferred embodiments, the structural component is at least one continuous component selected from the group of components consisting of a wire, a mesh, and a perforated foil.

According to further features in the described preferred embodiments, the structural component is at least one continuous component selected from the group of components consisting of a metal wire, a metal mesh, and a perforated metal foil.

According to further features in the described preferred embodiments, the structural component extends through said housing.

According to another aspect of the present invention there is provided a photovoltaic cell for converting a light source into electricity, the cell including: (a) a housing adapted to enclose the photovoltaic cell, the housing including an at least partially transparent cell wall, the cell wall having an interior surface; (b) an electrolyte, disposed within the cell wall, the electrolyte containing an iodine-based redox species; (c) an at least partially transparent conductive coating disposed on the interior surface of the cell wall, within the photovoltaic cell; (d) an anode disposed on the conductive coating, the anode including: (i) a porous film adapted to make intimate contact with the redox species, the porous film including chemically bonded titanium dioxide nanoparticles, and (ii) a dye, absorbed on a surface of the porous film, the dye and the film adapted to convert photons to electrons; (e) a cathode disposed within an interior surface of the housing, the cathode disposed substantially opposite the anode, the cathode including: (i) a conductive carbon layer, and (ii) a catalytic component, associated with the carbon layer and adapted to catalyze a redox reaction of the redox species, the conductive carbon layer adapted to transfer electrons from the catalytic component to a current collection component of the cathode; the conductive carbon layer and the catalytic component disposed in electrolytic communication, via the electrolyte, with the porous film; the conductive carbon layer including (A) carbon black particles; (B) graphite powder; (C) expanded graphite particles, and (D) titanium dioxide particles, the titanium dioxide particles of the conductive carbon layer being chemically bonded to the expanded graphite particles.

According to yet another aspect of the present invention there is provided a method of producing a photovoltaic cell for converting a light source into electricity, the method including the steps of: (a) providing: (i) a housing adapted to enclose the photovoltaic cell, the housing including an at least partially transparent cell wall, the cell wall having an interior surface; (ii) an at least partially transparent conductive coating disposed on the interior surface of the cell wall, within the photovoltaic cell; (iii) an anode disposed on the conductive coating, the anode including a porous film adapted to make intimate contact with a redox species, the porous film including titanium dioxide nanoparticles, and (b) providing a cathode generally opposite the anode, the cathode including a sintered conductive carbon layer, the conductive carbon layer including: (i) carbon black particles; (ii) graphite powder; (iii) expanded graphite particles, and (iv) titanium dioxide particles, the titanium dioxide particles of the conductive carbon layer being chemically bonded to the expanded graphite particles.

According to yet another aspect of the present invention there is provided a method of producing a photovoltaic cell for converting a light source into electricity, the method including the steps of: (a) providing: (i) a housing adapted to enclose the photovoltaic cell, the housing including an at least partially transparent cell wall, the cell wall having an interior surface; (ii) an at least partially transparent conductive coating disposed on the interior surface of the cell wall, within the photovoltaic cell; (iii) an anode disposed on the conductive coating, the anode including a porous film adapted to make intimate contact with a redox species, the porous film including titanium dioxide nanoparticles; (b) disposing a conductive carbon paste opposite the anode, the paste including: (A) carbon black particles; (B) graphite powder; (C) expanded graphite particles, (D) at least one ceramic oxide precursor, the precursor selected from the group of precursors consisting of a titania precursor and a zirconia precursor, and (E) a liquid vehicle, the carbon black particles, the graphite powder, the expanded graphite particles, and the titanium dioxide particles being intimately mixed, and (c) sintering the conductive carbon paste at a temperature above 300 C, to convert the at least one ceramic oxide precursor to ceramic oxide particles, and producing a conductive carbon cathodic layer from the conductive carbon paste.

According to yet another aspect of the present invention there is provided a method of producing a photovoltaic cell for converting a light source into electricity, the method including the steps of: (a) providing: (i) a housing adapted to enclose the photovoltaic cell, the housing including an at least partially transparent cell wall, the cell wall having an interior surface; (ii) an at least partially transparent conductive coating disposed on the interior surface of the cell wall, within the photovoltaic cell; (iii) an anode disposed on the conductive coating, the anode including a porous film adapted to make intimate contact with a redox species, the porous film including titanium dioxide nanoparticles; (b) providing a conductive carbon paste, the paste including: (A) carbon black particles; (B) graphite powder; (C) expanded graphite particles; (D) at least one ceramic oxide precursor, the precursor selected from the group of precursors consisting of a titania precursor and a zirconia precursor, and (E) a liquid vehicle, the carbon black particles, the graphite powder, the expanded graphite particles, and the titanium dioxide particles being intimately mixed; (c) disposing the conductive carbon paste on a matrix, and (d) sintering the conductive carbon paste at a temperature above 300 C, to convert the at least one ceramic oxide precursor to ceramic oxide particles, and to produce a cathodic layer in which the ceramic oxide particles are sintered to the expanded graphite particles, and in which the ceramic oxide particles are sintered to the matrix.

According to further features in the described preferred embodiments, the conductive carbon layer is a sintered conductive carbon layer.

According to still further features in the described preferred embodiments, the porous film is sintered to the conductive coating.

According to still further features in the described preferred embodiments, the carbon black particles, graphite powder, expanded graphite particles, and titanium dioxide particles are distributed in a substantially uniform manner within the sintered conductive carbon layer.

According to still further features in the described preferred embodiments, the conductive carbon layer is in a state of rigid attachment to the porous film.

According to still further features in the described preferred embodiments, the cell further includes: a porous separator layer interdisposed between the porous film of the anode and the catalytic component of the cathode, the porous separator layer adapted to physically separate and electrically insulate between the porous film and the cathode.

According to still further features in the described preferred embodiments, the porous separator layer includes a spacing element that is physically distinct with respect to the porous film of the anode.

According to still further features in the described preferred embodiments, the porous separator layer includes a spacing element that is chemically bonded to the porous film of the anode.

According to still further features in the described preferred embodiments, the porous separator layer includes a spacing element that is sintered to the porous film of the anode.

According to still further features in the described preferred embodiments, the spacing element is selected from the group of structural elements consisting of glass fiber and microporous polymer.

According to still further features in the described preferred embodiments, the chemically bonded titanium dioxide nanoparticles include sintered titanium dioxide nanoparticles.

According to still further features in the described preferred embodiments, the conductive carbon layer is in a state of rigid attachment with respect to the porous separator layer.

According to still further features in the described preferred embodiments, the conductive carbon layer is chemically bonded to the porous separator layer.

According to still further features in the described preferred embodiments, the conductive carbon layer is sintered to the porous separator layer.

According to still further features in the described preferred embodiments, the cell further includes at least one metal strip or wire, electrically associated with the anode and with the conductive coating, the strip or wire having sufficient thickness to form a protrusion protruding above a plane of the porous film by at least 50 micrometers.

According to still further features in the described preferred embodiments, the at least one metal strip or wire is bonded to the transparent conductive coating by a conductive binding material.

According to still further features in the described preferred embodiments, the conductive carbon layer further includes zirconium oxide particles, preferably distributed in a substantially uniform manner with the carbon black particles, the graphite powder, the expanded graphite particles, and the titanium dioxide particles.

According to still further features in the described preferred embodiments, the carbon black and the expanded graphite have a weight ratio in a range of 1.5:1 to 1:1.5.

According to still further features in the described preferred embodiments, the total carbon content of the conductive carbon layer includes the graphite powder, the carbon black particles, and the expanded graphite particles, and the total carbon content and the titanium dioxide particles have a weight ratio in a range of 1.2:1 to 3.5:1.

According to still further features in the described preferred embodiments, the graphite powder has a weight ratio with respect to the sum of the carbon black particles and the expanded graphite particles, the weight ratio falling in a range of 1.5:1 to 3.5:1.

According to still further features in the described preferred embodiments, the graphite powder has a weight ratio with respect to a sum of the carbon black particles, the expanded graphite particles, and the zirconium oxide particles, the weight ratio falling in a range of 1.2:1 to 3:1.

According to still further features in the described preferred embodiments, the total carbon content of the conductive carbon layer includes the graphite powder, the carbon black particles, and the expanded graphite particles, and the weight ratio of the total carbon content and the zirconium oxide particles to the titanium dioxide particles falls in a range of 1.5:1 to 4:1.

According to still further features in the described preferred embodiments, the width (i.e., the narrow dimension of the face) of the conductive carbon layer is at least 5 cm.

According to still further features in the described preferred embodiments, the width of the conductive carbon layer is at least 8 cm.

According to still further features in the described preferred embodiments, the width of the conductive carbon layer is at least 10 cm.

According to still further features in the described preferred embodiments, the width of the conductive carbon layer is at least 15 cm.

According to still further features in the described preferred embodiments, the expanded graphite particles have a long dimension of at least 15 micrometers, on average.

According to still further features in the described preferred embodiments, the expanded graphite particles have a long dimension of at least 25 micrometers, on average.

According to still further features in the described preferred embodiments, the expanded graphite particles have a long dimension of at least 40 micrometers, on average.

According to still further features in the described preferred embodiments, the expanded graphite particles have a long dimension of at least 60 micrometers, on average.

According to still further features in the described preferred embodiments, the titania particles have an average primary particle size below 50 nm.

According to still further features in the described preferred embodiments, the titania particles have an average primary particle size below 30 nm.

According to still further features in the described preferred embodiments, the method further includes, prior to providing the cathode having the sintered conductive carbon layer, the step of disposing a conductive carbon paste opposite the anode, the paste including: (i) carbon black particles; (ii) graphite powder; (iii) expanded graphite particles, (iv) at least one ceramic oxide precursor, the precursor selected from the group of precursors consisting of a titania precursor and a zirconia precursor, and (v) a liquid vehicle, wherein the sintered conductive carbon layer is produced by sintering the conductive carbon paste at a temperature above 300 C, to convert the at least one ceramic oxide precursor to sintered ceramic oxide particles.

According to still further features in the described preferred embodiments, the disposing of the conductive carbon paste opposite the anode is performed by screenprinting the paste.

According to still further features in the described preferred embodiments, the method further includes the step of disposing a porous, electrically insulative separator on the anode, to electrically insulate between the anode and the cathode.

According to still further features in the described preferred embodiments, the method further includes the step of disposing a porous, electrically insulative separator on the anode, to electrically insulate between the anode and the cathode, wherein the disposing of the conductive carbon paste is performed directly on a surface of the porous, electrically insulative separator.

According to still further features in the described preferred embodiments, the ceramic oxide precursor includes a titanium or zirconium chelate.

According to still further features in the described preferred embodiments, the ceramic oxide precursor is a titania precursor.

According to still further features in the described preferred embodiments, the titania precursor includes an organic titanate.

According to still further features in the described preferred embodiments, the titania precursor includes a compound selected from the group of titania precursors consisting of organic titanium chelates, aqueous titanium chelates, organic titanates and ortho-titanate esters.

According to still further features in the described preferred embodiments, the titania precursor includes a titanium acetylacetonate.

According to still further features in the described preferred embodiments, the liquid vehicle includes an alcohol.

According to still further features in the described preferred embodiments, the sintering of the conductive carbon paste to convert the ceramic oxide precursor to sintered ceramic oxide articles is performed in an air-containing environment, the ceramic oxide precursor includes a fumeless precursor that reacts in the air-containing environment in a substantially non-fuming fashion.

According to still further features in the described preferred embodiments, the cathode includes a support matrix structurally supporting the conductive carbon layer and sintered thereto.

According to still further features in the described preferred embodiments, the conductive carbon layer includes zirconia particles, intimately dispersed within the conductive carbon layer.

According to still further features in the described preferred embodiments, the conductive carbon layer includes zirconia particles, intimately dispersed within the conductive carbon paste.

According to still further features in the described preferred embodiments, the method further includes the step of disposing an electrolyte within the cell wall, the electrolyte containing an iodine-based redox species.

According to still further features in the described preferred embodiments, the screenprinting of the paste is performed over a cell width of at least 5 cm, and preferably, at least 10 or at least 15 cm.

According to still further features in the described preferred embodiments, the sintered conductive carbon layer is produced by sintering the conductive carbon paste at a temperature above 350 C.

According to still further features in the described preferred embodiments, the sintered conductive carbon layer is produced by sintering the conductive carbon paste at a temperature above 400 C.

According to still further features in the described preferred embodiments, the matrix is selected from a group of matrices consisting of glass fiber mat, carbon fiber mat, zirconia felt, titania felt and carbon foam.

According to yet another aspect of the present invention there is provided a method for producing photovoltaic cells of the present invention, substantially as disclosed herein.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. Throughout the drawings, like-referenced characters are often used to designate like elements.

In the drawings.

DESCRIPTION OF THE PREFERRED EMBODIMENTS

Figure 1:
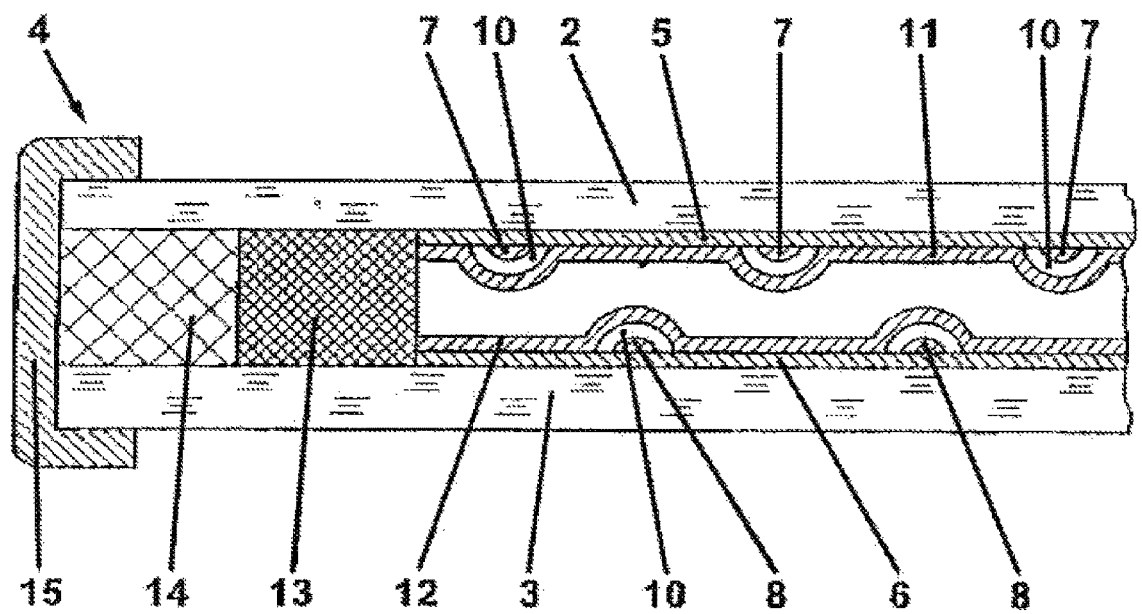
FIG. 1 is a partial cross-sectional view of a photovoltaic cell of the prior art.

The principles and operation of the photovoltaic cells according to the present invention may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

The present invention provides an improved structure for large-area, broad, single dye cells. A schematic cross-sectional view of a first aspect of the invention, referred to as a monolithic photovoltaic cell 200, is provided in FIG. 2. A substantially transparent anode support such as a conventional photoanode support glass 30, having a typical thickness of about 2 mm, has a thin, substantially transparent conducting surface layer or coating 32. Conducting surface layer 32 may be advantageously based on tin oxide, and also may be provided with electrical conductivity enhancing features. Conducting surface layer 32 is used as the substrate and basic building block for photovoltaic cell 200, as disclosed in our above-described U.S. Patent Application Publication No. 20050072458, which is hereby incorporated by reference for all purposes as if fully disclosed herein.

Photoanode support glass 30 is coated with a porous, nanocrystalline, high band-gap layer such as a porous nanocrystalline titania layer 38, such that titania layer 38 physically and electrically communicates with conducting surface layer 32 over most of the area (footprint) of cell 200. The surface of titania layer 38 facing the interior of cell 200 is stained by a dye to produce an ultra-thin (typically a monolayer) dye layer 40 along the interior surface of titania layer 38. Titania layer 38, along with ultra-thin dye layer 40, essentially make up a photoanode 42 of cell 200.

Titania layer 38 may be applied using various techniques known in the art, including screenprinting of a titania-powder-based paste or a sol-gel-based titania precursor paste followed by drying and sintering in air. Other techniques of depositing a titania coating are applicable prior to the sintering step, for example, electrophoretic deposition and/or pressing. The thickness of the nanocrystalline titania layer, after sintering, is typically about 15 microns.

In order to appreciably boost or enhance current collection, the cell may employ a plurality of preferably parallel, conducting plated-on metal strips 35. Metal strips 35 may advantageously transfer current from photoanode 42 towards a side wall of cell 200.

Conducting plated-on metal strips 35 may be made of a metal or metal alloy selected to resist corrosion by the electrolyte and also to resist carrier recombination, even under the harsh working conditions of the cell, preferably for a period of at least 7-10 years, which is often considered to be a reasonable lifetime for cells to be economically viable.

The width of conducting plated-on strips 35 is limited such that strips 35 may shade only about 15% or less of the available cell area. Preferably, strips 35 shade less than about 10%, or more preferably, shade less than about 5% of the available cell area.

Above titania layer 38 and dye layer 40 is disposed an electrically-insulating spacer layer 44, which is advantageously coarse, porous and thin, and serves to insulate photoanode 42. During the manufacturing of cell 200, screenprinting or electrophoresis may be used to apply electrically-insulating spacer layer 44 directly on top of titania layer 38 (with dye layer 40 being introduced much later in the process). Typically, spacer layer 44 contains coarsely divided oxides that are substantially inert to the electrolyte and to dye cell processes. Typical raw materials for the spacer are alumina, magnesia, silica and/or zirconia powders. For non-nano-sized compositions based on relatively coarse powders selected from a particle size range of about 0.5 microns to 5 micron particle size, and incorporating an inert ceramic binder and/or a heat fugitive organic/inorganic binder/pore former, spacer layer 44 can have a thickness ranging from as little as 2 micrometers to 15 micrometers or more, following sintering. This spacer layer bonds well to titania layer 38 thereunder, and provides adequate electrical insulation, as well as good porosity and electrolyte permeation at minimal ohmic drop.

Above spacer layer 44, on the cathodic side of cell 200, is disposed a porous, catalytic carbon layer 48, which is adapted to catalyze the iodine redox reaction in the cell. The thickness of catalytic carbon layer 48 may be less than about 5 micrometers, and typically, may be about 2-3 micrometers or less.

In terms of cell construction, catalytic carbon layer 48 may be screenprinted onto spacer layer 44. It may be advantageous to use a sinterable carbon paste including an inert ceramic binder and/or a heat fugitive organic/inorganic binder/pore former, together with a catalytic material adapted to catalyze the iodine redox reaction in the cell. This catalytic material may include high surface area carbon (at least 50 $m^2/g$), platinum, and/or a catalytic platinum substitute. An example of an inert ceramic binder is a titania powder or titania precursor; an exemplary heat fugitive organic binder/pore former is cellulose; an exemplary heat fugitive inorganic binder/pore former is ammonium carbonate. The paste may include a heat fugitive vehicle such as terpineol, to enhance printability.

Above catalytic carbon layer 48 is disposed a thick (typically at least 50-100 microns), conductive carbon layer 52. Conductive carbon layer 52 may be made from a sinterable paste including primarily highly conductive graphite powder together with an inert ceramic binder and/or a heat fugitive organic/inorganic binder/pore former. For thick carbon layers (above 100 microns in thickness) the paste can contain an inert bulking filler such as glass microspheres, to ensure an adherent, cohesive layer following sintering. In some cases, for instance, where catalytic carbon layer 48 provides adequate cell performance, even in the absence of platinum catalyst, carbon layer 48 and carbon paste 52 may be printed as a single layer including both catalytic and conductive carbons. Current collection over large broad areas from the carbon cathode is achieved by at least one highly conductive metal component 54, which may include a plurality of inert, preferably parallel or near-parallel wires, a metal mesh, or a perforated metal foil. Conductive metal component 54 may be at least partly buried in conductive carbon layer 52.

We have found very few metals that show adequate stability for the job of cathode current collector, amongst them titanium, titanium clad on copper, tungsten, molybdenum, chromium and their alloys. Various sheet forms of carbon or graphite may also be used.

Surprisingly, specific stainless steel compositions appear to provide acceptable corrosion resistance during long-term operation of the highly corrosive iodine-based dye cells, despite containing over 50% iron. One of these compositions is a ferritic stainless steel composition based on chromium, iron and molybdenum. This alloy may contain, by weight, about 29-30% chromium and 3-5% molybdenum, the balance consisting primarily of iron. Higher values of molybdenum (e.g., 5-10%) and/or chromium (e.g., 30-35%) may enhance the corrosion resistance of the alloy.

Another such ferritic stainless steel alloy contains chromium, niobium and iron. This niobium-strengthened alloy may contain, by weight, about 17-19% chromium and 0.5-1% niobium, the balance consisting primarily of iron. Higher values of niobium (e.g., 1-3%) and/or chromium (e.g., 19-25%) may enhance the corrosion resistance of this alloy.

It must be emphasized that the above-disclosed alloys represent specific metallurgical structures that appear to provide satisfactory long-term corrosion resistance in the environment of the cathode of iodine-based photovoltaic cells, and specifically as current collectors. These alloys are preferably free, or substantially free, of nickel.

It should be emphasized that the various layers in the cell may be applied and dried sequentially, and then bonded together in a single sintering operation. This option offers considerable inbuilt process advantages. It should be appreciated, however, that if single step sintering is in fact desired, all component materials in the various layers must be selected with the capability of withstanding the usual sintering temperature for nanocrystalline titania (typically 450°-500° C.) with no loss of critical properties such as inertness, bonding or electrical conductivity. If one-step sintering is not required, however, other, lower-temperature curable binders may be used in the spacer and carbon layers, for example Teflon™, polyvinylidene difluoride (PVDF) or other inert organic or inorganic binders, and other application techniques (spray, calendaring) may be utilized.

The cell is activated by dye staining of the titania layer followed by electrolyte addition. Both steps can be carried out by direct printing of the respective dye or electrolyte fluids onto the outer porous carbon layer. The high porosity of the carbon, spacer, and titania layers ensures fast and thorough transport of the fluids through the layers. The cell is then covered over and sealed at the edges using for example hot sealing via a polymer film or via a spray-on polymer powder formulation 65. Polyethylene and polyethylene vinyl acetate (EVA) based thermoplastic polymers such as Surlyn™ and Bynel™, as well as UV-curable epoxies and silicones have proven to be effective sealants, especially if backed up by an outer epoxy layer 70, and long term sealing is achieved using an outer foil or foil laminate layer 75, based, for example, on aluminum. In an alternative embodiment, the sealants are confined to the cell edges and bond to a sheet of window glass (not shown) or the like to seal the cell.

Photoanode support glass 30 and the external element of the cathode arrangement, such as foil layer 75, together form a housing substantially enclosing cell 200.

Figure 3:
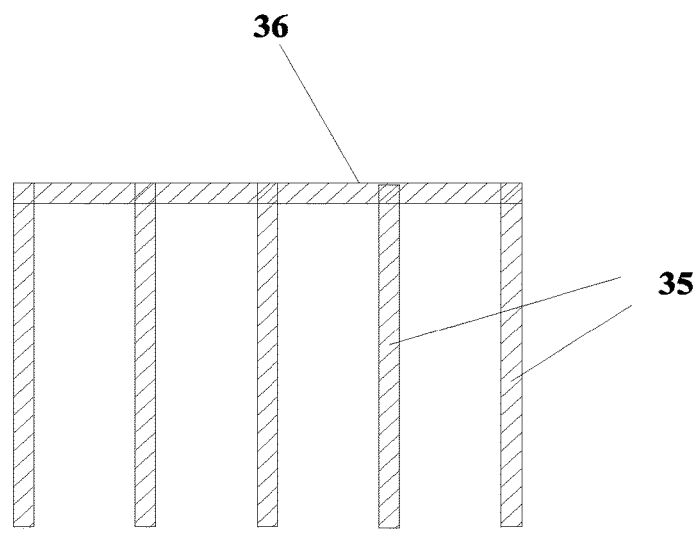
FIG. 3 is a schematic top view of the anode substrate of FIG. 2.

As may be seen from FIG. 3, which is a top view of the plated-on current collectors on the anode substrate (not shown), current take-off from the cell anode is via a section of a plated metal strip 36 common to and disposed perpendicularly to metal strips 35, and preferably situated at the cell edge outside the cell seal area. Plated strip 36 can take a welded-on or soldered-on lead, and if situated outside the cell seal area, may even be of a different plated composition or a fired silver paste.

We have discovered that metal strips 35, 36 may achieve long-term stability, even in the presence of the corrosive electrolyte containing the iodine-based redox species, using a W—Ni—Co alloy. Metal strips 35, 36 may be prepared using a commercial electroplating bath containing tungsten, nickel, and cobalt such as Enloy® Ni-150, provided by Enthone Inc.

In the case of the cathode, current takeoff is via the wires, mesh or perforated foil emerging via the seal that may be welded or soldered onto a current collecting tab external to the cell housing. The large cell is then ready for encapsulation, preferably including a UV filtering layer on the surface facing the sun, and this is followed by cell modulizing into a structural support and the building up of photovoltaic panels.

Figure 2:
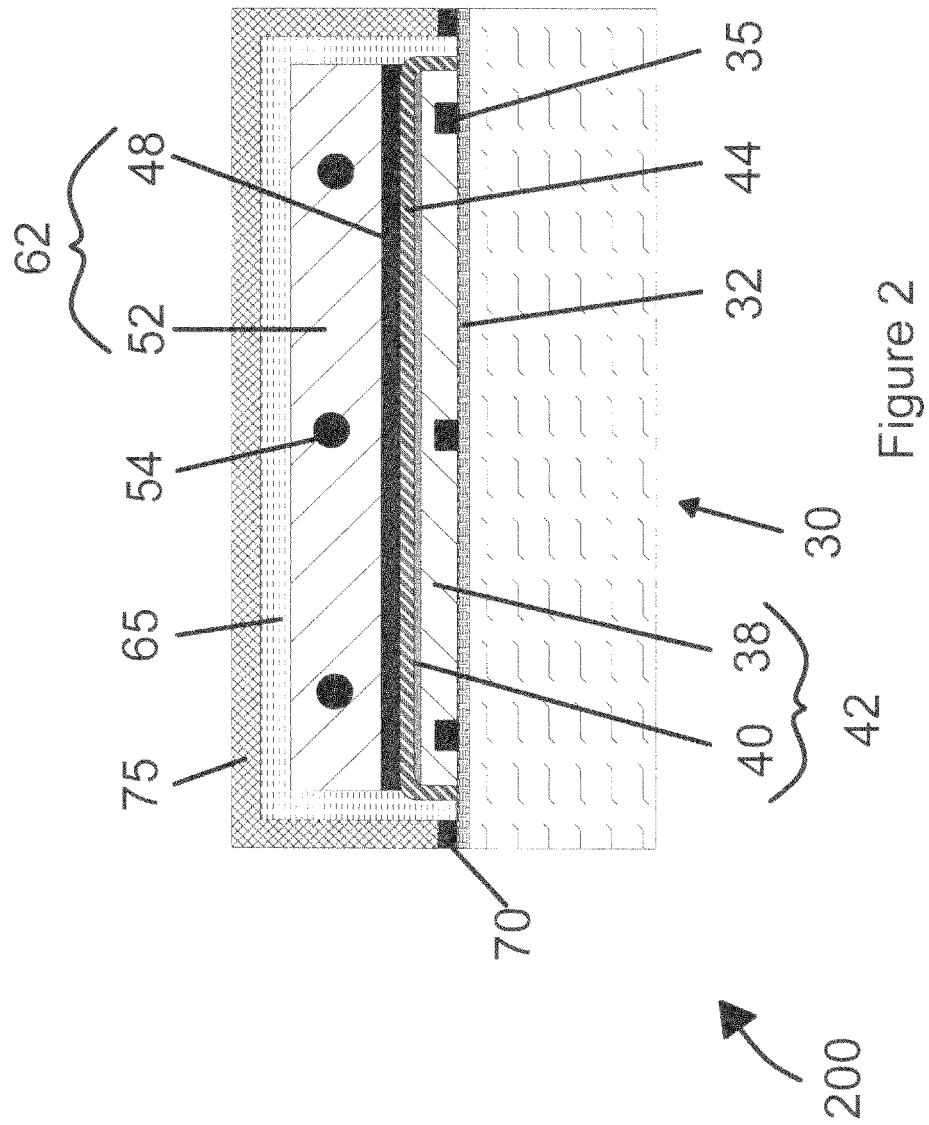
FIG. 2 is a schematic cross-sectional view of a photovoltaic cell having an open-face structure, according to one aspect of the present invention.
Figure 4:
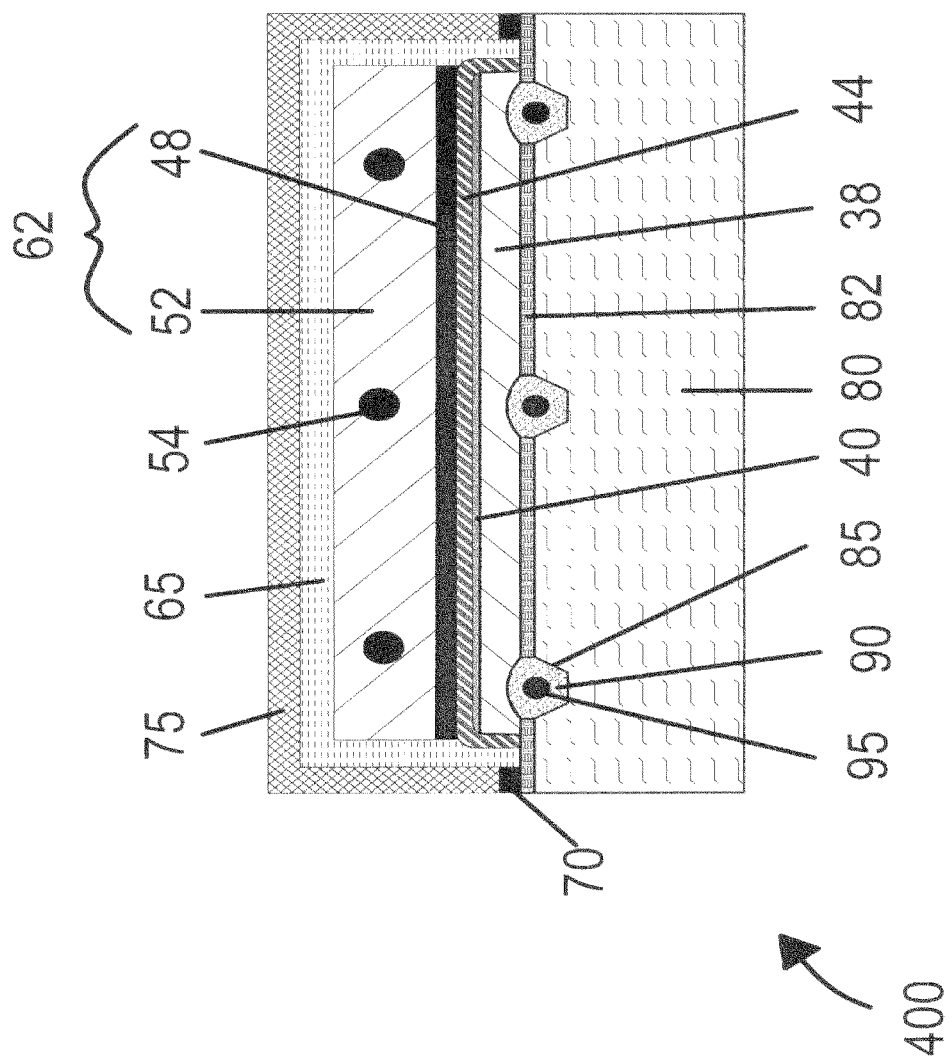
FIG. 4 is a schematic cross-sectional view of a photovoltaic cell having an open-face structure, in which the substrate of the anode includes a conductive-glass sheet having grooves containing conductive metal wires configured to boost current take-off.

FIG. 4 provides a cross-sectional view of a photovoltaic cell 400 according to another embodiment of the present invention. Cell 400 is similar to the cell of FIG. 2, but has at least one significant distinguishing arrangement: an anode substrate 80 has a plurality of grooves 85, each of which is much deeper than thin, conducting surface layer 82. Consequently, the electrical continuity of conducting surface layer 82 is broken in the areas of grooves 85. As taught in our above-referenced published patent application, each groove 85 is fitted with a current take-off arrangement, such as conductive wires 95 bonded to anode substrate 80 and specifically to conducting surface layer 82 by a chemically inert (with respect to the electrolyte, iodine-based redox species, etc.), electrically conducting binder 90. Electrically conducting binder 90 is disposed within grooves 85 and over grooves 85 so as to electrically bridge or connect between the severed portions of conducting surface layer 82. Conducting surface layer 82 may advantageously include, or at least largely consist of, tin oxide. The rest of the construction of cell 400 may be substantially as shown in FIG. 2.

Figure 5:
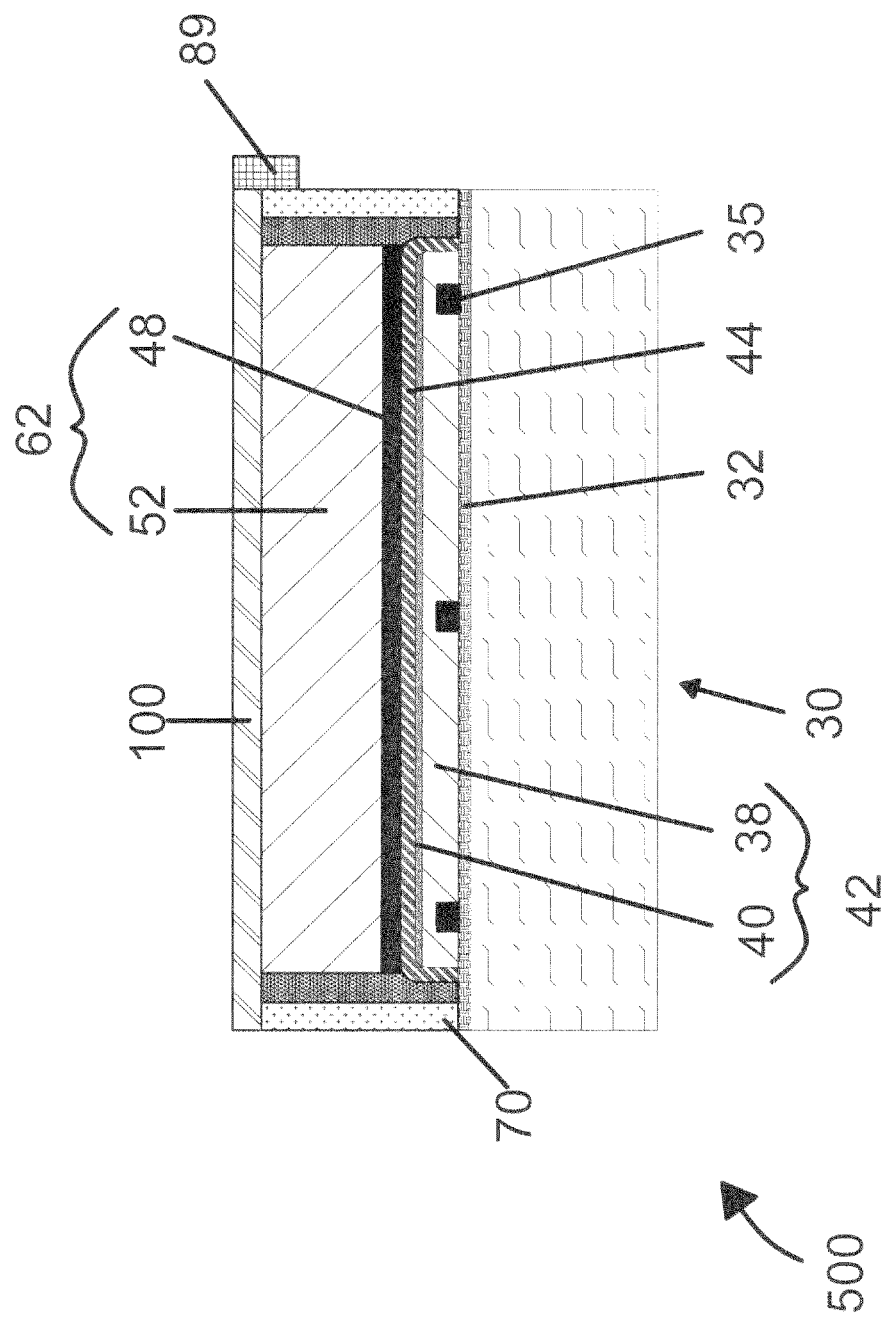
FIG. 5 is a schematic cross-sectional view of an inventive photovoltaic cell having solely a single sheet of conducting glass per cell, supporting the anode, and a conducting metal foil, associated with the cathode, as a current takeoff component.

In FIG. 5 is provided a cross-sectional view of a photovoltaic cell 500 that represents a departure from the monolithic construction taught hereinabove, but nonetheless enables the use of only a single conducting glass sheet per cell, and a relatively close placement of anode and cathode. However, in contrast to the cathodic arrangements disclosed hereinabove (by way of example, in FIG. 4), cell 500 has a distinct, self-supporting (relative to printed layers), laid on current takeoff component for withdrawing current from conductive carbon layer 52. As in some of the previous embodiments, e.g., the cell of FIG. 2, photoanode support glass 30 has a thin, substantially transparent conducting surface layer or coating 32 (e.g., a tin oxide layer in various commercially available FTO glasses), which is in turn partially covered by plated conductors such as plated parallel conductors 35. On the exposed surface is disposed nanocrystalline titania layer 38, essentially as described hereinabove. Spacer layer 44 and carbon layers 48, 52 are printed on. After sintering, dye and electrolyte may be introduced via carbon paste layer 52, producing dye layer 40. Cell 500 is then closed off with a conductive current collecting component such as conductive metal sheet 100, which presses onto and makes good electrical contact with conductive carbon layer 52. Metal sheet 100, which acts as a current collector for cathode 62, may be selected from the following metals: titanium, tungsten, molybdenum or chromium and alloys in which these metals are the principal elements, or higher alloys containing, principally or essentially, chromium, niobium and iron, or chromium, iron and molybdenum, as described hereinabove. Metal sheet 100 may be hot sealed to the edges of photoanode support glass 30 using sealants, for example, a polymeric, internal sealing layer 110 as an internal sealing layer and an external epoxy layer 120 as an external sealing layer adapted to seal cell 500 from an external environment. Current take-off out of cell 500 via metal sheet 100 may be effected by means of a projecting strip or a welded-on element such as a metal strip 89, which electrically communicates with metal sheet 100.

Figure 8:
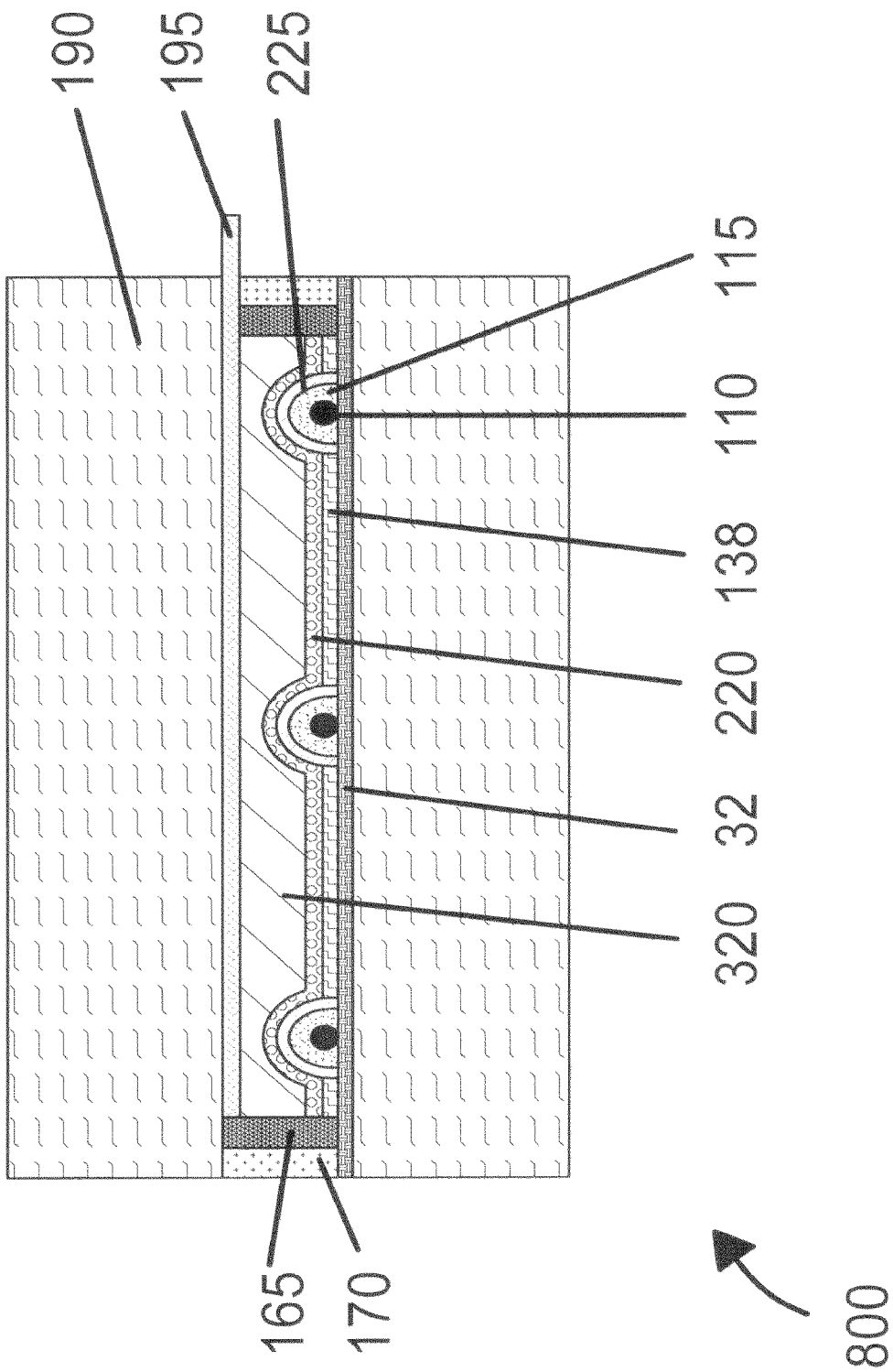
FIG. 8 is a schematic cross-sectional view of another embodiment of an inventive photovoltaic cell having a highly conductive, corrosion-resistant foil as the current collector of the cathode.

In related embodiments (not shown), the sheet may be prepared with a conductive carbon layer to better mate conductively with carbon layer 52 on the cell assembly. Alternatively, carbon layers 52, 54 may even be entirely obviated if the sheet is catalyzed directly with platinum or platinum substitutes. As an alternative embodiment to a sheet as a current takeoff component, a metal mesh may be used (passing sealably out through the edge seal of the cell) and the cell is sealed off by a plain glass, or by another suitable sheet (e.g., plastic) covering the mesh, as shown in FIG. 8 hereinbelow.

Although in-assembly dye staining and electrolyte filling is preferred, it is possible to vacuum-fill cells of this type with electrolyte, even after assembly, via holes pre-drilled in the glass or sheet faces, and followed by sealing off the holes with polymer.

Ideally, the height of the strips above the conductive glass surface may be less than the thickness of the sintered titania, in order to avoid steric interference with subsequent layers or possible short circuits. However, during reduction to practice, we have discovered that to achieve adequate current takeoff using metal strips that are substantially inert to the highly corrosive electrolyte in iodine-based dye cells, and for use in broad, large area cells of 10-15 cm on a side, the requisite height of the metal strips may be considerably larger than the height of the titania layer. Moreover, the metal wires are bonded to the conductive layer of tin oxide using a conductive adhesive, such that the wire and adhesive structure may protrude above the conductive layer of the glass surface by at least about 200 micrometers, and typically, by at least about 250 or even about 300 or more micrometers.

Consequently, the wire and adhesive structure may protrude above layer of sintered titania by at least about 180 micrometers, and typically, by at least about 230 or even about 280 micrometers or more. While it is possible to increase the thickness of the layer of sintered titania above 15-20 micrometers, a significant increase in the thickness may result in delamination of the layer, wastes expensive dye, and may introduce various mass transfer limitations with respect to the redox species. From a practical standpoint, therefore, the problem of the wire and adhesive structure protruding well above the titania layer cannot be remedied by increasing the thickness of the sintered titania.

Thus, in reducing to practice the teachings of U.S. Patent Application Publication No. 20050072458, protrusions of the wire and adhesive structure towards the interior of the cell may dictate a relatively large spacing between anode and cathode—approaching or exceeding 100 microns—which can result in excessive ohmic loss from the electrolyte.

Figure 6:
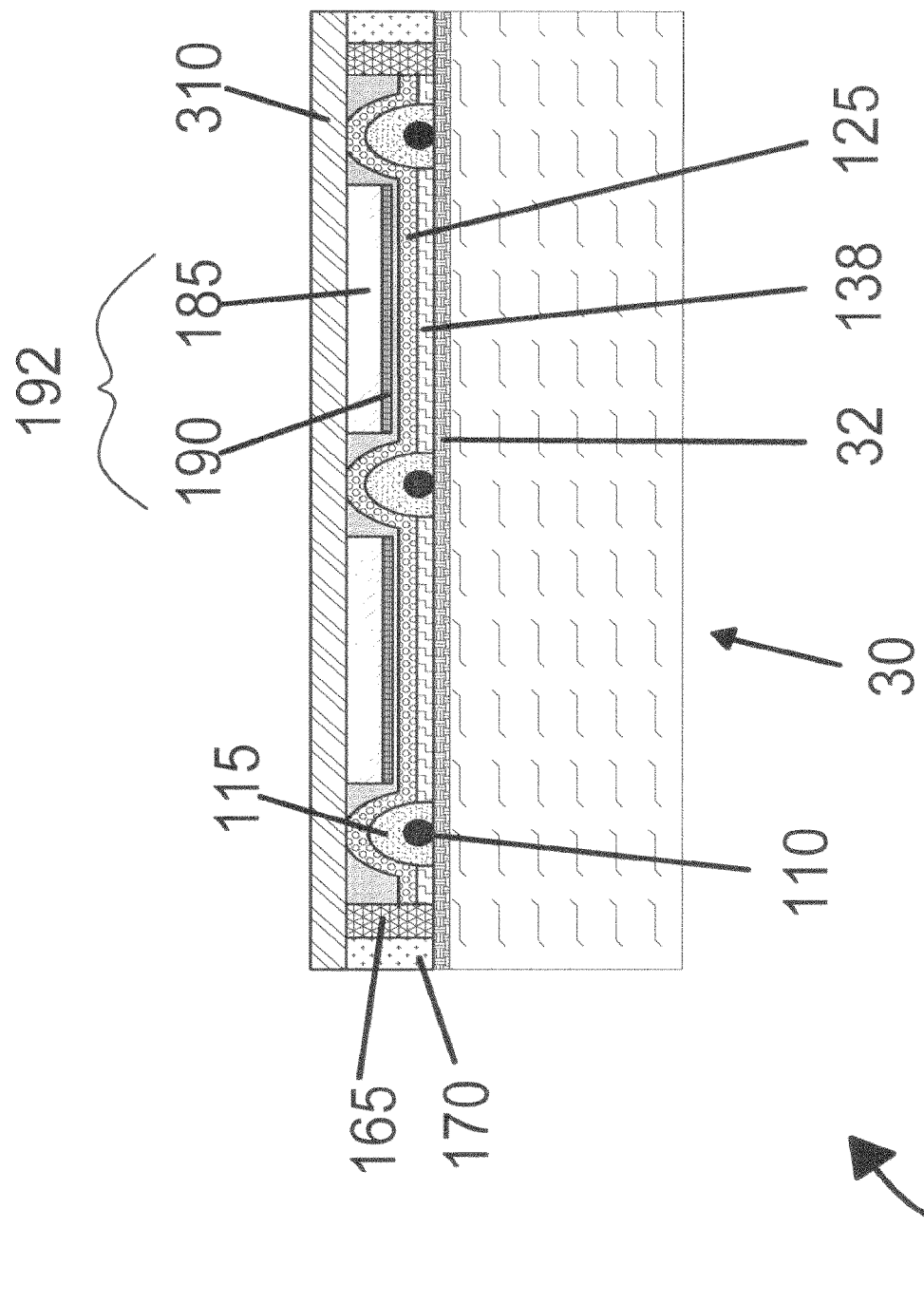
FIG. 6 is a schematic cross-sectional view of a photovoltaic cell having an inventive bi-plate construction.

FIG. 6 is a schematic cross-sectional view of a photovoltaic cell 600 having an inventive construction enabling use of only one conducting glass sheet per cell and enabling a fairly close placement of the anode and the counterelectrode. This assembly may be termed a biplate construction because the anode and cathode components in the cell build are physically distinct and not bonded together. As in FIG. 2, the photoanode includes a porous nanocrystalline titania layer or film 138 and a dye monolayer (shown above in FIG. 4), absorbed on a surface of the porous titania layer. In the photoanode of cell 600, the dye and film are adapted to convert photons to electrons.

A photoanode support glass 30 with transparent conductor layer 32 has spaced, preferably parallel wires or strips such as wire 110 bonded in place on the surface of the conductive glass by a conducting adhesive such as an inert conducting ceramic adhesive 115. Porous titania layer 138 is bonded to transparent conductor layer 32 in most of the area between adjacent wires 110. Both the titania and the conducting adhesive bonding the wires may be optionally covered by an electrically insulating layer, for example, consisting of, consisting essentially of, or including zirconia, for additional protection against short-circuiting.

A porous separator, such as a porous, laid-on separator 125, such as a glass fiber veil or a microporous polymer membrane, may electrically insulate the photoanode from a counterelectrode 192, which includes a plurality of strips, each of which may include conducting carbon layer 185 and a catalytic layer such as catalytic carbon layer 190 (which may alternatively form a single layer). Porous separator 125 may be as thin and porous as possible (preferably having a thickness of less than 50 microns in an uncompressed state), and of a material that is chemically stable in the cell (for example: polyethylene, PET, PPS, PEN, fluoropolymer or glass fiber). Cathodic current collector such as collector sheet 310 may be made of, consist essentially of, or include, a metal sheet selected from the cathode metals and alloys provided hereinabove. Collector sheet 310 is adapted to firmly press against porous separator 125. The metal sheet of collector sheet 310 can be directly catalyzed with platinum or a platinum substitute, and may be structured (by corrugation or machining, for example) with periodically spaced projecting areas (not shown) to ensure close proximity (via the porous membrane) of catalyst to titania between the wires of the photoanode.

Referring again to FIG. 6, a plurality of strips, each including conducting carbon layer 185 and catalytic carbon layer 190, may be sintered or otherwise bonded to collector sheet 310. In the assembled cell 600, counterelectrode 192 is disposed substantially opposite the titania printings, and may be of pre-designed thickness, such that there is a relatively close proximity (across the porous separator) of the catalyzed carbon layer and the titania layer between the wires after cell closure and sealing. Following dyeing of the titania, the two halves of the biplate cell are juxtaposed with the porous separator between them, metal collector sheet 310 is hot sealed to the glass anode base-plate edges using, by way of example, an inner polymer sealing layer or seal 165 and an outer epoxy sealing layer or seal 170. After checking that cell 600 is free from short circuiting, cell 600 is filled with electrolyte, one possibility being adding electrolyte to the cell via fill holes and later sealing off the fill holes with polymer. Current take-off from collector sheet 310 out of the cell may be enabled by a projecting strip or a welded-on element.

Together, photoanode support glass 30 and collector sheet 310 form a housing substantially enclosing cell 600.

Figure 7:
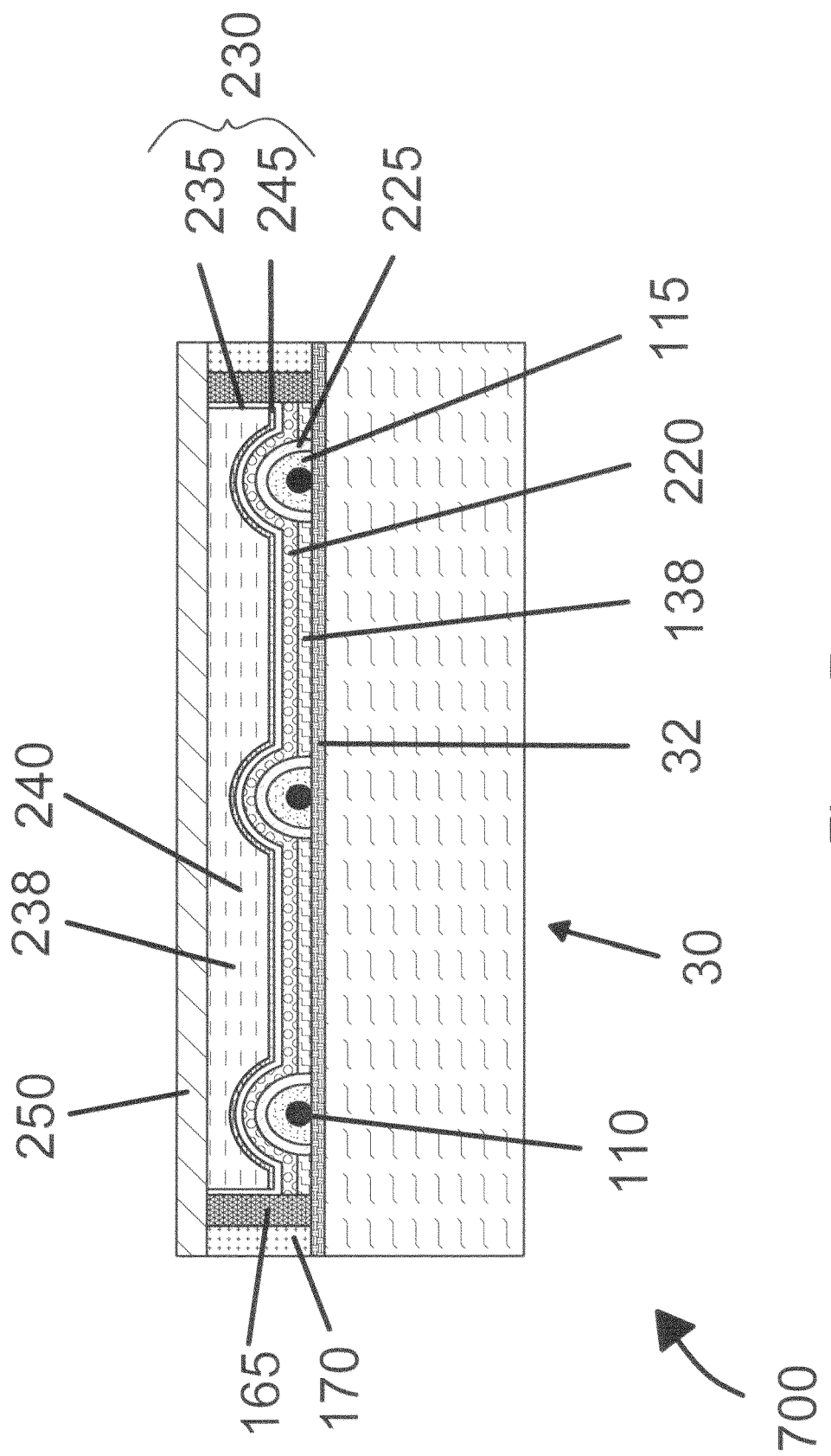
FIG. 7 is a schematic cross-sectional view of another embodiment of a photovoltaic cell having an inventive bi-plate construction.

FIG. 7 provides a cross-sectional view of a photovoltaic cell 700 according to another embodiment of the present invention. The construction of this biplate cell enables the use of only a single conducting glass sheet per cell. This construction further enables a very close juxtaposition of anode and cathode. A photoanode support glass 30 coated with substantially transparent conductor layer 32 has spaced, preferably parallel wires 110 bonded in place on the surface of the conductive glass by inert conducting ceramic adhesive 115. Between wires and at the cell edges is a sintered nanoporous titania layer 138, typically 10-15 microns thick and covered with an electrically insulating layer 220, e.g., including zirconia, typically having a relatively uniform thickness in a range of 2-15 micrometers. Since the wires may typically have a diameter of at least 100 microns, and the combined height of the titania and zirconia layers is typically below about 30 microns, the wires project substantially above the titania layer and must be covered also by an electrically insulating layer 225, for example including zirconia, to avoid short circuiting to a counterelectrode 230 of cell 700.

Counterelectrode 230 is a distinct component laid onto the anode element and disposed in close proximity thereto. Counterelectrode 230 includes a porous support matrix 240 supporting impregnated carbon 238. Porous matrix 240 may include a mat, woven and/or non-woven, foam, or possibly other matrices known in the art. A preferred material for the mat is glass fiber since it is low cost, flexible and conformable to the cell geometry, inert in the cell environment, and can withstand elevated curing or sintering temperatures. Other fibers such as carbon fibers may also be used. Impregnated carbon 238 is preferably bonded to porous support matrix 240 by an inert binder, which may be selected from inorganic materials such as alumina, or polymeric materials such as polytetrafluoroethylene (PTFE, or Teflon™). Counterelectrode 230 may include a conductive layer 235 and a catalytic layer 245 (catalytic layer 245 being disposed towards titania layer 138), or a combination thereof. Current takeoff from counterelectrode 230 may be effected via an electrically conducting sheet 250, which presses against the carbon structure and may be structured with periodic projecting or protruding areas (not shown), to ensure close proximity of counterelectrode 230 to titania layer 138 between adjacent wires 110. Conducting sheet 250 may be selected from the cathode metals and alloys provided hereinabove.

Following dyeing of the titania, counterelectrode 230 and current collecting sheet 250 may be pressed together and conducting sheet 250 is then hot sealed to the glass anode base-plate edges using a polymeric sealing layer 165 (e.g., containing Surlyn™) and an outer epoxy layer 170 adapted to seal the cell from an external environment. After checking that the cell does not short-circuit, the cell is filled with electrolyte, for example, by addition of electrolyte to the cell via fill holes in sheet 250 followed by sealing off the fill holes with polymer. Current take-off from photovoltaic cell 700 via sheet 250 may be effected by a projecting conductive strip or a welded-on conductive structural component.

While various sandwich structures, in which a carbon layer is printed on top of a zirconia spacer layer on top of a titania layer, may allow close spacing of carbon and titania surfaces, it must be emphasized that such structures may be extremely prone to penetration of the carbon printing layer to the conducting glass surface, via any holes or defects in the printed layers of titania or spacer. The penetration of the carbon printing layer to the conducting surface of the FTO glass effects short-circuiting of the cell, thereby reducing or limiting cell performance. This problem is particularly acute in view of the at least 7-10 year lifetime often required for cells to attain commercial viability. The inventive biplate construction, as described herein, avoids this significant and potentially critical problem, because the carbon counterelectrode is not sintered (i.e., chemically bonded at high temperature) to the printed layers of titania or spacer. Rather, the carbon counterelectrode is a distinct and separate entity that is lies on top of, and physically contacts, the separator or spacer layer, but is not bonded thereto, as in printed carbon layer technologies.

FIG. 8 is a schematic cross-sectional view of another embodiment of an inventive photovoltaic cell 800 having a cathodic current collector including, or consisting essentially of, a conductive, chemically inert mesh or foil 195, preferably disposed above, and physically contacting, counterelectrode 320. In this embodiment, counterelectrode 320 may be sintered onto electrically insulating layer 220, typically zirconia, which has been described hereinabove with respect to FIG. 7. For configurations in which counterelectrode 320 includes more than one layer, e.g., a conductive layer and a catalytic layer, the catalytic layer is disposed towards electrically insulating layer 220.

The anodic arrangement of photovoltaic cell 800 may be substantially identical to the arrangement provided in FIG. 7 and has been described hereinabove. The sealing arrangement of cell 800 may be substantially identical to the arrangement provided in FIGS. 6 and 7 and has been described hereinabove.

Briefly, photoanode support glass 30 coated with substantially transparent conductor layer 32 may have spaced, preferably parallel wires 110 bonded in place on the surface of the conductive glass by inert conducting ceramic adhesive 115. Between wires and at the cell edges is a sintered nanoporous titania layer 138, typically 10-15 micrometers thick, which is covered with electrically insulating layer 220, e.g., including zirconia. Since the wires may typically have a diameter of at least 100 micrometers, and the combined height of the titania and zirconia layers is typically below about 30 micrometers, the wires project substantially above the titania layer and may be covered also by an electrically insulating layer 225, for example including zirconia, to avoid short circuiting to counterelectrode 320.

The superior current collection performance of conductive mesh or foil 195 obviates the need for sealing the cathodic arrangement with expensive conductive glass such as FTO glass. Instead, cell 800 may be sealed on top by a sheet such as ordinary, inexpensive glass sheet 190, disposed above mesh or foil 195, and may also be adapted to provide the requisite structural support for mesh or foil 195 as well as the requisite compressive force against mesh or foil 195.

Conductive mesh or foil 195 may pass sealably out through seals 165, 170 of photovoltaic cell 800. Conductive mesh or foil 195 may include, or consist essentially of, a metal mesh or foil, preferably selected from the cathode metals and alloys disclosed hereinabove.

Conductive mesh or foil 195 may include, or consist essentially of, a graphite mesh or foil, or a carbon mesh or foil. Composite cathodic current collectors including graphite and/or carbon and/or metal meshes or foils may also be practical. It may be particularly advantageous to use a graphite or carbon foil to cover the central area of photovoltaic cell 800, and to boost current takeoff near the edges of cell 800 by electrically connecting the edges of the carbon or graphite foil to a metal mesh and/or foil disposed near a perimeter of cell 800 and passing sealably out through seals 165, 170 of cell 800.

Figure 9:
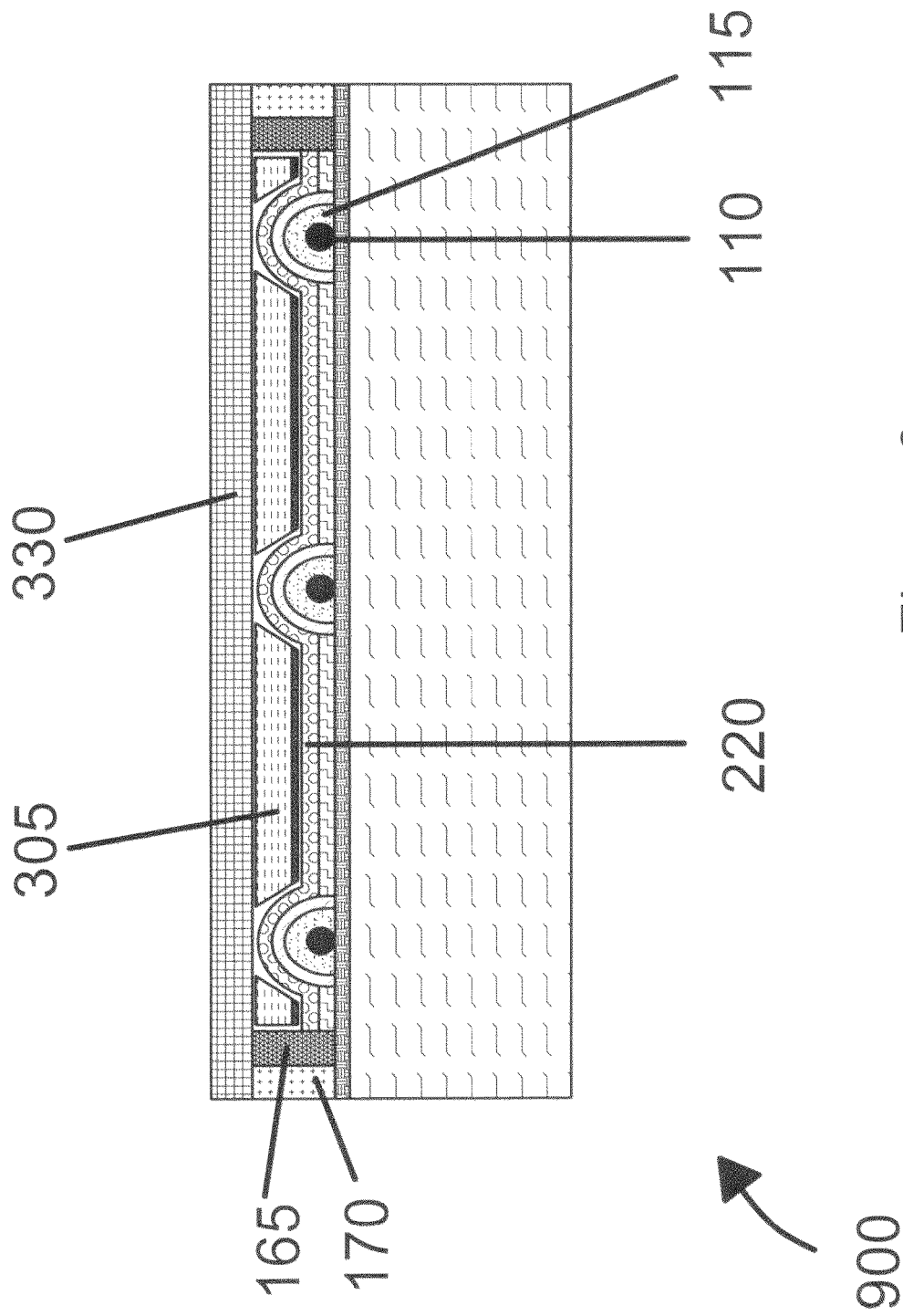
FIG. 9 is a schematic cross-sectional view of a photovoltaic cell having a highly conductive, metal, corrosion-resistant plate as the current collector of the cathode, according to another embodiment of the present invention.

FIG. 9 is a schematic cross-sectional view of another embodiment of an inventive photovoltaic cell 900, which may have a metal, conductive, substantially chemically inert sheet 330 as the current collector of the cathode. The anodic arrangement of photovoltaic cell 900 and the sealing arrangement of cell 900 may be substantially identical similar to those provided in FIG. 7 and is described hereinabove.

Beneath sheet 330 is disposed a counterelectrode 305, which is juxtaposed, but preferably not bonded to, sheet 330. Counterelectrode 305 may be substantially similar to counterelectrode 230, which is provided in FIG. 7 and is described hereinabove. However, counterelectrode 305 is provided as a plurality of substantially self-supporting strips, which are laid down on top of porous, electrically insulating layer 220, which is typically a zirconia printing. Counterelectrode 305 may be of a pre-designed thickness to achieve a relatively close proximity (across electrically insulating layer 220) of the catalyzed carbon layer and the titania layer between the wires after closure and sealing of cell 900. Moreover, a counterelectrode mat that is continuous over the entire area of the cell may have trouble conforming to the protrusions formed, inter alia, by wires 110 and ceramic adhesive 115, increasing the distance between the catalyst and the titania in the area immediately around the protrusions. Thus, by laying down counterelectrode 305 in strip form, between these protrusions, the distance between the catalyst and the titania in the area immediately around the protrusions may remain low and substantially constant over the entire area of cell 900, thereby minimizing ohmic losses and improving power performance.

With reference again to FIG. 8, the prior art does not appear to provide carbon pastes that can be successfully applied by screenprinting to large area cells of the monolithic or single cell design with cell areas significantly above 10 sq. cm. Screenprinting, rather than doctor blading, is the application method of choice for industrial production of broad, large-area dye cells. However, when water based formulations are attempted for screenprinting of the carbon for dye cells there emerge several obstacles. Firstly, the prior art water-based carbon pastes tend to be quick drying and can clog the screens used in production scale screenprinting. Certain additives may ease this situation somewhat.

A more critical problem, however, is that after sintering, these pastes have insufficient electrical conductivity for practically useful printing thicknesses. Even more problematic is the fact that after screenprinting and sintering—and even with application of multiple layers—the layers have insufficient mechanical strength (bonding within the layer itself and to the substrate beneath) and can delaminate. Often, cracks and holes are evident in the porous structure and carbon particles may dislodge or delaminate from the layer, in some cases shorting out the cell between the conducting glass of the anode and the counterelectrode.

The insufficient mechanical strength is principally a result of the incorporation of particulate titania intrinsically as the binder, since this material does not sinter strongly enough to the carbon materials in the paste nor to the substrate beneath.

In the present invention, a titania precursor is used (instead of titania powder) which, during the usual sintering in air, provides titania centers in situ throughout the layer and forms stronger bonds with the carbon materials used and, in some preferred embodiments, with the substrate beneath (usually a spacer layer of porous zirconia). We have further discovered that many precursors that oxidize acceptably to titania on sintering in air, for example the titanium alkoxides, appear to be unsuitable for paste formulation, because they fume strongly in air and are difficult to work with. A non-limiting example of a benign, suitable precursor is the family of organic titanates supplied by DuPont under the trade name Tyzor™. These organic titanates are available in the form of organic chelates, aqueous chelates, and orthotitanate esters. These precursors contain about 15 wt % of titania equivalent, and oxidation to titania is usually complete on heating in air at above 300 C for 30 minutes. We have found particularly useful the Tyzor™ grade AA-75, which is based on titanium acetylacetonates in an alcoholic solvent. However, other grades of Tyzor™ are also applicable. The parallel zirconium chelates may also be used (which sinter in situ to zirconia), but these are more expensive than their titanium analogs.

We have further discovered that the conductivity and strength of the conductive carbon layer may be appreciably improved by the addition of a material known as expanded graphite to the paste. Prior art carbon pastes for the dye cell cathode (which were not conducting or robust enough) normally consist of high surface area conductive grade carbon black (at least 150 sq. meter per gram) with typical particle size of up to 50 nanometers, together with graphite powder having an average particle diameter of several micrometers as the main additive for boosting conductivity.

Expanded graphite, which is graphite that has been chemically exfoliated to give large, flat, anisometric, two-dimensional platelets of particle size selectable from about 20-100 micrometers and having a surface area of about 10-30 sq. meters per gram, is a much more effective conductivity booster and also provides improved anchoring and mechanical stability for the layer. The carbon, graphite and titania precursor components are conveniently dispersed in a printing vehicle such as terpineol or ethyl hexanol. The paste may be made more viscous and printable, giving a print with improved green strength, by the incorporation into the terpineol of a heat fugitive thickening agent such as ethyl cellulose. Additional conducting filler powders that are chemically stable in the cell working conditions, for example doped tin oxides, titanium nitride and metal powders or metal coated carbons, may be added to supplement the carbons. The various carbons (such as the carbon black) can also be optionally catalyzed, for example, with platinum, or alternatively a special thin layer (few micrometers) of catalyzed carbon may be printed adjacent to the titania or zirconia layers, situated underneath a conducting carbon layer that is substantially free of precious metal catalyst. For such thin layers, the catalyzed carbon paste will advantageously be made up containing a fine zirconia powder (typically having an average particle size of about 0.5 micrometers), which enhances the adhesion of the catalytic layer. Similarly, non-conducting bulking materials such as glass spheres (e.g., having a diameter of 40-80 micrometers) may be included in the paste in order to facilitate printing of thick adhesive carbon layers of thickness 100 micrometers and above.

Figure 10A:
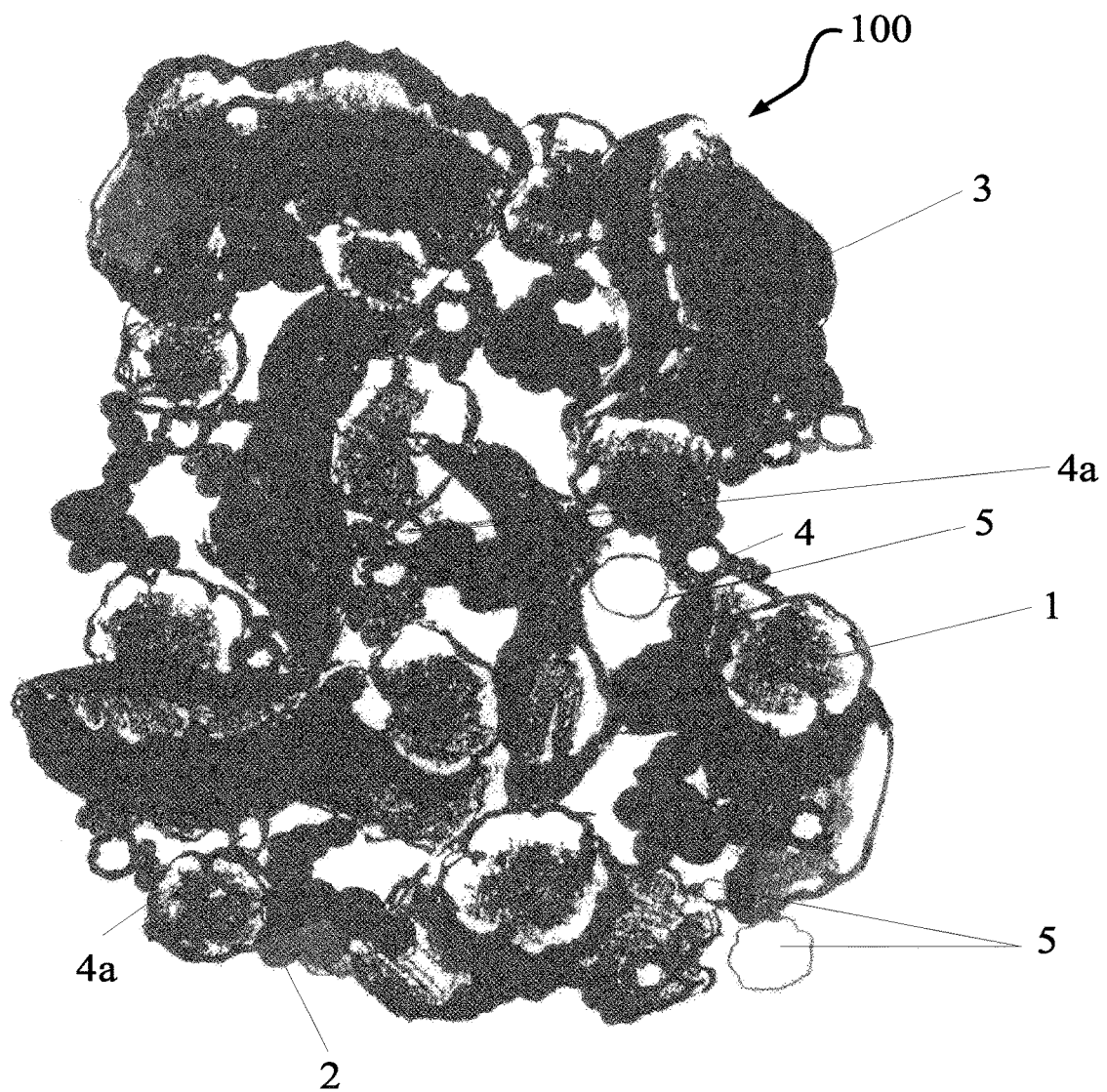
FIG. 10A is a schematic cross-sectional representation of a porous carbon paste layer following sintering, according to the present invention.

A schematic cut away representation of an inventive, sintered, porous, conductive carbon layer 100 is shown in FIG. 10A, for typical layer thicknesses of 50-100 micrometers. Porous carbon layer 100 includes at least three different types of carbon-based materials: graphite powder particles such as graphite particle 1, carbon black particles such as carbon black particle 2, and large leaf-like platelets of expanded graphite such as expanded graphite particle 3. The various carbons (such as the carbon black) may optionally be catalyzed. Porous carbon layer 100 further includes titania particles, such as titania particle 4 which has been freshly generated in-situ. Without wishing to be bound by theory, we believe that such freshly generated titania strongly bonds the different materials together and to the substrate below, in those embodiments in which carbon layer 100 is sintered thereto (such as electrically insulating layer 220, shown in FIG. 8). FIG. 10A shows that there is good electrical continuity of the carbon particles through the sintered paste, conferring a high conductivity. We further believe that the expanded graphite particles provide a conduit for removing the cathodic current at minimal ohmic loss.

Some titania particles may bond directly to the graphite particles, others may bond directly to the carbon black particles. We have discovered that in the photovoltaic cell of the present invention, titania particles such as titania particles 4a may bond directly to the expanded graphite platelets such as expanded graphite particle 3, or to carbon black particles 2 or to graphite powder particles 1. In sintered porous carbon layer 100, such bonds are chemical bonds, which provide for a more robust, mechanically solid carbon layer.

In a preferred embodiment, the conductive paste includes zirconia particles and/or a zirconia precursor. FIG. 10A further provides a schematic representation of zirconia particles 5 disposed within sintered porous carbon layer 100. The zirconia particles may be sintered to particles 1,2,3,4, providing for a more robust, mechanically solid carbon layer.

Conductive carbon layer 100 may advantageously be disposed on a substrate (e.g., in the form of strips) such as flexible mesh, fiber such as glass fiber, and foam. Such materials may adapt to fit the contours of the anode within cell, enabling the catalytic layer proximate to carbon layer 100 to be juxtaposed against the porous film of the anode (e.g., a titania layer). Carbon layer 100 may be urged against the porous film by the weight of the cover of the cell, which may advantageously be made of a glass such as inexpensive window glass.

In addition, strips of such substrates, impregnated with conductive carbon layer 100 and a catalytic layer or component, may advantageously be disposed in between protrusions in the anodic side, whereby an exterior surface of the catalytic layer is substantially flush with the opposing surface (typically titania, or titania covered with an insulating layer such as zirconia) on the anodic side.

Figure 10B:
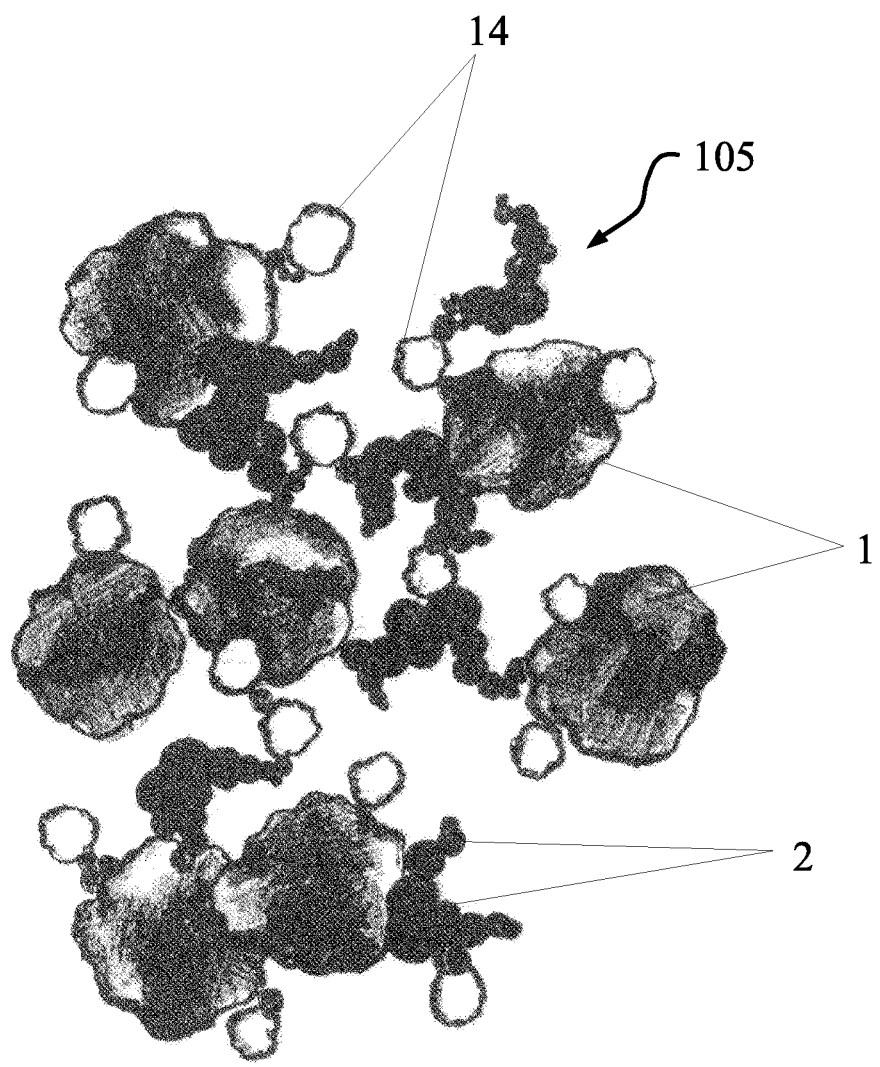
FIG. 10B is a schematic cross-sectional representation of a porous carbon paste layer following sintering, according to the prior art.

In sharp contrast to the microstructure of inventive sintered carbon layer 100, an exemplary, schematic cross-sectional cut away illustration of a prior art sintered porous carbon layer 105 is provided in FIG. 10B. As may be seen, spheroidal graphite particles 1 and carbon black particles 2 do not provide an adequate electrically conductive network, while titania particles 14, which were not generated in-situ, are somewhat isolated and do not confer much mechanical strength to the layer 105, nor can they provide effective bonding to the substrate below, in those embodiments in which carbon layer 105 is sintered thereto (such as electrically insulating layer 220, shown in FIG. 8). Moreover, the pastes used to produce the prior art sintered porous carbon layers may be generally difficult to screenprint, may be mechanically weak, and may not have adequate conductivity for dye cells, and more particularly, for broad, large-area dye cells.

The graphite powder used to produce sintered carbon layer 100 may typically include spheroidal particles having an average particle size of at least 2 micrometers, and more typically, at least 5 micrometers, up to a maximum average particle size of 10 to 15 micrometers. The surface area of the graphite particles is typically 15-40 $m^2/g$, and more typically, 20-30 $m^2/g$.

The expanded graphite particles used to produce sintered carbon layer 100 may be typically anisotropic flakes having a long dimension of at least 15 micrometers, more typically at least 40 micrometers, and yet more typically at least 60 micrometers, on average. The surface area of the expanded graphite particles is typically 5-50 $m^2/g$, and more typically, 25-35 $m^2/g$.

The carbon black particles used to produce sintered carbon layer 100 may be typically disposed in chainlike clusters of carbon, in which the individual particles may have an average primary particle size of 5-100 nm, and more typically, 10-75 nm. The surface area of the carbon black particles is typically 50-2000 $m^2/g$, more typically, 100-600 $m^2/g$, and most typically, 150-300 $m^2/g$.

The titania particles in sintered carbon layer 100 may be particles having an average primary particle size of at least 10 nm, and more typically, at least 20 nm to about 30 nm. The surface area of the titania particles is typically 20-130 $m^2/g$, and more typically, 50-90 $m^2/g$.

The zirconia particles in sintered carbon layer 100 may be spheroidal particles, the zirconia particles having an average particle size of at least 0.3 micrometers, and more typically, at least 0.5 micrometers, up to an upper bound of typically one micrometer. The surface area of the zirconia particles is typically 5-40 $m^2/g$, and more typically, 10-20 $m^2/g$. When formed in-situ, the zirconia particles are typically much smaller.

In reducing sintered carbon layer 100 of the present invention to practice, we have discovered that various weight ratios may be of particular importance. The weight ratio of spheroidal graphite to the sum of carbon black and expanded graphite may be preferably in the range of 1.5:1 to 3.5:1.

The weight ratio of carbon black particles to expanded graphite particles may be preferably in the range of 1.5:1 to 1:1.5.

The weight ratio of the total carbon content of sintered carbon layer 100 (including the graphite powder, carbon black particles, and expanded graphite particles) to titanium dioxide particles, may be preferably in the range of 1.2:1 to 3.5:1.

In those preferred embodiments in which zirconia particles are present in sintered carbon layer 100, the weight ratio of carbon black particles to expanded graphite particles to zirconia particles may be preferably in the range of 1.5:1:0.5 to 1:1.5:1.

The weight ratio of the total carbon content and zirconia content of sintered carbon layer 100 to the titania content may be preferably in the range of 1.5:1 to 4:1.

The weight ratio of the typically spheroidal graphite particles to a sum of the carbon black particles, expanded graphite particles, and zirconia particles may be preferably in the range of 1.2:1 to 3:1.

EXAMPLES

Reference is now made to the following examples, which together with the above descriptions, illustrate the invention in a non-limiting fashion.

Preparation of a dye cell carbon cathode according to the prior art is described in the following example:

Example 1

Preparation of a Dye Cell Carbon Cathode According to the Prior Art

Conductive carbon black (Cabot type Vulcan XC72R, 5 gm), spherical graphite powder (Timcal, type KS4, 20 gm), and titania nanocrystalline powder (Degussa type P 90, particle size 14 nm, 4 gm) were dry blended in an agate ball mill for 30 minutes. A quantity of water (80 gm) was then added to the ball mill containing the carbon, graphite and the titania powder and milling was continued overnight.

The resulting carbon paste (as a cathode paste) was evaluated for fabrication of small area dye cells (typically below 1-5 sq. cm). The paste could be doctor-bladed and sintered onto conductive glass, or onto conductive glass with a lower sintered layer of porous titania covered by an upper sintered layer of porous zirconia. The carbon layer was adherent for these small cells, with a conductivity of 10 ohms per square for a thickness of 50 micrometers. On dye and electrolyte application and sealing of cells, a good efficiency of 8% under one sun illumination (100 mW per sq. cm) was achieved. However, when screenprinting was attempted with the paste for larger area cells typically above 10 sq. cm. with a view to industrial scale up, the paste tended to clog the printing screens, and the print following sintering had inadequate mechanical strength and conductivity. Particularly problematic was poor adhesion to the substrate, delamination and formation of cracks and holes over the surface.

Preparation of a dye cell carbon cathode according to the present invention is described in the following example:

Example 2

Preparation of a Screenprintable Carbon Dye Cell Cathode

Spherical graphite powder (Timcal, type KS4, 20 gm), carbon furnace black (Cabot, type Vulcan XC72R, 5 gm) and expanded graphite (Timcal, type BNB90, 2.5 gm) were dry blended in an agate ball mill for 30 minutes. A titania precursor (Dupont, Tyzor™ type AA-75, 30 gm) was stirred with terpineol (Aldrich, 50 gm) that contained 10 wt % dissolved ethyl cellulose (Dow, ethocell type standard industrial 45). This liquid mixture was then added to the ball mill containing the carbon, spherical graphite powder, and expanded graphite, and milling was continued overnight. The resulting carbon paste was screenprinted in a single printing using a plastic mesh onto a sintered porous zirconia spacer upper layer, itself part of a conducting glass carrying a sintered-on layer of nanocrystalline titania (15 micrometers thick) covered by the porous sintered zirconia layer and appropriate for dye cell fabrication for cell areas in excess of 10 sq. cm. The wet thickness of the carbon print was 100 micrometers. The carbon print was dried at 150 C for 10 minutes. The print was then sintered in air at 450 C for 30 minutes, giving a sintered thickness of 50 micrometers. In order to achieve the desired conductivity, a second printing of carbon paste, drying and sintering was carried out, and the final sintered carbon thickness was 50 micrometers. Adherence of the carbon layer to the underlying zirconia layer was excellent, there was good integrity of the layer with no flaking off, and there were no cracks or holes. The electrical conductivity of the layer was 10 ohms per square at this thickness. Since the conducting glass used to support the titania layer had a similar conductivity of 10 ohms per square there was good matching of photoanode and counter electrode conductivities, one of the requisites for high dye cell efficiencies. The carbon layer was quite porous and allowed fast transfer of dye and electrolyte printings to the titania layer below. The dye cell, after dye staining of the titania, electrolyte addition and sealing, gave 7% efficiency under one sun illumination of 100 mW per sq. cm.

Example 3

Preparation of a Screenprintable Carbon Dye Cell Cathode

Spherical graphite powder (Timcal, type KS4, 20 gm), carbon furnace black (Cabot, type Vulcan XC72R, 5 gm), expanded graphite (Timcal, type BNB90, 5 gm) and zirconium dioxide (IAM, type 40R-080, 3 gm) were dry blended in an agate ball mill containing agate balls for 30 minutes. A titania precursor (Dupont, Tyzor™ type AA-75, 60 gm) was stirred with terpineol (Aldrich, 25 gm) that contained 10 wt % dissolved ethyl cellulose (Dow, ethocell type standard industrial 45). This liquid mixture was then added to the ball mill containing the carbon, spherical graphite powder, and expanded graphite, and milling was continued overnight. The resulting carbon paste was screenprinted in a single printing using a plastic mesh onto a sintered porous zirconia spacer upper layer, itself part of a conducting glass carrying a sintered-on layer of nanocrystalline titania (15 micrometers thick) covered by the porous sintered zirconia layer and appropriate for dye cell fabrication for cell areas in excess of 10 sq. cm. The wet thickness of the carbon print was 100 micrometers. The carbon print was dried at 150 C for 10 minutes. The print was then sintered in air at 450 C for 30 minutes, giving a sintered thickness of 50 micrometers. In order to achieve the desired conductivity, a second printing of carbon paste, drying and sintering was carried out, and the final sintered carbon thickness was 50 micrometers. Adherence of the carbon layer to the underlying zirconia layer was excellent, there was good integrity of the layer with no flaking off, and there were no cracks or holes. The electrical conductivity of the layer was 10 ohms per square at this thickness. Since the conducting glass used to support the titania layer had a similar conductivity of 10 ohms per square there was good matching of photoanode and counter electrode conductivities, one of the requisites for high dye cell efficiencies. The carbon layer was quite porous and allowed fast transfer of dye and electrolyte printings to the titania layer below. The dye cell, after dye staining of the titania, electrolyte addition and sealing, gave 7% efficiency under one sun illumination of 100 mW per sq. cm.

Preparation of a dye cell carbon cathode in a single printing according to the present invention is described in the following example:

Example 4

Preparation of a Screenprintable Carbon Dye Cell Cathode in a Single Printing

Spherical graphite powder (Timcal, type KS4, 21 gm), carbon furnace black (Cabot, type Vulcan XC72R, 4 gm) and expanded graphite (Timcal, type BNB90, 3 gm) were dry blended in an agate ball mill for 30 minutes. A titania precursor (Dupont, Tyzor™ type AA-75, 30 gm) was stirred with terpineol (Aldrich, 50 gm) containing 10 wt % dissolved ethyl cellulose (Dow, ethocell, type standard industrial 45). This liquid mixture was then added to the ball mill containing the carbon, spherical graphite powder, and expanded graphite, and milling was continued overnight. The resulting carbon paste was screenprinted using a plastic mesh onto a sintered porous zirconia spacer upper layer, itself part of a conducting glass carrying a sintered-on layer of nanocrystalline titania (15 micrometers thick) covered by the porous sintered zirconia layer and appropriate for dye cell fabrication for cell areas in excess of 10 sq. cm. The wet thickness of the carbon print was 100 micrometers. The carbon print was dried at 150 C for 10 minutes. The print was then sintered in air at 450 C for 30 minutes, giving a sintered thickness of 50 micrometers. Adherence of the carbon layer to the underlying zirconia layer was excellent, there was good integrity of the layer with no flaking off, and there were no cracks or holes. The electrical conductivity of the layer was 10 ohms per sq. at this thickness, similar to that of the conductive glass supporting the titania layer and adequate for good dye cell performance. The carbon layer was quite porous and allowed fast transfer of dye and electrolyte printings to the titania layer below. The dye cell, after dye staining of the titania, electrolyte addition and sealing, gave 7% efficiency under one sun illumination of 100 mW per sq. cm.

Preparation of a dye cell catalyzed carbon cathode in a single printing according to the present invention is described in the following example:

Example 5

Preparation of a Screenprintable Catalyzed Carbon Dye Cell Cathode in a Single Printing Spherical graphite powder (Timcal, type KS4, 17 gm), carbon furnace black (Cabot, type Vulcan XC72R, 4 gm), carbon furnace black catalyzed with platinum (Cabot, type Vulcan XC72R containing 1% platinum, 4 gm), and expanded graphite (Timcal, type BNB90, 3 gm) were dry blended in an agate ball mill for 30 minutes. A titania precursor (Dupont, Tyzor™ type AA-75, 80 gm) was stirred with terpineol (Aldrich, 50 gm) that contained 10 wt % dissolved ethyl cellulose (Dow, ethocell, type standard industrial 45). This liquid mixture was then added to the ball mill containing the carbon materials, spherical graphite powder, and expanded graphite, and milling was continued overnight. The resulting carbon paste was screenprinted using a plastic mesh onto a sintered porous zirconia spacer upper layer, itself part of a conducting glass carrying a sintered-on layer of nanocrystalline titania (15 micrometers thick) covered by the porous sintered zirconia layer and appropriate for dye cell fabrication for cell areas in excess of 10 sq. cm. The wet thickness of the carbon print was 100 micrometers. The carbon print was dried at 150 C for 10 minutes. The print was then sintered in air at 450 C for 30 minutes giving a sintered thickness of 50 micrometers. Adherence of the carbon layer to the underlying zirconia layer was excellent, there was good integrity of the layer with no flaking off, and there were no cracks or holes. The electrical conductivity of the layer was 10 ohms per square at this thickness, similar to that of the conductive glass supporting the titania layer and adequate for good dye cell performance. The carbon layer was quite porous and allowed fast transfer of dye and electrolyte printings to the titania layer below. The dye cell, after dye staining of the titania, electrolyte addition and sealing, gave 8% efficiency under one sun illumination of 100 mW per sq. cm.

Another aspect of the present invention enables the use of a lower cost paste based on inexpensive titania powder commercially available in bulk. The paste is readily prepared and is screenprintable over large areas, and may also give acceptable performance in dye cells. The paste includes a mild titania precursor that acts as a sinterable binder, and this mild precursor (or another mild titania precursor) is used also in surface treatments of the conducting glass substrate and the sintered titania paste as an alternative to the inherently problematic titanium tetrachloride.

This aspect of the present invention may specifically relate to a screenprintable titania photoanode composition and paste that may be especially suitable for producing photovoltaic dye cells; to a method of producing a sintered, photoanodic titania layer from such a paste; and/or to a titania precursor treatment method for treating a surface of, or associated with, a photoanode.

It is known to synthesize titania via a sol-gel route. This route may not provide a screenprintable titania paste that is low cost or readily available. Attempts to prepare a photoanode from commercially available bulk titania powders such as P90 of Degussa, have not proved particularly successful when the material is sintered alone, and non-adherent layers or low-performance cells may result. The Degussa product, which is cheap and readily available, being prepared in vast quantities by simple pyrolysis of a low cost chloride precursor of titania, is well chosen in principle, since it mainly consists of the anatase phase that is much preferred for high-performance dye cells. Additionally, this commercially available bulk titania powder has a high surface area of about 90 square meters per gram, and a mean primary particle size of 14-15 nm, both of which are in the optimal range for performance purposes. There are to be expected some performance improvements over the other applicable commercially available titania powder product of Degussa, known as P25, which contains only 75% of the anatase phase, by weight, the balance being the less active rutile phase. Compared with the P90 product, the P25 material is characterized by a coarser primary particle size (21 nm), and by a lower surface area (50 square meters per gram).

It should be understood, however, that the choice of this Degussa material is in no way limiting, and other titania powders from different manufacturers having similar properties may also be used. We have found a significant improvement in performance when the P90 material is prepared as a paste with a dedicated titania precursor as a binder, preferably together with a non-ionic surfactant and a heat fugitive pore-former, followed by screenprinting, drying and sintering.

We have further discovered that many precursors that oxidize acceptably to titania on sintering in air, for example, various titanium alkoxides, are unsuitable for paste formulation, because they fume strongly in air and are difficult to work with. A non-limiting example of a benign, suitable precursor is the family of organic titanates supplied by DuPont under the trade name Tyzor®. These organic titanates are available in the form of organic titanium chelates, aqueous titanium chelates, and ortho titanate esters. These may contain about 15-25 wt % of titania equivalent, and oxidation to titania is usually complete on heating in air at above 300 C for 30 minutes. We have found particularly useful for photoanode pastes, the Tyzor® grade AA-105, which is based on a titanium chelate. However, we have found other types and grades of Tyzor® to be suitable for use in, or in conjunction with, the present invention.

Without wishing to be limited by theory, the improvement in performance is thought to be the result of better particle-to-particle contact, interconnection and continuity of the titania particles (as in the P90 powder) in a sufficiently porous, adherent, crack-free layer achieved on sintering with the organic, non-fuming titanate, as compared with sintering of the titania alone. We believe that the organic, non-fuming titanates may decompose in-situ in the paste to provide new titania centers that can effectively bond, bridge and coat the bulk titania particles, thereby improving the dye coverage and the photovoltaic efficacy of the dye cell. The use of a titania precursor like those of the Tyzor® series is intrinsically advantageous over binders that are not titania precursors: such titania precursors, upon sintering, form titania in additional to the bulk titania particles, and the organic moieties leave the solid phase without leaving contaminants or organic fingerprints of any kind. The use of other binding materials may contaminate the cell or interfere with the semi-conducting properties of the layer of bulk titania particles. Residual material from such other binding materials may even be attacked or corroded by the cell electrolyte and contaminate the cell.

The titania powder, titania precursor, non-ionic surfactant, and the heat fugitive pore former components may be conveniently dispersed in a printing vehicle such as terpineol, ethyl hexanol, dibutylphthalate, or various other organic solvents, to provide a screenprintable paste. The presence of one or more ionic surfactants has been found to be advantageous. We have found particularly useful acetyl acetone, which, as well as acting as a non-ionic surfactant, is also a chelating agent, and can modify the surface of the titania particles, thereby enhancing their sinterability, whilst for the heat fugitive thickening agent and pore former we have found ethyl cellulose to be suitable.

Regarding the treatment of conducting glass and the sintered titania layer with a titania precursor, we have found organic titanates such as the commercially available Tyzor® materials much more convenient and less hazardous to work with than titanium tetrachloride. In the preparation of photoanodes, we have found particularly useful in this respect, titanium chelates such as Tyzor® grade AA-75. However, other types of organic titanates have been found to be suitable. As an alternative to dip coating of the conductive glass substrate or sintered titania layer in Tyzor® compositions (if required, diluted with the respective thinner recommended by the manufacturer), the organic titanates can also be applied in a screenprinting composition based on a printing vehicle such as terpineol, optionally thickened with a heat fugitive thickening agent and pore former such as ethyl cellulose.

We have further discovered that improved cell performance can be achieved by treating the bare conducting glass photoanode substrate, with a non-fuming organic titanate that is a titania precursor, such as those described herein. The conducting glass photoanode substrate may first be immersed in, or otherwise intimately contacted with, a liquid containing the non-fuming organic titanate. The substrate may then be rinsed prior to applying the titania paste, e.g., by screenprinting.

This treatment method is thought to provide blocking off or passivation of the exposed conductive glass surface and to reduce charge carrier recombination, and also enables improved bonding to the subsequently applied photoactive titania layer. Without wishing to be bound by theory, we believe that the non-fuming organic titanate becomes chemically attached to the substrate.

We have further discovered that improved cell performance can be achieved by treating the sintered titania photoanode layer with a non-fuming organic titanate that is a titania precursor, such as those described herein. The sintered titania photoanode layer on the conducting glass photoanode substrate may be immersed in, or otherwise intimately contacted with, a liquid containing the non-fuming organic titanate. The wetted titania photoanode layer may then be resintered to produce a sintered titania photoanode layer having improved mechanical strength and improved electrical conductivity between adjacent titania particles in the photoanode layer.

As used herein in the specification and in the claims section that follows, the term "precursor", with respect to "titania", refers to a titanium-containing compound, which, upon heating above at least 300 C, reacts to produce titania. The term "organic", with respect to a titania precursor, is specifically meant to exclude titanium tetrachloride.

As used herein in the specification and in the claims section that follows, the term "non-fuming titania precursor", with respect to a titania precursor, refers to a titania precursor that does not fume in air at 25° C.

As used herein in the specification and in the claims section that follows, the terms "titania" and "titanium dioxide" are used interchangeably.

As used herein in the specification and in the claims section that follows, the term "titania powder", refers to a powder containing at least 98% titania. Typically, titania powders used in conjunction with the present invention contain at least 99% titania, or even at least 99.5% titania.

At least 60% of the titania in the titania powders used in conjunction with the present invention may be in the anatase phase. Typically, these titania powders contain at least 70% titania of the anatase phase. For high-performance dye cells utilizing the pastes and methods of the present invention, at least 80% of the titania in the titania powders used in conjunction with the present invention may be in the anatase phase, and preferably, at least 90% or at least 95% may be in the anatase phase.

An exemplary preparation of a screenprintable titania photoanode paste incorporating a titania powder and an organic titania precursor according to the present invention, is described hereinbelow. Also described are treatments of the photoanode with an organic titania precursor and the resulting effect on the performance of the dye cell.

Example 6

Preparation of an Inventive Titania Photoanode Paste and Construction of a Dye Cell Therewith A titania precursor (Dupont, Tyzor® type AA-105, 20 gm) from the family of organic titanates (a titanium acetylacetonate) was stirred into a solution of screenprinting vehicle terpineol (Aldrich, 80 cc) containing dissolved thickener ethyl cellulose (Dow, Ethocel™, 2.5 wt %) to give Component I. The non-ionic surfactant acetyl acetone (Aldrich, 4 cc) was mixed with the solvent isopropyl alcohol (Aldrich, 5 cc) to give Component II. Component II was then mixed into Component I. To this mixture, commercial titania powder (Degussa, type VP $TiO_2$ P90, 50 gm) was stirred in, and the slurry was then ball-milled overnight in an agate ball mill. The resulting titania paste was screenprinted onto an FTO glass (in order to provide a dye cell photoanode) by means of three printings, each printing followed by drying at 130 C for 30 minutes, and finally the printed layer was sintered at 450 C in air for 30 minutes. The titania layer had a sintered thickness of 15 microns and was homogeneous, adherent and crack-free. SEM work confirmed that the titania crystallites in the layer were sized around 14 nm, thus proceeding from the P90 titania material, which has a mean primary particle size of 14-15 nm, as described hereinabove. Furthermore, elemental analysis of the titania, carried out by dissolution of a portion of a sample of the layer in acid and using ICP spectroscopy, confirmed an iron content of 7.0 ppm, matching closely the iron content of the P90 titania batch used for the paste preparation. This analysis methodology may be used as a fingerprint check of the source of the titania in a dye cell.

The sintered titania layer was coated with ruthenium dye sensitizer (Solaronix SA, type Ruthenium 535-bis TBA) by absorption from an alcoholic solution, and a dye test cell of active area 1.9 sq. cm was assembled with a platinum-catalyzed FTO glass as the counterelectrode and using a DuPont Surlyn™ polymer gasket to seal the cell edges. Nitrile-based electrolyte containing dissolved iodine (Solaronix SA, type AN-50) was introduced into the cell by vacuum filling via holes previously drilled in the counter-electrode glass, and these holes were then sealed off using Surlyn™ polymer. Current takeoff from the cell was achieved by means of photoanode and counterelectrode FTO surfaces projecting from the cell that were coated with conductive silver paint.

Example 7

Performance of the Dye Cell Construction of Example 6

Three cells were built according to the method described in Example 1 and performance was tested in a solar simulator providing one sun illumination (100 mW per sq. cm). The averaged performance results for the three cells were:
open circuit voltage: 704 mV;
short circuit current: 15.3 mA per sq. cm;
fill factor: 59.4%;
solar-to-electricity conversion efficiency: 6.27%.

Further testing and comparative control experiments confirmed the promising performance of the low-cost, screen-printable titania-powder based paste of the present invention. When a paste was attempted without including a non-fuming organic titanate such as a titanium acetonate (e.g., a commercially available titanium acetylacetonate such as Tyzor® type AA-105, Tyzor® type AA-75), a titanium acetoacetate such as titanium ethyl acetoacetate (Tyzor® PITA), or acetyl acetone, there was insufficient adhesion following sintering. Cells that were assembled exhibited conversion efficiencies below 3%. When expensive specialty pastes of sol-gel titania (via the hydrothermal route of the prior art) were used, there was only a moderate gain in efficiency to 7%.

A further test was made to check the effect of the two treatments using titanium chloride according to the literature referred to previously, as compared with treatments using a member of the Tyzor® family of materials:

Example 8

Additional Treatments with Titanium Tetrachloride Solution

In a comparative test run, conductive glass photoanode substrates were first immersed for 30 minutes in a 40 mM aqueous titanium tetrachloride solution at 50 C, rinsed and dried. Following screenprinting of the inventive titania paste and sintering in the usual way, the photoanodes were again immersed for 30 minutes in the 40 mM aqueous titanium chloride solution at 50 C and then sintered (i.e., resintered) at 450 C for 30 minutes. Cell efficiencies under one sun illumination increased to 6.8% (as compared to 6.27% without the titanium tetrachloride treatment, as reported in Example 2).

Preparation of the immersion solution was hazardous and unpleasant as the source material for the titanium tetrachloride solution (anhydrous titanium tetrachloride) is very corrosive and gave off acidic fumes in air.

Example 9

Additional Treatments with an Organic Titanate Solution

Instead of using a titanium tetrachloride immersion solution, a relatively benign, non-fuming titanium acetylacetonate (DuPont Tyzor® AA-75) was used, diluted 50 times with isopropyl alcohol. After the two treatments of the photoanode were carried out, as in Example 3, a similar cell efficiency increase to 6.75% was obtained.

Thus, the results demonstrate that the solar-to-electricity conversion efficiencies obtained using non-fuming organic titanate treatments are quite similar to the efficiencies obtained using titanium tetrachloride treatments.

Another aspect of the present invention relates to a counter-electrode for broad, large-area, single dye cells of typically 15 cm per side, and an inventive photovoltaic cell structure incorporating such a counter-electrode. We have found that when broad, single cell assemblies of this type are attempted with the usual carbon-based compositions of the prior art counter-electrode (as exemplified by the above-referenced patent to Kay, which uses titania powder as binder to bond the carbon layer), there emerges, in addition to the expected current takeoff limitation with cell widths much above 1 cm, an additional problem resulting from the rather fragile nature of the carbon layer. It is very difficult to embed, even partially, a current-collecting structure such as a metal mesh, a metal foil or metal wires in a broad area carbon layer, without causing the entire structure to delaminate. This is principally due to the non-elastic nature of inorganic binders such as titania used to bond the carbon layer. More flexible organic type binders are generally unsuitable for this application because of the high sintering temperature of 450 C needed for both anode and cathode layers in the cell. The high sintering temperature may destroy organic binders and possibly contaminate the cell with organic decomposition residues. Furthermore, many metals are corroded by the cell electrolyte under the dye cell working conditions and thus appear unsuitable for use in the counter-electrode as current collectors. In the dye-cell technology taught by Kay, these issues do not arise because of the narrow width of the strip cells. In such narrow cells:
the sintered-on carbon layer may display adequate mechanical stability, and
the carbon layer alone may convey current, without the need for a supplemental current collector.

The cell structure of the present invention may include a graphite foil, in combination with a corrosion-resistant metal or metal alloy current takeoff element at least partly embedded in the graphite foil, which structure is conductively bonded to, or in direct electrical conductive contact with, an underlying cathode carbon layer. This structure is acceptably robust and enables a large area, broad cell construction, while simultaneously eliminating the need for a second layer of conducting glass in the dye cell or a second, physically separate counter-electrode. The corrosion-resistant current takeoff element embedded in the graphite foil may be selected from various geometries including a foil, mesh, strips or wires of a number of metals or alloys such as titanium, titanium-clad copper, tungsten, a higher alloy of iron and chromium, or a higher alloy of iron, chromium and molybdenum.

In another preferred embodiment, the corrosion-resistant metal or metal alloy current takeoff element may be used as a standalone counter-electrode in the cell, without the need for combination with a carbon or graphite foil layer, and in such a case, the counter-electrode is catalyzed directly with trace platinum.

Figure 11:
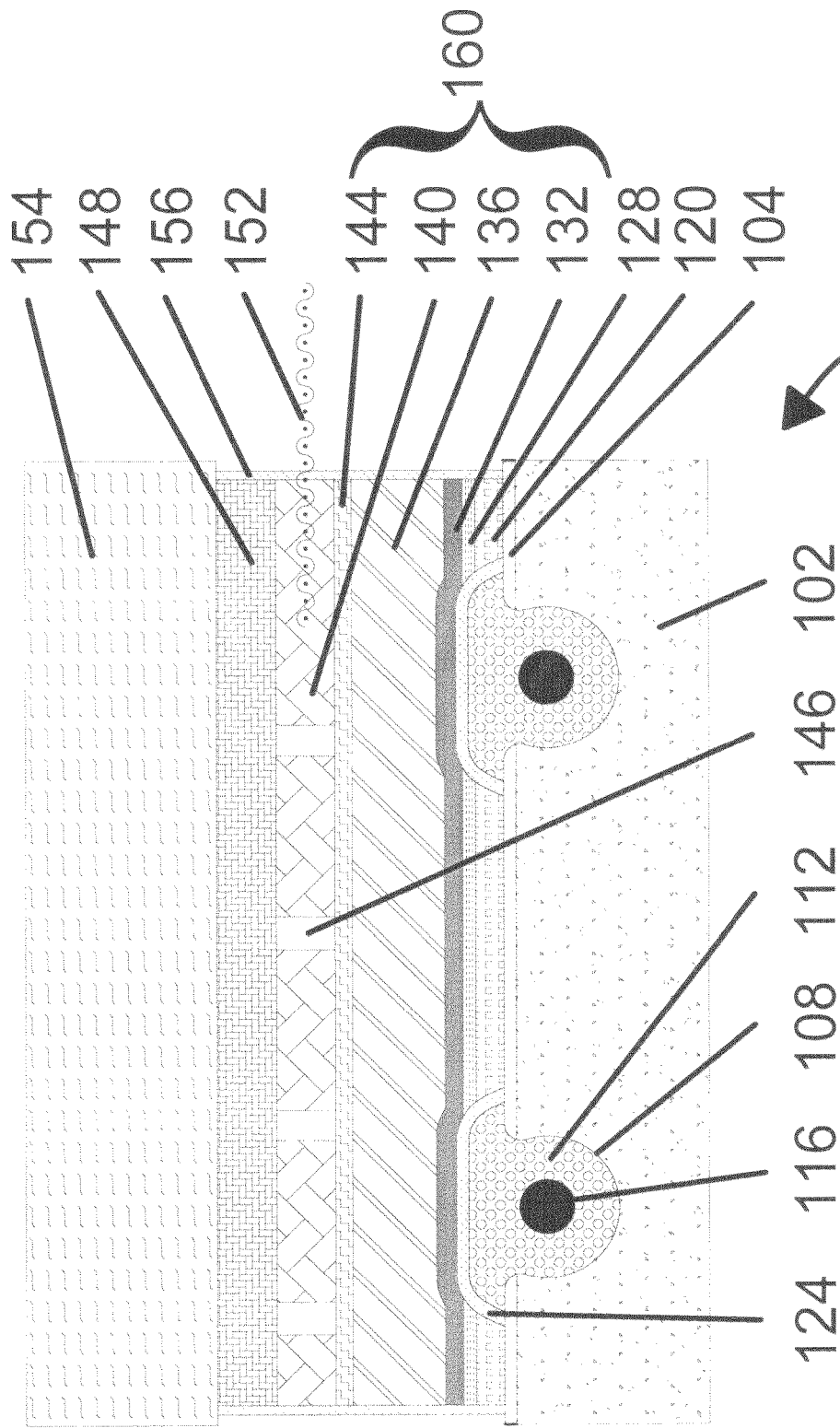
FIG. 11 is a schematic cross-sectional view of an "open-faced" photovoltaic dye cell, according to one preferred embodiment of the present invention.

A schematic cross-sectional view of one embodiment of an inventive photovoltaic dye cell 100, which may be of an "open-faced" sandwich design, is shown in FIG. 11. Onto a support glass such as a conventional anode support glass 102 (of typical thickness 1 mm-3 mm), a thin, transparent conducting surface layer 104 is disposed, the layer based, for example, on tin oxide. Support glass 102 and conducting surface layer 104 may be provided with electrical conductivity enhancing features (e.g., as described in above-referenced U.S. Patent Application Publication No. 20050072458, which is incorporated by reference for all purposes as if fully disclosed herein). Support glass 102 is used as the substrate and basic building block for the dye cell. The substrate is grooved and fitted with wire current take-off means as taught in the above-referenced patent publication. Thus, wires pass sealably out of the cell through the side of the cell, and are braided together and/or connected, for example, by welding, to a current collecting strip (not shown), so as to form the cell anode terminal. In each groove 108 there is applied an inert, electrically conducting binder composition 112 that bonds a wire 116 into the groove and makes good bridging electrical contact with the tin oxide layer on each side of the groove. As an example, a titanium, tungsten, or higher alloy wire may be inserted into the groove. The conducting binder, which preferably includes a conductor such as titanium nitride and a binder such as alumina, is also added into the groove. Onto the tin oxide surface is applied a nanocrystalline titania layer, typically by screen-printing from a paste, followed by drying and sintering.

Porous, sintered nanocrystalline titania film or layer 120 is designed to have a typical thickness of about 15 micrometers. Titania film or layer 120 may include several sublayers of titania, each of which may be individually screen-printed and sintered. We have found that covering the upper surface of the conducting binder 112 with an insulating layer 124 prior to the application of the nanocrystalline titania layer, may help to eliminate possible short circuits developing between the anode and the cathode. Insulating layer 124 may be especially important for cells in which the conducting binder surface is appreciably above the level of sintered titania layer 120, as depicted in FIG. 11.

Insulating layer 124 may be selected from a glaze or a binder composition containing fairly coarse titania, zirconia, alumina or silica particles preferably having a characteristic particle size on the order of several micrometers, or alternatively, from a high temperature polymer such as polyimide or silicone. Titania layer 120 may then be covered with a screen-printed, porous, insulating spacer layer from a paste containing relatively coarse titania, zirconia silica or alumina particles. The screen-printed spacer layer is designed to yield a sintered insulating spacer layer 128 having a thickness of about 5 micrometers. Sintered insulating spacer layer 128 also acts as a light scattering layer, directing light back to sintered nanocrystalline titania layer 120.

Cell construction continues with application of the counter-electrode layers, initially by screen-printing. Spacer layer 128 may be narrow, typically on the order of 2-10 micrometers, to ensure a very small anode/cathode separation in the cell, a low ohmic resistance, and high cell fill factor, all of which contribute to increased cell performance. Onto insulating spacer layer 128 may be applied a thin porous layer of carbon, optionally catalyzed with a trace amount of platinum or a platinum catalyst substitute via a screen-printable paste containing an inert binder. This thin layer is dried and sintered to produce a sintered, porous, catalytic carbon layer 132, which has a characteristic thickness of only a few micrometers.

The sintering of the screen-printable, porous, catalytic carbon paste layer is followed by the application of a relatively thick layer of porous, conducting carbon via a screen-printable carbon paste containing an inert binder. Another sintering step is performed, producing a sintered, porous, conducting carbon layer 136. The screen-printing of the carbon paste is typically designed such that the thickness of sintered, conducting carbon layer 136 is typically about 50-100 micrometers.

Conducting carbon layer 136 may be sufficiently active for the iodine redox reaction in the cell such that the need for a separate catalytic layer such as catalytic carbon layer 132 may be obviated.

In a preferred embodiment, the various layers may be sintered, if possible in a single sintering step at 450° C., and following partial cooling, a sensitizer dye is introduced into titania layer 120 via porous carbon layer 136. A sheet of graphite foil 140 having a prepared, sintered-on, porous, conducting carbon (and chemically inert) binder layer 144 disposed thereunder may be laid onto carbon layer 136 so as to be in good conductive contact therewith.

Porous carbon layer 136, graphite foil 140 (including binder layer 144), and optionally, catalytic layer 132 may form a cathode or counter-electrode 160 of cell 100.

At least partially embedded into the graphite foil may be a corrosion-resistant metal or metal alloy current collector 152 in the form of a wire, mesh, strip, perforated strip or foil that protrudes through the peripheral cell seal (described hereinbelow) to act as a counter-electrode terminal of the cell. We have found that under normal cell operating conditions, titanium, titanium-clad copper, and tungsten, and some higher alloys principally consisting of chromium and iron, or chromium, iron and molybdenum, may serve as chemically stable counter-electrode current collecting materials.

Graphite foil 140 may advantageously be equipped with one or more perforations 146 to facilitate electrolyte distribution into the cell during a subsequent filling operation.

A sheet 154 may be laid on top of the assembly to close the cell. Sheet 154 may be made of inexpensive window glass or various metals or alloys. Underneath sheet 154, and on top of graphite foil 140, may advantageously be disposed an elastic sheet 148, preferably including or consisting of foam, fiber mat or elastomer mat or a swelling precursor material or swelling polymeric material. Elastic sheet 148, which may include a polymeric, carbon or metallic material, is compressible and spring-like, to help maintain a fairly uniform pressure between graphite foil 140 and carbon layer 136 while ensuring sufficient electrical contact over the large requisite area, without delaminating layer 136.

The edges of cell 100 may be sealed by a peripheral seal 156, e.g., using a liquid-phase sealant. Electrolyte may then be introduced into cell 100, typically by vacuum means via a hole (not shown) in sheet 154, and the hole may be sealed using a sealing composition. The cell is then ready for testing/modulizing.

Figure 12:
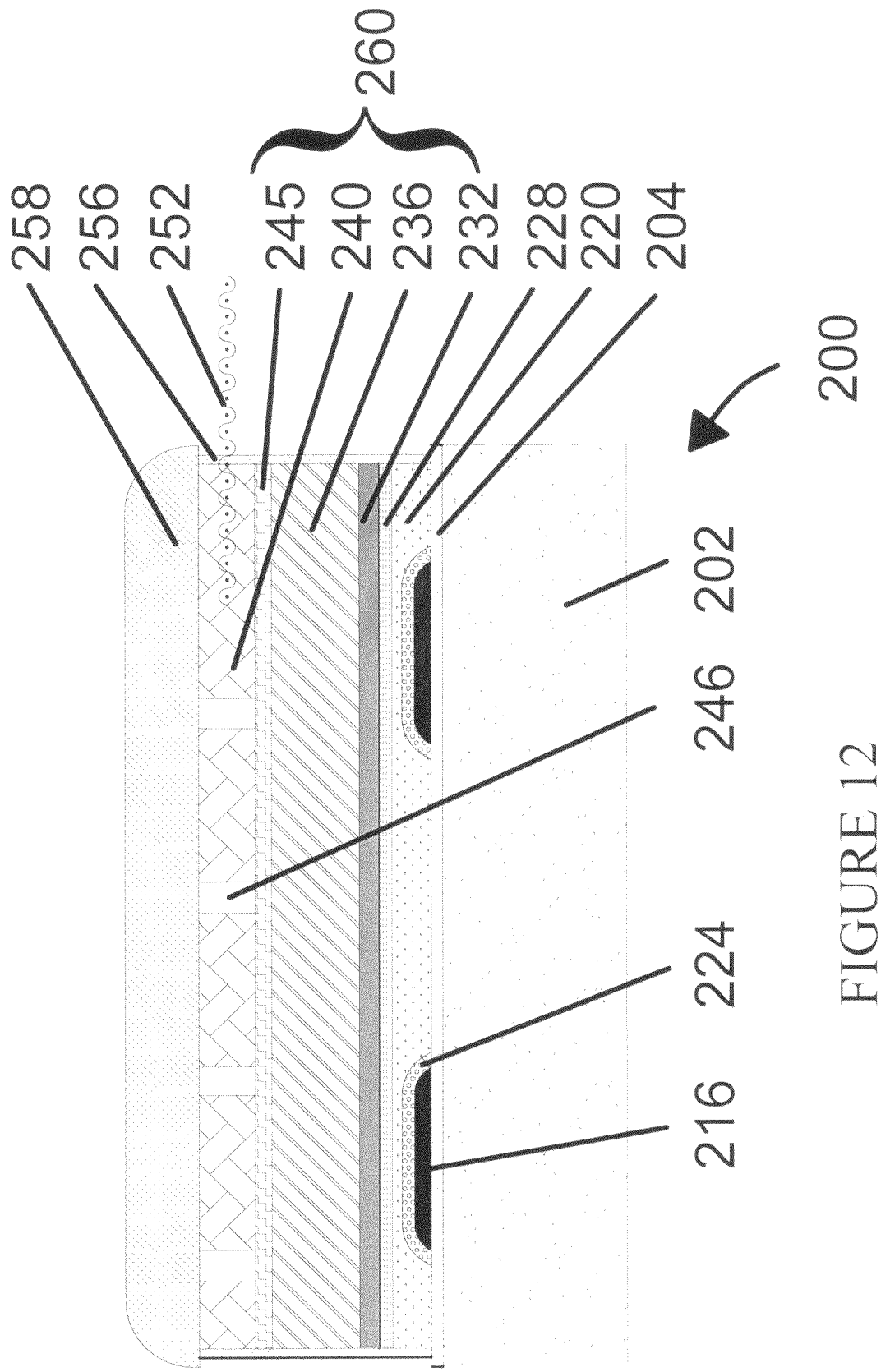
FIG. 12 provides a schematic cross-sectional view of a dye cell according to another preferred embodiment of the invention.

A schematic cross-sectional view of a photovoltaic dye cell 200 according to another preferred embodiment of the invention, is shown in FIG. 12. On a support glass such as a conventional anode support glass 202 (of typical thickness 1 mm-3 mm), a thin, transparent conducting surface layer 204 is disposed, the layer based, for example, on tin oxide. Support glass 202, which may be provided with electrical conductivity enhancing features, serves as the substrate and basic building block of dye cell 200. Disposed on conducting surface layer 204 is a set of spaced, preferably substantially parallel strips 216 of a metal or alloy inert to the cell electrolyte and to charge carrier recombination. Strips 216, which may be deposited by means of electroplating, provide current take-off means for cell 200. Strips 216 may pass sealably through the side of cell 200, and may be electrically connected together, e.g., by a current collecting strip (not shown) outside of the seal, thereby forming the anode terminal of the cell. Substantially as described hereinabove with respect to the filled grooves provided in FIG. 11, the plated strips may be also advantageously coated with an insulating layer 228, for example, including a glaze or a binder composition of titania, zirconia, alumina and/or silica, to prevent anode/cathode short-circuiting. Onto conducting surface layer 204 is applied a nanocrystalline titania layer, typically by screen-printing from a paste, drying and sintering.

Porous, sintered nanocrystalline titania film or layer 220 is designed to have a typical thickness of about 15 micrometers. Titania film or layer 220 may include several sublayers of titania, each of which may be individually screen-printed and sintered.

Titania layer 220 is then covered with a screen-printed, porous, insulating spacer layer, which undergoes sintering to produce a sintered insulating spacer layer 228. The screen-printed paste may contain relatively coarse titania, zirconia, silica, and/or alumina particles. After drying and sintering, sintered insulating spacer layer 228 may have a thickness of about 2-10 micrometers. This thickness is designed to ensure a very small anode/cathode separation in the cell. This thickness is further designed to achieve a low internal resistance and a high cell fill factor, thereby raising cell performance. Spacer layer 228 also acts as a light back-scattering layer, directing light back to sintered titania layer 220.

On insulating spacer layer 228 is disposed a cathode or counter-electrode 260 of cell 200. Cathode 260 includes a sintered, porous, catalytic conducting carbon layer 232, which may contain a binder that is chemically inert to the constituents of cell 200, and which may be catalyzed with a trace amount of platinum or of a platinum catalyst substitute. Carbon layer 232 may be produced by screen-printing or otherwise applying a thin layer of porous, catalytic carbon paste, after which the layer is dried and sintered. Sintered, porous, conducting carbon layer 232 may have a thickness of several micrometers, typically less than about 10 micrometers. Disposed above catalytic carbon layer 232 is a relatively thick, sintered, conducting carbon layer 236, which may also form a part of cathode 260. Carbon layer 236 may be produced by screen-printing, after which the layer is dried and sintered to achieve a typical thickness of 50-100 micrometers.

Some high surface area carbons and graphites are so active for the iodine redox reaction in the cell that the need for a separate catalytic or platinized layer 228 may be obviated.

In a preferred embodiment, the various layers are sintered, typically or preferably in a single sintering step at 450 C, and following partial cooling, a sensitizer dye is introduced into titania layer 220 via porous carbon layer 236. A sheet of graphite foil 240 is then conductively bonded to carbon layer 236 via a conducting carbon adhesive layer 245, which may be selected to be curable at a temperature below 120 C, thereby avoiding any damage to heat-sensitive dyes in titania layer 220. Suitable components for adhesive layer 245 may include carbon powder and either an inert (with respect to the electrolyte) inorganic binder based on alumina, or an inert (with respect to the electrolyte) organic binder based on silicone or polyimide, for example.

Both graphite foil 240 and conducting carbon adhesive layer 245 may be considered to form a part of cathode 260.

Into graphite foil 240 is embedded, at least partially, a corrosion-resistant metal or metal alloy current collector 252 in the form of a wire, mesh, strip, perforated strip or foil that passes out through the peripheral cell seal (described below) to act as the counter-electrode terminal of cell 200. We have found that titanium, titanium-clad copper, and tungsten, or some higher alloys principally consisting of chromium and iron, or chromium, iron and molybdenum, may serve as chemically stable counter-electrode current collecting materials. Graphite foil 240 may advantageously have perforations 246 in order to facilitate electrolyte distribution into the cell. The electrolyte-filling step may be carried out at this stage.

The cell is structurally completed by laying down a sheet of plastic laminated foil 258 and applying a peripheral sealant 252 between elements 202 and 258 of the cell, or alternatively a polymer sealing layer may be sprayed on to initially seal the cell, and additional sealing provided using an outer metal foil (not shown). However, if a lightweight construction is not particularly crucial, window glass or metal/alloy sheet can be used to close the cell, and in the latter case, current collector 252 may be dispensed with.

As developed hereinabove, large area, broad dye cells having physically separated anode and counter-electrodes may suffer from variously characteristic performance limitations. Reducing or eliminating this physical separation is one motivation behind the open-faced sandwich design provided in FIGS. 11 and 12, in which all the active layers are bonded onto a single (conductive) glass sheet. In broad cells of industrial applicability, and particularly in cells using non-volatile electrolytes, inter-electrode spacing tends to be at least 50-100 micrometers, at which point ohmic losses from the cell electrolyte become excessive. Similarly, temperature changes between day and night may cause expansion/contraction variations in interelectrode spacing, which may lead to current irregularities and to stressing of seals.

In a preferred embodiment, however, we disclose a photovoltaic dye cell having a bi-plate design that may overcome these limitations.

While various sandwich structures, in which a carbon layer is printed on top of a zirconia spacer layer on top of a titania layer, may allow close spacing of carbon and titania surfaces, it must be emphasized that such structures may be extremely prone to penetration of the carbon printing layer to the conducting glass surface, via any holes or defects in the printed layers of titania or spacer. The penetration of the carbon printing layer to the conducting surface of the FTO glass effects short-circuiting of the cell, thereby reducing or limiting cell performance. This problem is particularly acute in view of the at least 7-10 year lifetime often required for cells to attain commercial viability. The inventive biplate construction, as described herein, avoids this significant and potentially critical problem, because the carbon counterelectrode is not sintered (i.e., chemically bonded at high temperature) to the printed layer(s) of titania or spacer. Rather, the carbon counterelectrode is a distinct and separate entity that lies on top of, and may physically contact, the spacer layer, or the upper surface of the titania layer, but is not chemically bonded thereto, as in printed carbon layer technologies.

Figure 13A:
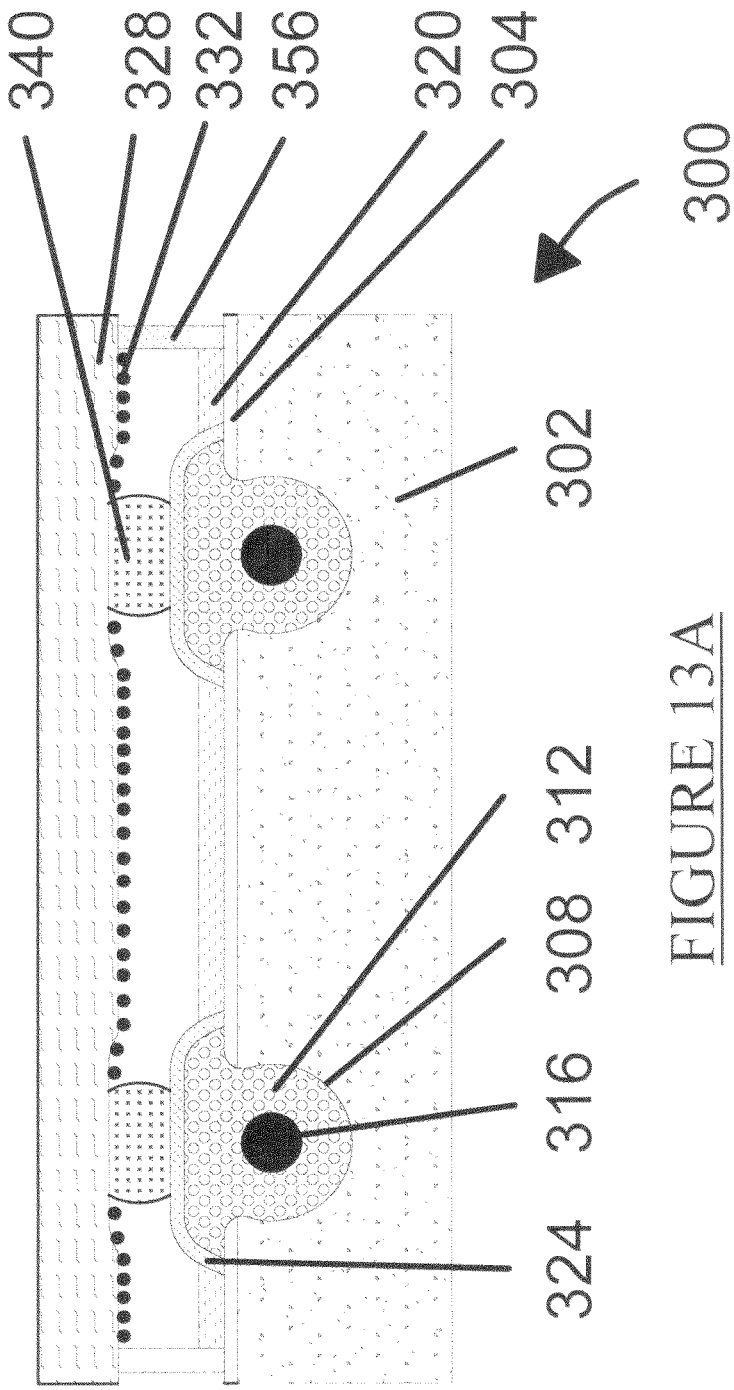
FIG. 13A provides a schematic cross-sectional view of an inventive photovoltaic dye cell having a bi-plate structure.

A schematic cross-sectional view of one embodiment of such an inventive photovoltaic dye cell 300 is provided in FIG. 13A. An anode glass 302 of typical thickness 1 mm-3 mm has a thin, transparent conducting surface layer 304 based on a conductive material such as tin oxide. Anode glass 302 and conducting surface layer 304 may be provided with electrical conductivity enhancing features. The conductive glass is grooved and fitted with wire current take-off means substantially as described hereinabove. Thus, wires pass sealably out of the cell at the side of the cell and are braided together and/or connected, for example, by welding, to a current collecting strip (not shown), to form an anode terminal of cell 300. In each groove 308 there is applied an electrically-conducting binder layer 312, which is preferably chemically inert to the cell electrolyte and serves to bond a wire 316 into groove 308 while making good bridging electrical contact with the tin oxide layer (conducting surface layer 304) on each side of groove 308. As an example, a titanium, tungsten, or higher alloy wire may be inserted into groove 308 and a conducting binder, which preferably includes a conductor such as titanium nitride and a binder such as alumina, is also added into groove 308.

In constructing cell 300, an upper surface of conducting binder layer 312 may be covered with an insulating layer 324 prior to the application of the nanocrystalline titania layer, to prevent short-circuits developing between the anode and the cathode. This is especially important when the surface of conducting binder layer 312 is appreciably above the level of a sintered nanocrystalline titania layer 320, as depicted in FIG. 13A.

Insulating layer 324 may be selected from a glaze or a binder composition containing fairly coarse titania, zirconia, alumina or silica particles having a characteristic particle size of several micrometers, or alternatively, from a high temperature polymer such as polyimide or silicone. Onto the tin oxide surface (conducting surface layer 304) is applied a nanocrystalline titania layer, typically by screen-printing a paste, followed by drying and sintering to produce sintered nanocrystalline titania layer 320. This sintered layer is designed to have a typical thickness of about 15 micrometers after the sintering step. Titania layer 320 can be optionally coated with a coarse particle layer (not shown) based on titania, zirconia, alumina or silica, for purposes of electrical insulation and/or light back-scattering. During construction of cell 300, titania layer 320 may then be covered with sensitizer dye, or this step can be carried out later on, before electrolyte filling. The cell is closed off with a corrosion-resistant metal sheet 368 that has been catalyzed conventionally with a catalyst such as trace platinum crystallites 332, and this sheet is sealed at the edges to anode glass 300 by electrolyte-resistant sealant 336. Suitable construction materials for metal sheet 368 may include titanium, titanium-clad copper, tungsten, or higher alloys including principally chromium and iron, or chromium, iron and molybdenum.

Importantly, metal sheet 368 is bonded to the upraised, electrically insulated material of insulating layer 324 by means of a layer of electrolyte-resistant adhesive 340. Suitable adhesives are available, based on silicones or polyimides, for example. Adhesive layer 340 may be placed at periodic spacing intervals along the materials covering grooves 308 to maintain a strong anchoring and uniform spacing between sheet 368 and anode glass 302. A lateral continuous layer of adhesive is operational, but may be disadvantageous, however, as it hydraulically isolates electrolyte between adjacent grooves and makes the filling of cell 300 with electrolyte rather laborious.

Figure 13B:
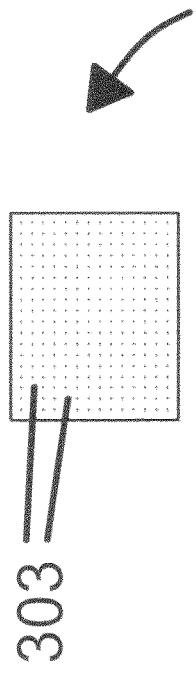
FIG. 13B is a schematic top view of the cell of FIG. 13A, showing the disposition of the anchoring points of the cell.

FIG. 13B shows the placing of the anchoring points in a schematic top view of cell 300, in which each "+" mark 303 represents a spaced location along the grooves in the anode plate where adhesive is placed.

Sheet 368 in FIG. 13A may be grooved in complementary fashion to anode glass 302, in order to accept the upraised profile of insulating layer 324 as required and thereby enable the desirable close approach (a few tens of micrometers only) between the surface of catalyst 332 and the surface of titania layer 320. The cell may be filled with electrolyte via holes (not shown) in metal sheet 368, which holes are then sealed off.

Various alternative embodiments in the building of the two-plate design according to the desired spacing criteria are possible. In FIG. 13A, the anode plate may be fitted with conducting metal strips instead of buried wires. Similarly, the metal sheet based counter-electrode may simply be stamped out to give a groove-like topography. In one preferred embodiment, the counter-electrode may be a suitably catalyzed flat metal sheet from which slits have been punched or cut out, such that the slits fit over the upraised elements situated on the grooves, while simultaneously enabling the catalyzed surface between the slits to attain close proximity to the titania surface below. In such a case, a glass or polymer sheet placed above the slitted plate would be used to close off the cell, and this glass or polymer sheet would be anchored in place at multiple points on the upraised elements.

Figure 14:
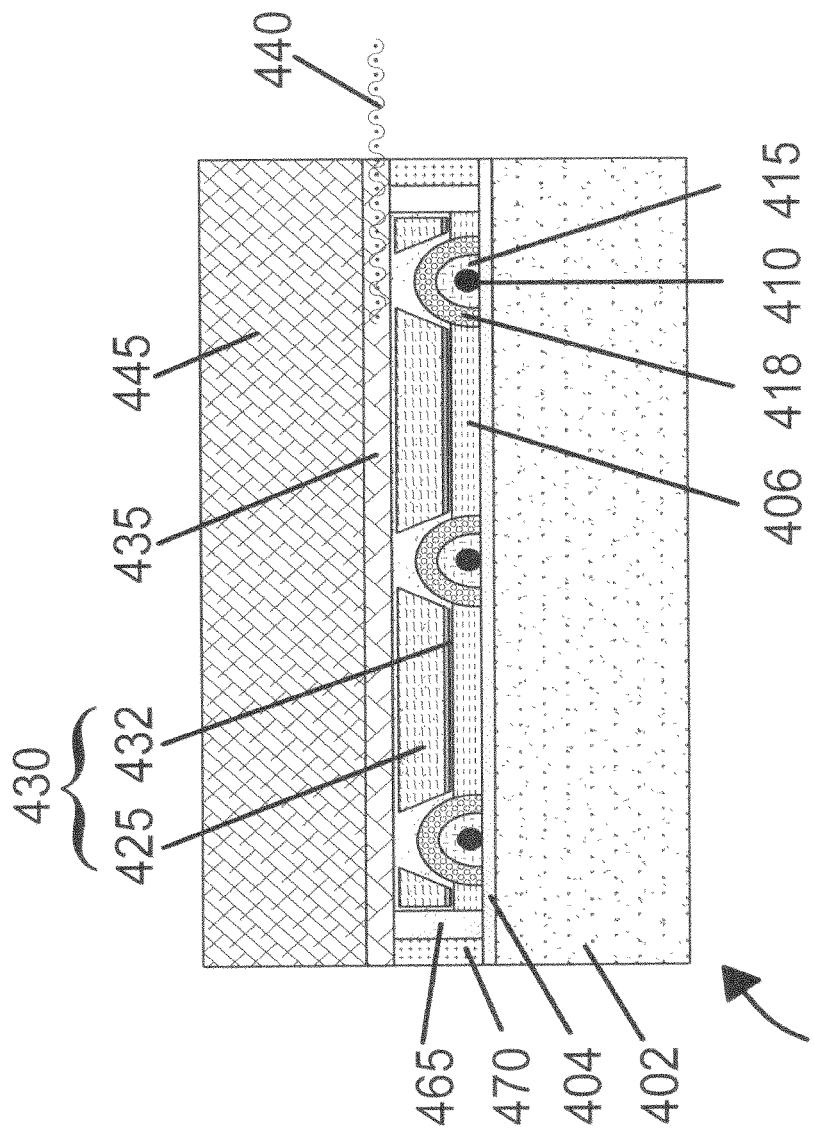
FIG. 14 is a schematic cross-sectional view of a photovoltaic dye cell having a bi-plate structure, according to another preferred embodiment of the present invention.

FIG. 14 provides a schematic cross-sectional view of a bi-plate photovoltaic dye cell 400 according to another embodiment of the present invention. The construction of this biplate cell enables the use of only a single conducting glass sheet per cell. This construction further enables a very close juxtaposition of anode and cathode. A photoanode support glass or substrate 402 coated with a substantially transparent conductor layer 404 may have spaced, preferably parallel wires 410 bonded in place on a surface of the conductive glass (e.g., on top of conductor layer 404) by means of a substantially inert conducting adhesive layer such as a conducting ceramic adhesive layer 415. Between chemically inert current collecting wires 410 and at the edges of cell 400 is a sintered, nanocrystalline, porous titania layer 406, typically 10-15 micrometers thick. Since wires 410 may typically have a diameter of at least 100 micrometers, and the height of titania layer 406 is typically below about 15 micrometers, wires 410 may project above titania layer 406 by over 80 micrometers. To avoid short-circuiting to a counter-electrode 430 of cell 400, ceramic adhesive layer 415 may advantageously be covered with an electrically insulating layer 418, e.g., a layer including zirconia. Electrically insulating layer 418 may typically have a thickness in a range of 20-50 micrometers.

Cell 400 may have two physically discrete electrodes. Thus, a cathode or counter-electrode 430 may be a distinct component that is laid onto the anode element and may be disposed in close proximity thereto. Counter-electrode 430 may advantageously include a porous, conductive cathodic layer 425, e.g., a porous support matrix supporting impregnated carbon. The porous matrix may include or essentially consist of a mat, woven and/or non-woven, foam, or possibly other matrices known in the art. A preferred material for the mat is glass fiber since it is low cost, flexible and conformable to the cell geometry, chemically inert in the cell environment, and may withstand elevated curing or sintering temperatures. Other fibers such as carbon fibers may also be used. The impregnated carbon may be bonded to the porous support matrix by an inert binder, which may be selected from inorganic materials such as alumina, or polymeric materials such as polytetrafluoroethylene (PTFE, or Teflon®).

Counter-electrode 430 may include porous cathodic layer 425 and a catalytic layer 432 (catalytic layer 432 being disposed towards titania layer 406), or a combination thereof. Porous cathodic layer 425 may be disposed within cell 400 as a plurality of strips, each strip having a width enabling the strip to fit between neighboring protrusions of layer 418, or, adjacent to the cell perimeter, between a protrusion of layer 418 and an inner wall of an (inner) edge seal 465.

Current takeoff from cathode or counter-electrode 430 may be effected via a graphite foil 435 laid on (and typically physically discrete with respect to) the strips of porous cathodic layer 425. At its periphery, graphite foil 435 may have an at least partially embedded inert metal mesh or foil 440 that may protrude outside cell 400, to facilitate cathodic current collection.

Dye cell 400 may be produced according to the following inventive method: onto a surface of photoanode support glass 402 having transparent conductor layer 404 (e.g., an electrically conducting, transparent tin oxide layer), are screen-printed strips of titania paste. Upon sintering, spaced-apart strips of sintered, porous titania layer 406 are produced. In each gap between adjacent titania strips is situated a current collecting wire 410. A chemically inert, electrically conducting ceramic paste may be printed around wire 410. On top of the ceramic material may be printed an electrically insulating paste. A sintering operation causes ceramic adhesive layer 415 to be chemically bonded to transparent conductor layer 404. Sintering s electrically insulating layer 418 to be chemically bonded to ceramic adhesive layer 415.

At this point the titania strips may be stained with dye.

The counter-electrode of cell 400 includes strips of porous, conductive layer 425, which are laid on to the strips of titania layer 406. These strips may advantageously include glass fiber mats impregnated with electrically conducting carbon paste, which have undergone sintering. Strips of conductive layer 425 may be advantageously catalyzed by means of catalytic layer 432, which may include trace platinum catalyst (or other catalyst materials such as carbon-based catalyst materials) on a surface thereof. These strips may be directly laid on sintered titania layer 406 of the photoanode, with catalytic layer 432 being disposed towards titania layer 406. Despite this direct contact, we have found that no further insulation of titania from the carbon in the carbon-impregnated strips is necessary.

Current takeoff is advantageously accomplished via a graphite foil 435 laid on the strips of conductive layer 425. Graphite foil 435 has an embedded inert metal mesh or foil 440 at a periphery thereof, which can pass sealably out of the cell. Cell 400 is sealed by means of a cover typically a glass cover such as window glass cover 445 in conjunction with an inner edge seal 465 and an outer edge seal 470, preferably produced by means of two sequentially applied polymers. Glass cover 445 applies adequate pressure to the graphite foil underneath to ensure good electrical contact and close interspacing of the elements in the cell. Electrolyte addition to the cell may be by means of fill holes in the window glass (not shown) which holes are later sealed off by polymer. Cathode current withdrawal from the cell is via a takeoff terminal 442 outside the walls of cell 400, formed by a sealable protrusion of metal mesh or foil 440 through the cell wall, e.g., through edge seals 465 and 470. Individual wires, emerging sealably from the photoanode via edge seals 465 and 470, can be welded to a current collecting strip (not shown) to form the photoanode current collector.

In a solar module, individual cells may be electrically connected and suitably mounted in a support structure.

It is evident from the above that cathode 430 forms a discrete, physically separate layer with respect to porous titania film 406 of the anode. Cathode 430 is also adapted to display a measure of compressibility and elasticity. In sharp contrast to the substantially unyielding cathodes of the prior art, which, to prevent damage, must be held at a distance from the surface of the fragile porous titania film of the anode, cathode 430 (and in particular, strips of conductive layer 425) may be held against the surface of porous titania film 406, and may absorb moderate pressures normal to porous titania film 406, so as to protect titania film 406. Moreover, the bottommost surface of cathode 430 may adapt or conform to a contour of titania film 406, such that the significant ohmic inefficiency characterizing various prior art dye cells is appreciably reduced.

In order to strips of attain the requisite degree of conformability, strips of conductive layer 425 may have a Shore D hardness below 90. In some cases, strips of conductive layer 425 may have a Shore D hardness below 80, or below 70.

Figure 15:
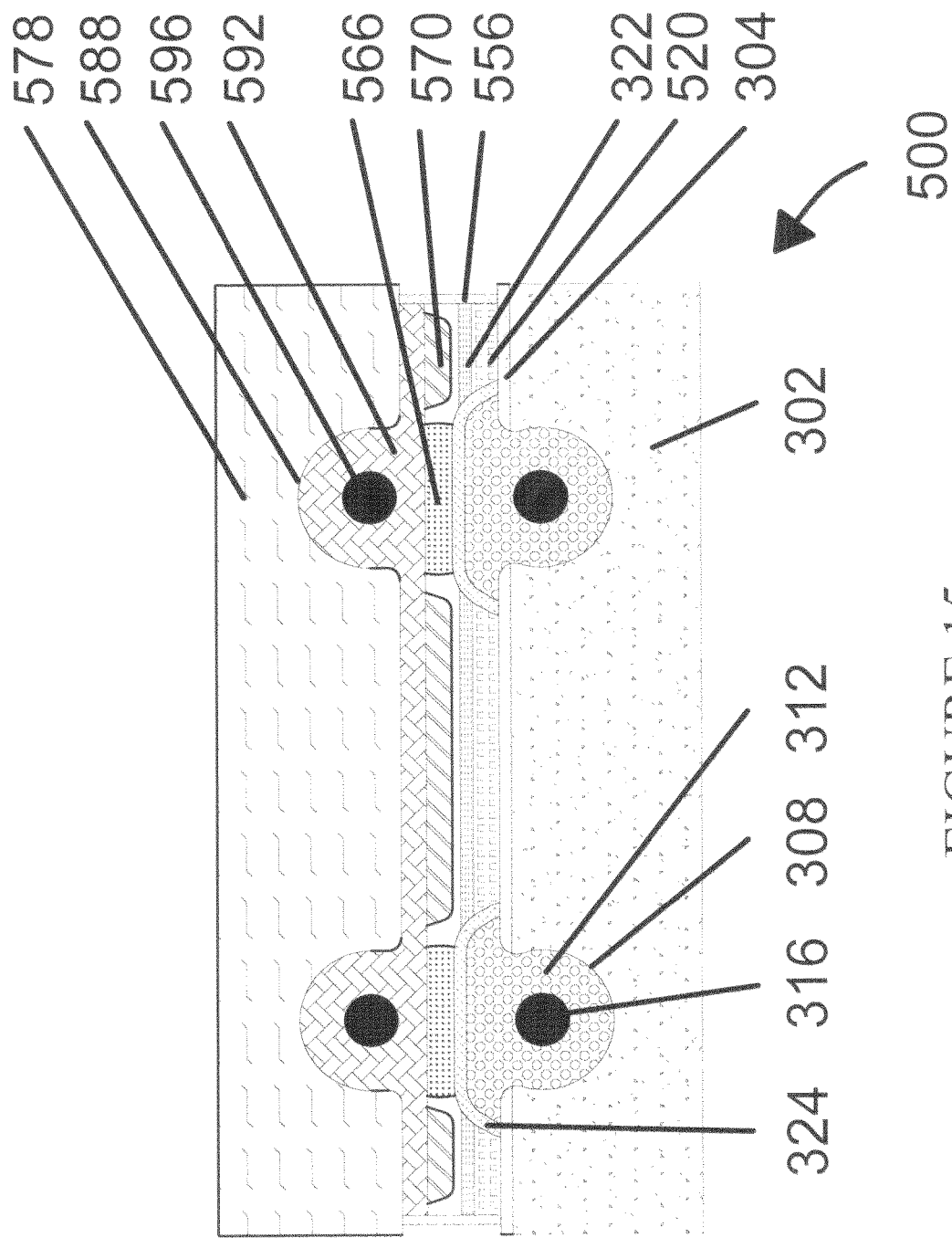
FIG. 15 provides a schematic cross-sectional view of a photovoltaic dye cell having conductor-filled grooves as cathodic current take-off means.

In a schematic cross-sectional view of a photovoltaic dye cell 500 according to another preferred embodiment of the invention, shown in FIG. 15, the anodic section may be structured substantially as in FIG. 13A. A counter-electrode plate or cover includes a window glass 578, which is bonded at the edges to an anode glass 302 by a peripheral seal 556, e.g., using a liquid sealant. A nanocrystalline titania layer 320 of the anode may be coated with a coarse particle layer 322 based on titania, zirconia, alumina or silica, for purposes of electrical insulation and light back-scattering. Nanocrystalline titania layer 320 may then be covered with a sensitizer dye, or this step can be carried out subsequently, prior to electrolyte filling. On the cathodic side of cell 500, each of at least one groove such as groove 588 contains a wire 596 bonded in place by a conducting adhesive layer 592, which layer extends also as a continuous layer across the glass face in order to provide electrical conductivity between adjacent grooves. The anode and counter plates may be bonded together at various points (e.g., periodically spaced intervals) along anode and counter grooves (as in FIG. 13A) by a layer of adhesive 566. Between adjacent grooves, a layer 570 of carbon or graphite, optionally coated with a catalyst such as trace platinum, is provided, and the thickness of this layer is selected so as to allow close proximity of the carbon or catalyst surface to nanocrystalline titania layer 320. Cell 500 may be filled with electrolyte through fill holes (not shown) in the counter-electrode, which is then sealed, at which point cell 500 may be ready for testing and modulizing. The presence of closely placed anchoring points (e.g., about one cm apart on a large area cell sized 15 cm×15 cm), and the use of a strong adhesive such as silicone, maintain spacing and prevent short-circuiting within cell 500.

Figure 16:
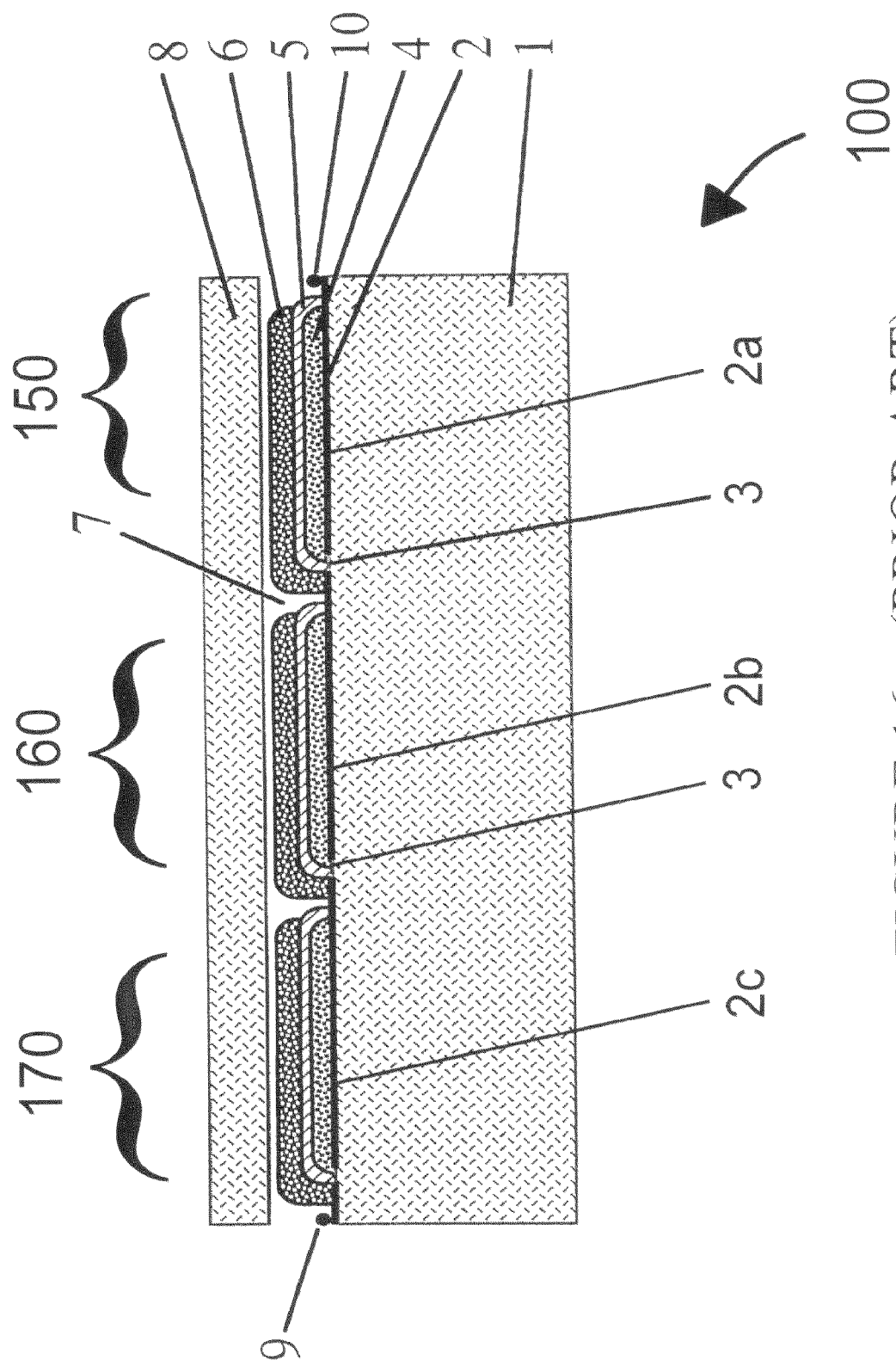
FIG. 16 is a schematic cross-sectional view of a monolithic dye cell assembly of the prior art.

Another aspect of the present invention provides a means for prevention or reduction of ion migration through inter-cell seals of monolithic dye cell assemblies. A cross-sectional view of a prior art monolithic dye cell assembly of the above-referenced patent to Kay is shown in FIG. 16. A glass substrate 1 is provided having a substantially transparent, electrically conductive layer 2, usually based on tin oxide. The conductive layer is cut in a set of parallel lines at equidistant spacing across the face of the conducting substrate, usually by laser grooving means, so as to provide a series of narrow, parallel, conductive strips 2a, 2b, 2c, several millimeters wide, along the length of substrate 1, but electrically insulated from each other on the substrate by electrically insulated regions 3.

A layer of porous nanocrystalline titania 4 is screen-printed on each of the strips to act as photoanode, followed by a porous insulating layer 5 based on zirconia, silica, alumina or titania. A counter-electrode 6 of the cell, which is printed over the groove so as to make electrical contact with the adjacent conducting strip, consists of a porous layer of carbon containing a suitable binder such as titania (and optionally containing a precious metal catalyst), which is screen-printed on top of an insulator layer 5 in each individual cell 150, 160, 170. This arrangement gives a series connection of adjacent cells on a single substrate (monolithic assembly) without the need for additional cell interconnection means.

Printing, drying and sintering schedules for layers 4, 5, 6 can be preferably designed to involve a single sintering step for the layers. Typical thicknesses for the sintered layers are 15 microns for the titania, 5 microns for the insulator, and 50 microns for the counter-electrode (carbon). Dye is introduced into the titania layer of all the cells by printing application of a solution of dye in an organic solvent onto the porous carbon layer of each cell, following which this solution flows down to the titania layer, where dye is absorbed. Following evaporation off of the dye solvent, electrolyte is introduced into the cells by printing application onto the porous carbon layer in each cell. A monolithic series stack, assembly, or multiple-cell module 100 is made up of a plurality of single cells such as individual cells 150, 160, 170, connected in series. Each of individual cells 150, 160, 170 includes a titania layer 4, insulating layer 5 disposed thereon, and a counter-electrode 6 disposed generally above insulating layer 5. A sealant layer such as polymer sealant layer or coating 7 is disposed so as to electrically seal adjacent cells (e.g., individual cells 150 and 160) one from another, and to cover the large area face of series stack 100. Additional sealing protection is achieved by bonding on top of the polymer a sheet 8 of glass, plastic or laminate. Voltage takeoff from the series stack 100 is via bus bars 9, 10 situated at the extremities of stack 100 (bus bar 9 for the positive pole and bus bar 10 for the negative pole). Bus bars 9, 10 can be based on silver or solder, by way of example, since these structural elements are external to the cell electrolyte and are not exposed to the corrosive conditions.

The above-described monolithic assembly suffers from inherent lifetime limitations. A maximum width for the titania strips of about one centimeter is typical, since this gives an acceptable ohmic loss from the cell under practical operating conditions and as dictated by the limited electrical conductivity of the tin oxide glass and the carbon counter-electrode. In order to achieve an acceptable minimal shading (of 10%, by way of example) from such strip assemblies, the polymer sealant layer between adjacent cells cannot be more than one millimeter thick. Known polymer sealants may be adequate for sealing between the cells and bonding to the tin oxide glass, however, such sealants cannot, at such a narrow spacing, sufficiently resist iodine migration between adjacent cells for more than several months. This is unacceptable in view of the lifetime requirements for solar cells.

The problem is compounded by the fact that the strong potential field (about 700 mV/cell) that exists between adjacent cells can drive the iodine migration. The iodine, in the form of the iodide ion $I^{31}$ or the tri-iodide ion $I_3^-$, is a critical component of the cell electrolyte since it comprises the redox couple on which the operation of the cell depends. The iodine inventory of a cell (the total iodine present) and the iodine concentration in the electrolyte are well-defined parameters operating between well-defined limits for optimum cell performance. Any loss of iodine from the inventory of a particular cell (by migration to the adjacent cell) will cause a fall-off in performance of that cell, and this poorly performing cell will limit the performance of the entire stack.

In particular, we have found that the iodine migration tends to occur along the surface of the tin oxide layer at the very base of the sealant. Iodine migration may also occur through the bulk sealant itself. Improved sealing techniques and materials combinations, or successive application of layers of different adhesives, may increase material and fabrication costs of the cell, without providing the requisite long-term protection against iodine migration.

Figure 17:
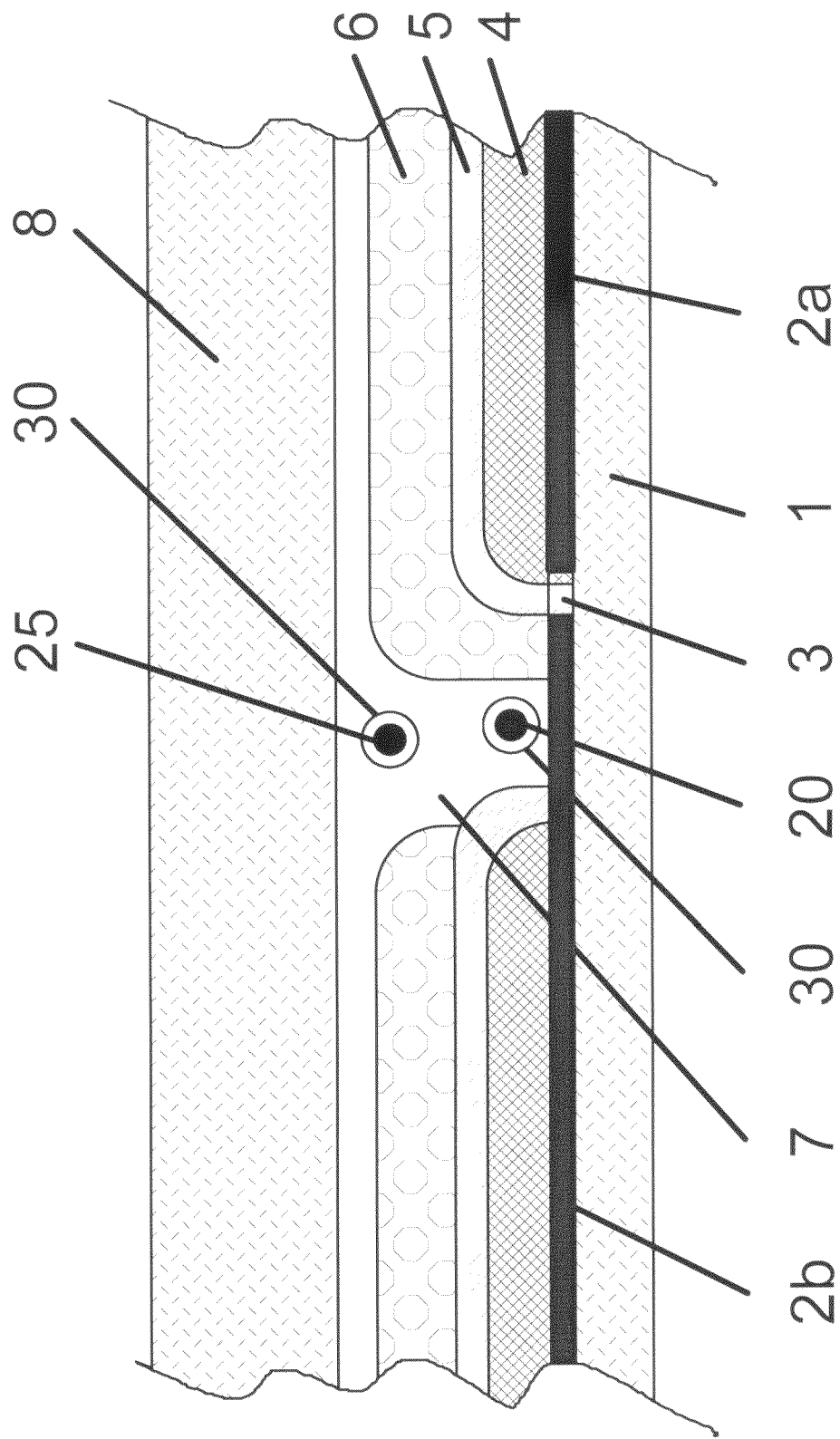
FIG. 17 is a schematic, expanded side view of a junction between two adjacent cells of a monolithic multiple dye cell assembly according to the present invention, in which junction are disposed a pair of electrodes.

The present invention may utilize an imposed voltage field to prevent or reduce iodine migration between adjacent cells. FIG. 17 shows an expanded side view (not to scale) of the junction between two adjacent cells shown in FIG. 16. Within polymer sealant layer 7 between adjacent cells are embedded two electrodes, i.e., conductive elements 20 and 25, typically in the form of wires or strips. Each of these conductive elements may be coated with a porous, insulating coating 30 to prevent short-circuiting (between wires and/or between wires and transparent, electrically conductive layer 2).

Wire 20 (preferably within coating 30) is positioned close to, or juxtaposed against, transparent, electrically conductive layer 2 on glass substrate 1. Wire 25 is disposed at a larger distance than wire 20, with respect to conductive layer 2. In FIG. 17, wire 25 is situated substantially above wire 20, and within the intercell junction defined as the region between adjacent photovoltaic units (e.g., between counter-electrode 6 associated with conductive strip 2a, and insulating layer 5 and counter-electrode 6 associated with conductive strip 2b). A voltage is applied across the electrodes such as wires 20 and 25 by means of a direct current source. The direct current source may be the photovoltaic assembly itself, as shown hereinbelow in FIG. 18. The direct current source may include an external direct current source (not shown).

In the case of an iodine-based, or other negatively charged, redox species, the voltage is applied such that wire 20 has a negative polarity. Similar wire couples under a similarly applied voltage field are embedded in the other intercell junctions, as shown in FIG. 18 hereinbelow.

The electrodes, such as conductive elements 20 and 25 may be made of an iodine-resistant material such as tungsten, titanium, stainless steel or titanium-clad copper. The specific electrical resistivity of the conductive elements is preferably below, or well below, $10^{-4}$ ohm·cm. The insulating coating is porous, and may include, by way of example, zirconia, silica, alumina or titania, applied by a coating procedure based on a suitable process, for example by dip-coating or electrophoresis followed by drying and baking. The insulating coating may also be any porous material resistant and preferably substantially inert to chemical attack of the electrolyte. Such insulating coatings may include polymeric and/or fibrous materials. A narrow gauge of wire and coating (for example 50-150 microns for the wire and 10-30 microns for the coating) may enable secure embedding in the polymer sealing between cells without necessarily increasing the seal width and shading.

Each wire or electrode pair is supplied with a direct current voltage or potential, as described above. The voltages may be supplied by the illuminated monolithic dye cell module itself, but it is also possible to provide the voltage using a battery or by other means known to those of ordinary skill in the art. In a typical monolithic dye cell module of size 30 cm×30 cm, and assuming each cell element is 1 cm wide with an operating voltage of 600 mV/cell, there is about 18V available to be applied across the wires of each intercell junction. Leads or connections are preferably provided so as to connect the module bus bars (shown in FIG. 16) to each of the embedded electrode pairs 20, 25.

Figure 18:
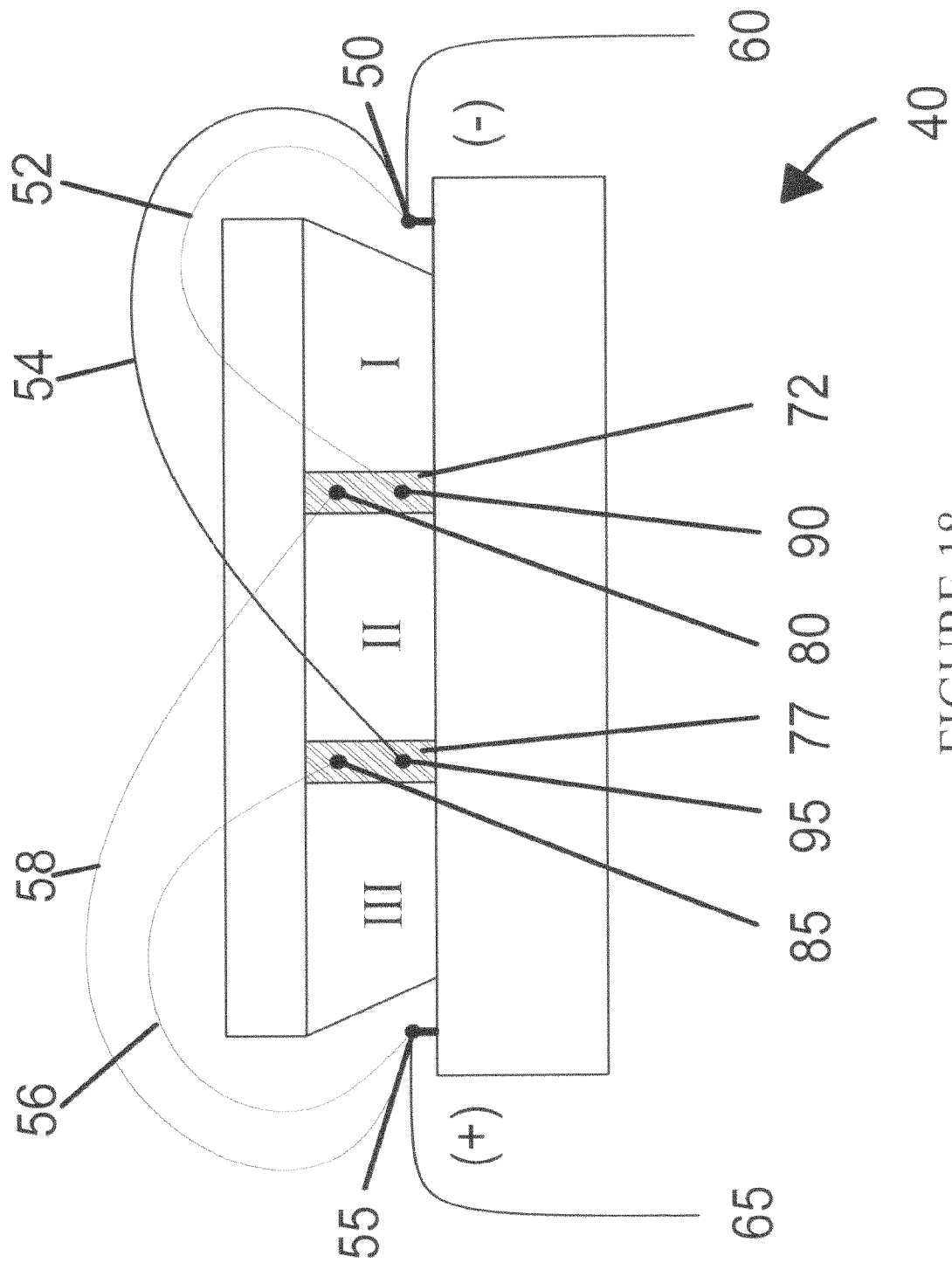
FIG. 18 provides a schematic, partially cut-open representation of one preferred embodiment of the inventive multiple-cell module, in which the intercell junctions are adapted to receive an imposed voltage to prevent or reduce intercell ion migration.

FIG. 18 shows, in schematic form, a preferred embodiment of a multiple-cell module such as a 3-cell module or stack 40 having cells I, II, and III, adapted so as to prevent or appreciably reduce intercell ion migration. The details of the cell structure of may be essentially as shown in FIGS. 16 and 17, and as described in the description associated therewith. Bus bars 50 and 55 provide the main output of power from the module under illumination, via leads such as regular heavy duty leads 60 and 65. However, from (negative pole) bus bar 50 extend two additional, typically low power leads 52 and 54, which are electrically connected, respectively, to embedded electrode or wire 90 in a junction 72 (whose volume is at least partially filled by sealant coating 7, as described with respect to FIG. 17) between cell I and cell II, and to embedded electrode or wire 95 in a junction 77 (whose volume, like that of junction 72, is at least partially filled by sealant coating 7 (referenced hereinabove) between cell II and cell III, these wires being positioned closest to the transparent, conductive (e.g., tin oxide coating) layer in the cell. Similarly, from (positive pole) bus bar 55 extend two additional, typically low power leads, which are electrically connected, respectively, to embedded electrode or wire 80 in junction 77 between cells II and III, and to embedded electrode or wire 85 in junction 72 between cells I and II. Wires 80, 85 are preferably positioned relatively far (with respect to embedded wires 90 and 95) from the tin oxide layer in the cells, so as to ensure the requisite polarity for inhibiting the ion migration. The connection scheme provides a high voltage field and high negative potential at the intercell junctions close to the tin oxide surface and prevents or retards iodine migration across the interfaces.

The ion-migration reduction system of the present invention includes a current source such as a monolithic photovoltaic dye assembly, or an external current source (such as a battery or DC current source), and at least one electrode pair such as electrodes 80, 90, disposed within a sealant layer such as sealant coating 7, preferably within an intercell junction such as junction 72, the electrode pair being electrically connected to the current source.

With reference now to both FIGS. 17 and 18, the magnitude of the negative potential is preferably adapted so as to inhibit or significantly reduce migration of iodide and tri-iodide ions (which are both negatively charged) across a sealant layer filled junction such as junction 72 and into the adjacent cell. More generally, the magnitude of the potential is preferably adapted so as to inhibit or significantly reduce migration of the redox ions (which may be positively charged or negatively charged, depending on the system) across sealant layer 7 (filling a junction such as junction 72) and into the adjacent cell.

Preferably, the magnitude of the applied potential is at least 60% of the open-circuit potential of a single cell such as cell I, or at least 80% of the operating potential of such a cell. More preferably, the magnitude of the applied potential is at least 80% of the open-circuit potential of a single cell such as cell I, or more typically, at least about 100% of the operating potential of such a cell.

The requisite magnitude of the applied potential may be related to the operating potential of the entire stack. Preferably, the magnitude of the applied potential is at least 30% of the operating potential of the entire stack or module such as module 40, yet more preferably, at least 50% of the operating potential of the entire module, and most preferably, at least 70% of the operating potential of the entire module.

Given that bus bars 50 and 55 are often advantageously disposed at the extremities of module 40, practically the magnitude of the applied potential may be substantially equal to the operating potential of the entire module.

In terms of absolute potential, the applied voltage is preferably at least about 1.5 Volts, and more preferably, at least about 3 Volts. Higher voltages (e.g., above 5 Volts, above 10 Volts, above 20 Volts) tend to improve the reduction of ion migration.

It will be apparent to one skilled in the art that redox species other than iodine-based species may be used in conjunction with the present invention. For example, in the Journal of the American Chemical Society, Volume 124, page 11215 (2002), Elliot described the use of cobalt II/III complexes as an alternative to the iodide/tri-iodide redox couple in dye cells, since they are less corrosive and less volatile than the iodine-based systems. In the cobalt system, both redox species have a positive charge.

If such a cobalt based redox system were to be used in monolithic cell assemblies according to the present invention, the imposed potential would be configured such that the positive lead having the higher potential would be embedded at the base of the intercell seal close to the tin oxide layer, thereby limiting or preventing migration of the positively charged redox species between adjacent cells.

Another aspect of the present invention relates to an improved monolithic structure for large-area, broad, single dye cells. In a monolithic dye cell design, generally there is a single sheet of conducting glass required per cell, with accompanying cost savings. Onto that single sheet of conducting glass are printed sequentially a porous titania photoanode layer, a porous insulating spacer layer and then a porous carbon cathode (counter-electrode) layer. After dye staining of the titania and electrolyte addition, the cell may be sealed using an outer sheet of glass, polymer, metal foil or laminate. Since the spacer layer between the titania and cathode layers can be very thin, of the order of several micrometers only, this ensures a low electrolyte resistance and hence, a lower ohmic resistance of the cell. The result is a much lower cell resistance relative to cells in which the cathode element is a separate structure, wherein such a close spacing between photoanode and cathode may be extremely difficult to achieve. The fact that the cell active layers are built up on the same support also avoids interelectrode spacing variations resulting from thermal cycling of the cell, which can be a performance limiting problem in cells having a separate cathode. Large area monolithic single cells according to the present invention have, additionally, a higher fraction of cell footprint that is optically active, relative to the monolithic multi-cell design of the above-referenced patent to Kay. Thus, the inactive opaque seal areas and conductor areas are proportionally reduced for large area single cells, and the active titania area can approach more completely the carbon cathode area in the design of the present invention. Both of these factors positively impact the cell efficiency.

Figure 19:
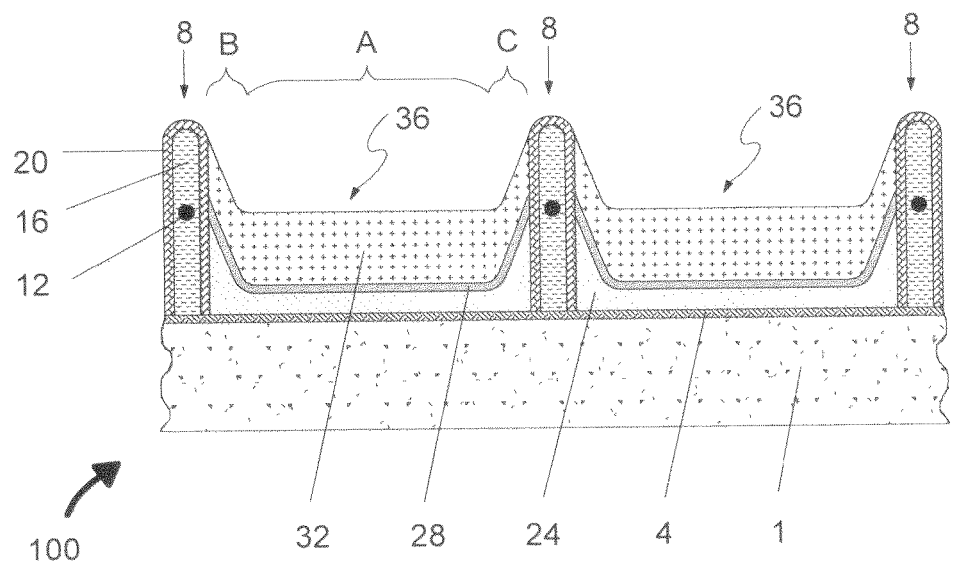
FIG. 19 is an exemplary, schematic, cross-sectional side view of a large-area monolithic single cell that might be fabricated based on the prior art.

FIG. 19 provides a schematic, exemplary view of a large area monolithic single cell 100 that might be fabricated based on the prior art (elements not drawn to scale). Onto a glass sheet 1 having a conductive surface layer 4 based on tin oxide, a set of evenly spaced parallel conductor structures 8 is laid down prior to the printing of the titania layers. Conductor structures 8 just above conductive surface layer 4. In the embodiment shown, each conductor structure 8 includes a substantially chemically inert metal wire 12 bonded in place on conductive surface layer 4 by a substantially chemically inert, electrically conductive binder 16, and covered with an electrically insulating layer 20 that prevents electrical shorting-out of the conductor structures to subsequently applied layers.

By way of example, adjacent conductor structures 15 cm long and spaced 1 cm apart preferably have an ohmic drop of less than 0.5 ohms to achieve adequate dye cell current collection on a tin oxide glass having a surface resistance of 10 ohm/sq.

Figure 20:
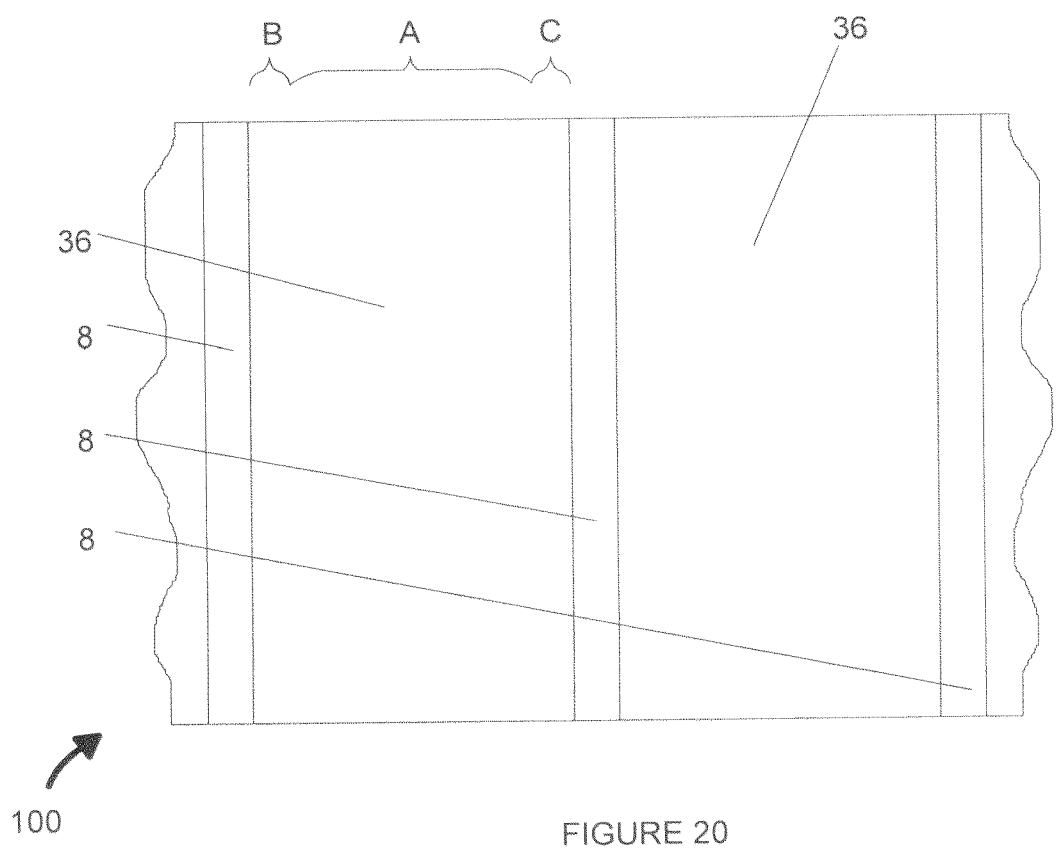
FIG. 20 is a schematic top view of the cell of FIG. 19, showing printed areas in long strip form, wherein adjacent printed areas are separated by conductor structures.

In a monolithic cell build, the critical cell components, which preferably include a titania photoanode layer 24, an insulating spacer layer 28 and a carbon counter-electrode layer 32, are typically built up, layer by layer, on glass substrate 1, by successive printing operations, including drying and sintering of these layers, to form substantially continuous printed areas 36. FIG. 20 is a schematic top view of cell 100 showing continuous printed areas 36 in long strip form, wherein adjacent printed areas 36 are separated by conductor structures 8.

When such printings are attempted by screen-printing from the appropriate pastes, there is inevitably a lack of uniformity in the layer thicknesses following sintering, due to the presence of the upraised features of conductor structures 8 on the glass surface. Conductor structures 8 may protrude well above the surface of conductive surface layer 4. The titania and spacer layers are less prominent, for example only 15 and 10 micrometers thick, respectively, following sintering. Even a conductor structure having a height of only several tens of micrometers can spoil the printing uniformity of the critical titania layer, however. Due to projecting conductor structures 8, the mesh or screen via which the paste is applied cannot be made to lie flat on the glass surface. A flat disposition on the glass surface is the optimum orientation for correct dispensing of the paste by, for example, squeegee pressure.

Consequently, after drying and sintering have been performed, a significant portion of the photoactive area of the cell is not fully parallel to the support glass. As shown in FIG. 19, in the central area of each strip, for example, area A between adjacent conductors 8, the layers are optimally thin, uniform and parallel to the substrate surface, but at areas B and C proximately-disposed to adjacent conductor structures 8, the layers (e.g., titania photoanode layer 24) are much thicker and not fully parallel to the support glass. In a typical printing, titania layer 24 of area A is 15±2 micrometers thick following sintering. However, we have found that titania layer 24 of areas B and C may have a maximum thickness of 30-200 micrometers or more. The main outcome of this lack of homogeneity in the thickness of the (typically screenprinted) layers is reduced cell performance. The areas close to conductor structures 8 are effectively inactive, since they may have a considerably longer ionic path characterized by higher electrolyte resistance, a longer recombination-prone ion diffusion route and reduced light transmittance, due to the excessive thickness of titania layer 24. In typical printings, where the printed strip width between the conductor structures is about 8 mm, the inactive width can be 1 mm (or more) on each side of the conductor structures, such that the cell performance loss compared with the case of uniform printing of strips across the width can approach 20%.

A similar result may be obtained using other methods of application of conductor structures in large area cells, for example, bonding of wires into grooves on the substrate or electroplating of conducting metal or metal alloy strips onto the substrate, since here as well, the conductor structures may be situated well above the surface of the substrate.

Figure 21:
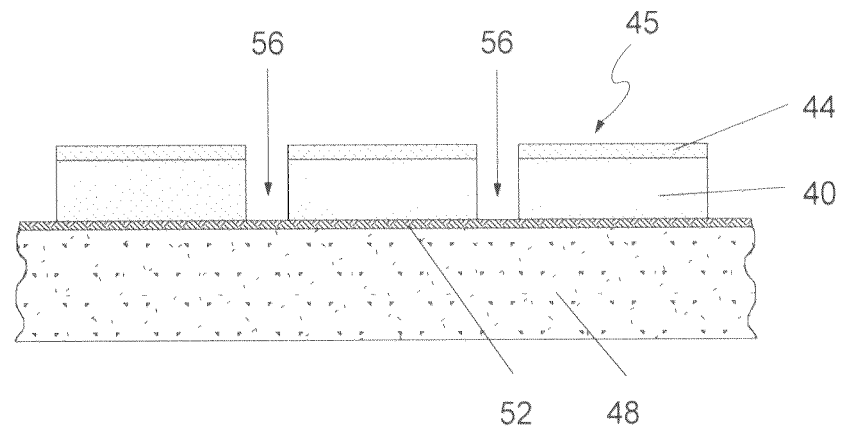
FIG. 21 provides an exemplary, schematic cross-sectional side view of a portion of the inventive structure, in which separate strips of a titania layer and insulating spacer layer are disposed on a glass substrate, so as to leave a gap between the strips.

In the present invention, a strategy for uniform printing of the active layers may be adopted, by which strategy the active layer printings are made prior to the application of the conductor structures. FIG. 21 provides an exemplary, schematic cross-sectional side view of a portion of an inventive structure, in which separate strips 45 of a titania layer 40 and insulating spacer layer 44 are disposed (e.g., by screenprinting) on a glass substrate 48 having a conducting tin oxide layer 52, leaving at least one gap 56 between strips 45 that may subsequently be at least partially filled by conductor structures. In this case, there is no problem in obtaining active layers having a substantially uniform or homogeneous thickness, even in the areas adjacent to such conductor structures.

Gaps 56 are preferably substantially parallel to one another.

Figure 22:
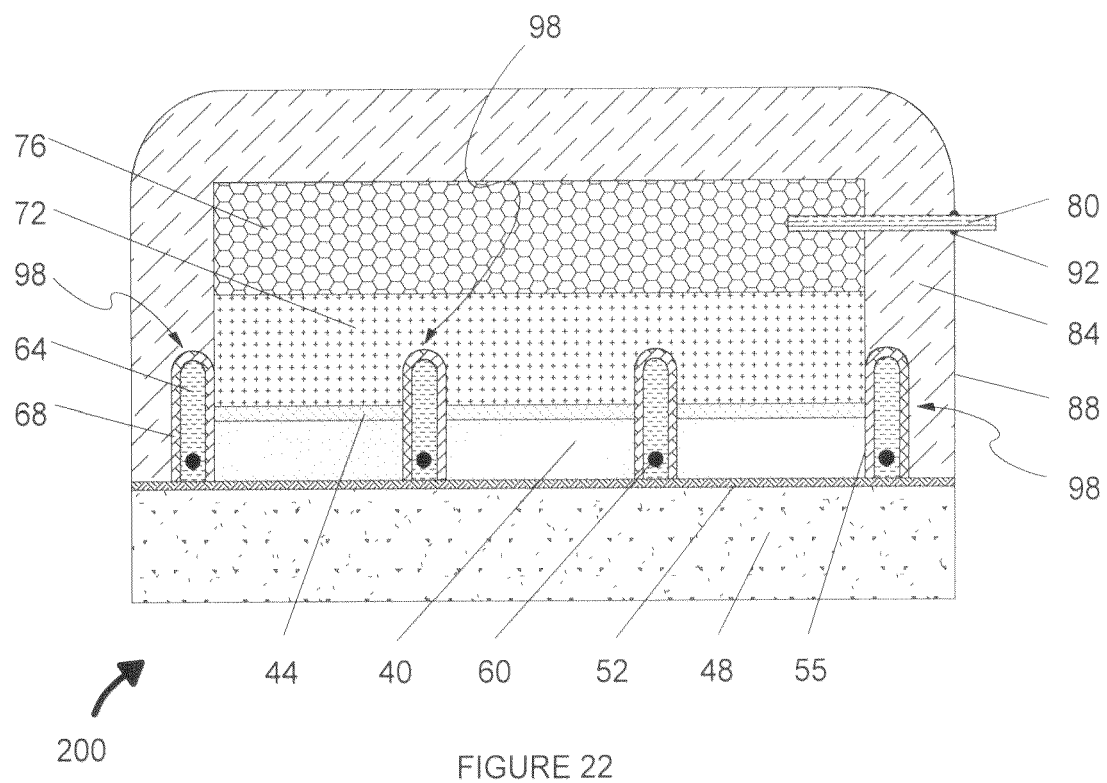
FIG. 22 is an exemplary schematic cross-sectional side view of one embodiment of a photovoltaic dye cell of the present invention.

An exemplary schematic cross-sectional side view of one embodiment of a monolithic cell 200 of the present invention is provided in FIG. 22. Highly electrically conductive structural elements or cores such as wires 60 are positioned in the gaps (such as gaps 56 shown in FIG. 21) between the layers and/or printings (e.g., titania layer 40 and optional insulating spacer layer 44), or adjacent to a termination or end 55 of the printings. Preferably, sufficient tension is applied to wires 60 to ensure close and substantially parallel placement thereof to the tin oxide surface. This placement procedure may be performed using a jig or other means known in the art.

Wires 60 are then permanently bonded in place by an electrically conducting adhesive layer (e.g., containing a ceramic adhesive), which may be added by a dosing dispenser, to produce uncured conductor structures. These uncured conductor structures may undergo treatment (e.g., a heat treatment) to produce a cured or at least partially sintered conductor structure such as conductor structures 98. Conductor structures 98 may include highly electrically conductive structural elements such as wires 60, at least partially surrounded by, and preferably completely surrounded by, an electrically conducting binder layer such as electrically conductive ceramic or binder layer 64 formed by the treating of the electrically conducting adhesive layer. Binder layer 64 may contain a ceramic material and one or more electrically conductive materials such as tungsten, titanium nitride, zirconium nitride, and titanium boride.

Conductor structures 98 may also have an electrically insulating layer such as an insulating ceramic layer 68, which at least partially and preferably completely envelops or surrounds wire 60 and electrically conducting binder layer 64.

In the photovoltaic cell and method of the present invention, depending on which conductor application method is employed, the conductor structures may be between 0.1 mm and 2 mm wide, may be spaced about 5-20 mm apart on the conducting glass, and may be at least 50 micrometers to 200 micrometers high (or more) above the surface of the conducting glass. Preferably, the conductor structures may have a width of less than 1 mm, and more preferably, less than 0.7 mm.

A cathode layer such as porous carbon-based cathode 72, optionally catalyzed, may be screenprinted or laid directly on top of insulating spacer layer 44. Alternatively, porous carbon-based cathode 72 may be screenprinted or laid directly upon titania layer 40.

Current takeoff from the cathode may be achieved by various means, for example by bonding to carbon-based cathode 72, a sheet of graphite foil 76 carrying an embedded metal mesh or strip tab 80, and the layers beneath may be kept well compressed following sealing by additional inclusion of an optional sponge element (not shown).

Titania layer 40 may be coated by a dye using a dye solution printed onto porous carbon-based cathode 72, which enables the dye to percolate through to titania layer 40, where it chemisorbs strongly. Following evaporation off of the dye solvent, the cell electrolyte is added to the cell by printing onto porous cathode 72. In the exemplary embodiment provided in FIG. 22, cell 200 is substantially closed off and sealed at the edges using a sealant layer such as polymer sealant layer 84 backed by a housing such as a metal foil 88 (for a lightweight design), in which case, a metal tab 80 may be brought through foil 88 via an insulating grommet 92 that may be attached to foil 88. More standard closures, such as a glass sheet sealed at the edges with polymer or adhesive, may also be feasible. Current takeoff from the wire-based structures of the photoanode or the embedded tab of the cathode, which pass out of the inside of the cell via the sealed edges of the cell, may be effected by welded metal strips that can make connection to the adjacent cell in a modular assembly of cells (not shown).

Thus, in the cell according to this aspect of the present invention, the active layers may have a substantially uniform or homogeneous thickness, even including the areas adjacent to the conductor structures. Along the entire width of the strips disposed between the conductor structures, and adjacent (within 1 mm) to conductor structures 98 in particular, the thickness of a strip of strips 45 is within 50%, preferably within 30%, and more preferably within about 20%, of the nominal thickness of the strip. Similarly, with regard to each of the individual components of strips 45, such as titania layer 40 and insulating spacer layer 44, the thickness of a particular component is within 50%, preferably within 30%, and more preferably, within about 20%, of the nominal thickness of the strip along the entire width of the strips disposed between the conductor structures, and in particular, in the areas adjacent (within 1 mm) to conductor structures 98.

By way of example, in a dye cell of the present invention, and given a titania layer 40 screenprinted onto a substrate and having a nominal thickness of 15 micrometers, strip 40 would have a thickness of no more than 22.5 micrometers along the entire width of the strip, including the areas adjacent to the conductor structures. Preferably, strip 40 would have a thickness of no more than 19.5 micrometers along the entire width of the strip, and more preferably, no more than about 18 micrometers.

Typical printing accuracy of a layer (such as a titania layer) onto flat glass may be about +/−2 micrometers.

As used herein in the specification and in the claims section that follows, the term "nominal thickness", with respect to a strip such as strip 45, a component of the strip, or a porous layer such as a titania layer, refers to an average thickness, within a substantially flat area A, of the strip, component, or layer, respectively, that is situated at least 2.5 mm from any of the conductor structures.

In absolute terms, along the entire width of the strips disposed between the conductor structures, and adjacent (within 1 mm) to conductor structures 98 in particular, the thickness of a strip of strips 45 is within 15 micrometers, preferably within 10 micrometers, and more preferably within about 5 micrometers, of the nominal thickness of the strip. Similarly, with regard to each of the individual components of strips 45, such as titania layer 40 and insulating spacer layer 44, the thickness of a particular component is within 15 micrometers, preferably within 10 micrometers, and more preferably within about 5 micrometers, of the nominal thickness of the strip along the entire width of the strips disposed between the conductor structures, and in particular, in the areas adjacent (within 1 mm) to conductor structures 98.

By way of example, in a dye cell of the present invention, and given a titania layer 40 screenprinted onto a substrate and having a nominal thickness of 10 micrometers, strip 40 would have a thickness of no more than 25 micrometers along the entire width of the strip, including the areas adjacent to the conductor structures. Preferably, strip 40 would have a thickness of no more than 20 micrometers along the entire width of the strip, and more preferably, no more than about 15 micrometers.

The invention is not limited to the exemplary sequence of operations provided hereinabove, and various modifications will be apparent to those of ordinary skill in the art. For example, the active layers may be printed on the substrate in one large area printing without any separations and the gaps cleared in a subsequent ablation step. Similarly, it is possible to print the carbon layers on the spacer layers prior to the laying down of conductor structures. The sequence may also be adjusted in order to enable proper coordination of drying and sintering steps in cell preparation, or in order to better accommodate the placing of conductors in grooves on the substrate surface or plated onto it. Removable masking layers may also be laid down in order to prevent contamination of prior placed active layers or electrical shorting of subsequent layers.

As used herein, the term "monolithic" and the like, with regard to a dye cell, refers to a dye cell structure in which both the photoanode and the cathode layers of the cell are supported by a common conducting glass support. The term "monolithic" and the like, is specifically meant to exclude dye cell structures in which the photoanode is supported by a first glass support and the cathode is supported by a second glass support, such that the photoanode and the cathode are substantially disposed therebetween. Typically, monolithic dye cell structures are produced in a screenprinting process, and have a porous insulating spacer layer disposed between the photoanode and cathode layers.

Below we provide a list of various materials that may be used in photovoltaic dye cells, along with their specific electrical resistivities (in units of ohm·cm), as available in the literature.

Specific Electrical Resistivities (ohm cm)

| | |
|---|---|
| Silver | $1.5 \times 10^{-6}$ |
| Copper | $1.5 \times 10^{-6}$ |
| Nickel | $6.2 \times 10^{-6}$ |
| Platinum | $9.6 \times 10^{-6}$ |
| Aluminum | $2.4 \times 10^{-6}$ |
| Titanium | $39 \times 10^{-6}$ |
| Bismuth | $107 \times 10^{-6}$ |
| Titanium Clad Copper | $\sim 3 \times 10^{-6}$ |
| Molybdenum | $4.9 \times 10^{-6}$ |
| Chromium | $11.8 \times 10^{-6}$ |

-continued

| | |
|---|---|
| Tantalum | $12.2 \times 10^{-6}$ |
| Tungsten | $4.8 \times 10^{-6}$ |
| Carbon | $3000 \times 10^{-6}$ |
| Graphite | $1000 \times 10^{-6}$ |
| Titanium nitride | $25 \times 10^{-6}$ |
| Tin oxide | $500 \times 10^{-6}$ |
| Titanium dioxide | $\sim 10^{12}$ |
| Alumina binder | $\sim 10^{14}$ |
| Sensitizer dye | $\sim 10^{9}$ |

Conductivity is inversely related to the resistivity. It is evident from these values that metals such as silver, copper, aluminum, tungsten are intrinsically highly conducting, while other metals such as titanium, and some conducting fillers such as titanium nitride are somewhat less conducting. Carbon, graphite, and tin oxide are much poorer conductors. Materials such as titanium dioxide, alumina binder and sensitizer dyes, are properly classed as insulators, having resistivities that are at least 13 orders of magnitude higher than materials that are considered to be genuine conductors.

Not only is the specific resistivity of a material important in determining the resistance of a layer of the material, but also the layer thickness, its length and width, and the continuity of the layer components is crucial. Thus, in dye cells, the conductive tin oxide layer on the glass is an exceedingly poor conductor, not just because its specific resistivity is much higher than the specific resistivity of metals, but also because the layer has to be extremely thin (typically 0.5 micrometers) in order for the layer to remain transparent and for light to be able to enter the cell with adequate transmittance. Consequently, the conductive tin oxide layer on the glass is a poor vehicle for conveying current out of the cell along the broad plane of the tin oxide layer.

Conductor structures 98, such as metal wires bonded in place on a tin oxide glass by an electrically conductive ceramic adhesive, may be beneficial as current takeoff elements on the basis of their intrinsic conductivity. However, other criteria for the structures include low contact resistance to the tin oxide surface and minimal shading of light to the cell. By way of example, we can consider a dye cell having a square geometry of 15 cm per side, which may generate, at 7% conversion efficiency, a peak current of about 3 amperes. Parallel conductor structures disposed across the face of the device, each of length 15 cm, width 1 mm and spaced 1 cm apart, yield an acceptably low shading of 10%. For adequate current takeoff on tin oxide glass having a surface resistance of 10 ohm/sq., however, the resistance between adjacent conductor structures should preferably not exceed about 0.5 ohms.

Generally speaking, the highly electrically conductive structural elements such as wires 60, disposed within conductor structures 98, have specific electrical resistivities of less than $1200 \times 10^{-6}$ ohm cm, preferably below $500 \times 10^{-6}$ ohm cm, more preferably, below $200 \times 10^{-6}$ ohm cm, yet more preferably, less than $100 \times 10^{-6}$ ohm cm, and most preferably, below $50 \times 10^{-6}$ ohm cm.

With regard to the cured layer produced from conducting adhesive paste or layer 64, the specific electrical resistivity is less than 1.0 ohm cm, preferably, less than 0.1 ohm cm, more preferably, less than 0.05 ohm cm, and most preferably, less than 0.01. Some materials suitable for use in, or with, conducting adhesive layer 64 may have specific electrical resistivities that are several orders of magnitude lower.

With regard to the electrically insulating layer (such as ceramic layer 68) that generally envelops the electrically conductive structural element and the conducting ceramic layer, and with regard to insulating spacer layer 44 as well, the specific electrical resistivity is generally at least $10^6$ ohm cm, preferably, at least $10^8$ ohm cm, and more typically, at least $10^{10}$-$10^{14}$ ohm cm.

As used herein in the specification and in the claims section that follows, the term "precursor", with respect to titania or zirconia, refers to a titanium-containing or zirconium-containing compound that, upon heating above at least 300 C, reacts to produce titania or zirconia.

As used herein in the specification and in the claims section that follows, the term "specific surface area", and the like, refers to the specific surface area measured by a standard BET analysis using a nitrogen medium.

As used herein in the specification and in the claims section that follows, the terms "titania" and "titanium dioxide", are used interchangeably, and the terms "zirconia" and "zirconium dioxide", are used interchangeably.

As used herein in the specification and in the claims section that follows, the term "elongated conductive structural component" refers to a conductive strip or to a conductive wire.

As used herein in the specification and in the claims section that follows, the term "elongated metallic structural component" refers to a metal strip or to a metal wire.

As used herein in the specification and in the claims section that follows, the term "immediately adjacent", with respect to a surface of the cathode and a surface of the anode (e.g., a carbon or catalyzed carbon surface of the cathode and a porous titania film of the anode) refers to surfaces that are not separated by an interceding layer.

As used herein in the specification and in the claims section that follows, the term "solely physically associated", with respect to layers of the cathode and/or layers of the anode, refers to layers that are in contact, but are not sintered together and are otherwise chemically disattached.

As used herein in the specification and in the claims section that follows, the term "self-supporting", with respect to strips or layers of the cathode and/or layers of the anode, refers to strips or layers that are held in place within the cell in a disattached structure with respect to the opposing electrode.

As used herein in the specification and in the claims section that follows, the term "discrete", with respect to adjacent layers in the cell, refers to layers that may be in contact with one another, yet are physically distinct.

As used herein in the specification and in the claims section that follows, the terms "positive potential" and "negative potential", with regard to an electrode pair, are used in a relative sense, and not necessarily in an absolute sense.

Throughout this disclosure, various aspects of this invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 10 should be considered to have specifically disclosed subranges such as from 1 to 2, from 1 to 5, from 1 to 8, from 3 to 4, from 3 to 8, from 3 to 10, etc., as well as individual numbers within that range, for example, 1, 2, 3, 4, 5, 6, 7, 8, 9, and 10. This applies regardless of the breadth of the range.

Similarly, the terms "at least", "exceeds", and the like, followed by a number (including a percent or fraction), should be considered to have specifically disclosed all the possible subranges above that number, as well as individual numerical values above that number. For example, the term "at least 75" should be considered to have specifically disclosed subranges such as 80 and above, 90 and above, etc, as well as individual numbers such as 85 and 95.

Similarly, the terms "less than", "below", and the like, followed by a number (including a percent, fraction, or ratio such as a weight ratio), should be considered to have specifically disclosed all the possible subranges below that number, as well as individual numerical values below that number. For example, the term "below 75%" should be considered to have specifically disclosed subranges such as 70% and below, 60% and below, etc, as well as individual numbers such as 65% and 50%.

Whenever a numerical range is indicated herein, the range is meant to include any cited numeral (fractional or integral) within the indicated range. The phrase "ranging/ranges between" a first number and a second number and "within a range of" a first number to a second number, and the like, are used herein interchangeably and are meant to include the first and second indicated numbers and all the fractional and integral numerals therebetween.

It will be appreciated by one of ordinary skill in the art that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent those skilled in the art. Accordingly, it is intended to embrace all such alternatives, modifications and variations. All publications and patents mentioned in this specification, including each and every priority document, are herein incorporated in their entirety by reference into the specification, to the same extent as if each individual publication or patent was specifically and individually indicated to be incorporated herein by reference. In addition, citation or identification of any reference in this application shall not be construed as an admission that such reference is available as prior art to the present invention.

What is claimed is:

1. A photovoltaic cell for converting a light source into electricity at a reduced ohmic loss, the cell comprising:
   (a) a housing adapted to enclose the photovoltaic cell, said housing including an at least partially transparent cell wall, said cell wall having an interior surface and an exterior surface;
   (b) an electrolyte, disposed within said cell wall, said electrolyte containing an iodine based redox species;
   (c) an at least partially transparent conductive coating disposed on said interior surface of said cell wall, within the photovoltaic cell;
   (d) an anode disposed on said transparent conductive coating, said anode including:
      (i) a porous film adapted to make intimate contact with said redox species, and
      (ii) a dye, absorbed on a surface of said porous film, said dye and said porous film adapted to convert photons to electrons;
   (e) a cathode disposed within an interior surface of said housing, said cathode disposed substantially opposite said anode, said cathode including:
      (i) a conductive carbon layer;
      (ii) a catalytic component, associated with said conductive carbon layer and adapted to catalyze a redox reaction of said redox species, and
      (iii) a current collection component, contacting said conductive carbon layer; said conductive carbon layer adapted to transfer electrons from said catalytic component to said current collection component, said conductive carbon layer and said catalytic component disposed in electrolytic communication, via said electrolyte, with said porous film, and
   (f) a plurality of metal strips or wires, electrically associated with said anode and with said transparent conductive coating, each metal strip or wire of said plurality of metal strips or wires having sufficient thickness to form a protrusion protruding above a plane of said porous film by at least 50 micrometers wherein each of the plurality of metal strips or wires is coated with an electrically insulating layer,
   and wherein a surface of said catalytic component is in direct contact with a surface of said porous film of said anode.

2. The photovoltaic cell of claim 1, said conductive carbon layer and said catalytic component forming self-supporting strips, said self-supporting strips disposed between said protrusions, so as to enable said direct contact.

3. A photovoltaic cell for converting a light source into electricity at a reduced ohmic loss, the cell comprising:
   (a) a housing adapted to enclose the photovoltaic cell, said housing including an at least partially transparent cell wall, said cell wall having an interior surface and an exterior surface;
   (b) an electrolyte, disposed within said cell wall, said electrolyte containing a redox species;
   (c) an at least partially transparent conductive coating disposed on said interior surface of said cell wall, within the photovoltaic cell;
   (d) an anode disposed on said transparent conductive coating, said anode including:
      (i) a porous film adapted to make intimate contact with said redox species, and
      (ii) a dye, absorbed on a surface of said porous film, said dye and said porous film adapted to convert photons to electrons;
   (e) a cathode disposed within an interior surface of said housing, said cathode disposed substantially opposite said anode, said cathode including:
      (i) a conductive carbon layer;
      (ii) a catalytic component, associated with said conductive carbon layer and adapted to catalyze a redox reaction of said redox species, and
      (iii) a current collection component, contacting said conductive carbon layer;
   said conductive carbon layer adapted to transfer electrons from said catalytic component to said current collection component, said conductive carbon layer and said catalytic component disposed in electrolytic communication, via said electrolyte, with said porous film, and
   (f) a plurality of metal strips or wires, electrically associated with said anode and with said transparent conductive coating, each metal strip or wire of said plurality of metal strips or wires having sufficient thickness to form a protrusion protruding above a plane of said porous film by at least 50 micrometers wherein each of the plurality of metal strips or wires is coated in a ceramic adhesive layer and wherein each of the ceramic adhesive layers is coated with an electrically insulating layer, wherein a surface of said catalytic component is in direct contact with a surface of said porous film of said anode; and wherein said conductive carbon layer has a thickness of at least 50 micrometers.

4. The photovoltaic cell of claim 1, wherein said housing is adapted to apply pressure to said cathode so as to push said surface of said catalytic component, facing said anode, towards an opposing surface of said anode, thereby attaining said direct contact between said surface of said catalytic component and said surface of said porous film of said anode.

5. The photovoltaic cell of claim 1, wherein said cathode is compressible so as to conform, under pressure from said housing, to an opposing surface of said anode.

6. The photovoltaic cell of claim 1, wherein said current collection component includes a graphite foil.

7. The photovoltaic cell of claim 6, wherein said graphite foil is laid on, and physically discrete with respect to, said conductive carbon layer.

8. The photovoltaic cell of claim 5, wherein said current collection component is laid on, and physically discrete with respect to, said conductive carbon layer.

9. The photovoltaic cell of claim 7, further comprising at least one continuous, electrically-conductive structural component, wherein at least a first end of said structural component is embedded within said graphite foil, said structural component having a specific resistivity below 1200 microohm·cm, said structural component adapted and disposed to collect current from said cathode.

10. The photovoltaic cell of claim 9, said structural component including a metal foil or mesh.

11. The photovoltaic cell of claim 9, wherein said structural component extends, at a second end of said structural component, outside of the cell.

12. The photovoltaic cell of claim 3, wherein a footprint of a single cell of the photovoltaic cell is defined by a length and a width of said single cell, and wherein both said length and said width exceed 5 centimeters.

13. The photovoltaic cell of claim 3, wherein said conductive carbon layer is compressible so as to conform, under pressure from said housing, to an opposing surface of said anode.

14. The photovoltaic cell of claim 3, wherein said conductive carbon layer is supported by a porous support matrix.

15. The photovoltaic cell of claim 14, wherein said porous support matrix includes glass fibers.

16. The photovoltaic cell of claim 14, wherein said porous support matrix includes a foam.

17. The photovoltaic cell of claim 14, wherein said porous support matrix includes a woven or non-woven mat.

18. The photovoltaic cell of claim 14, wherein said porous support matrix includes carbon fibers.

19. The photovoltaic cell of claim 3, further comprising a takeoff terminal outside said housing.

20. The photovoltaic cell of claim 3, wherein said plurality of metal strips or wires include wires.

* * * * *